United States Patent
Lee et al.

(10) Patent No.: US 10,475,902 B2
(45) Date of Patent: Nov. 12, 2019

(54) SPACERS FOR NANOWIRE-BASED INTEGRATED CIRCUIT DEVICE AND METHOD OF FABRICATING SAME

(71) Applicant: Taiwan Semiconductor Manufacturing Co., Ltd., Hsin-Chu (TW)

(72) Inventors: Tung Ying Lee, Hsinchu (TW); Shao-Ming Yu, Hsinchu County (TW)

(73) Assignee: TAIWAN SEMICONDUCTOR MANUFACTURING CO. LTD., Hsinchu (TW)

( * ) Notice: Subject to any disclaimer, the term of this patent is extended or adjusted under 35 U.S.C. 154(b) by 0 days.

(21) Appl. No.: 15/679,681

(22) Filed: Aug. 17, 2017

(65) Prior Publication Data
US 2018/0342596 A1 Nov. 29, 2018

Related U.S. Application Data

(60) Provisional application No. 62/511,775, filed on May 26, 2017.

(51) Int. Cl.
*H01L 21/8234* (2006.01)
*H01L 29/66* (2006.01)
(Continued)

(52) U.S. Cl.
CPC .. *H01L 29/6656* (2013.01); *H01L 21/823431* (2013.01); *H01L 21/823807* (2013.01);
(Continued)

(58) Field of Classification Search
CPC .................... H01L 21/8232; H01L 29/66409
See application file for complete search history.

(56) References Cited

U.S. PATENT DOCUMENTS 9,601,379 B1\* 3/2017 Pawlak ............ H01L 29/42392
9,633,907 B2 4/2017 Fu et al.
(Continued)

FOREIGN PATENT DOCUMENTS

| KR | 20160112891 A | 9/2016 |
| TW | 201438236 A | 10/2014 |
| TW | 201618309 A | 5/2016 |

*Primary Examiner* — Cheung Lee
(74) *Attorney, Agent, or Firm* — Haynes and Boone, LLP

(57) ABSTRACT

Nanowire-based integrated circuit devices and methods for fabricating such are disclosed herein. An exemplary method includes forming a heterostructure over a substrate. A gate structure is formed traversing the heterostructure, such that the gate structure separates a source region and a drain region of the heterostructure and defines a channel region between the source region and the drain region. A source/drain nanowire release process is performed on the heterostructure to release a nanowire in the source region and the drain region. Nanowire spacers are then formed in the source region and the drain region. The nanowire is disposed between the nanowire spacers. During a gate replacement process, a channel nanowire release process is performed on the heterostructure to release the nanowire in the channel region. Epitaxial source/drain features are formed over the nanowire and the nanowire spacers in the source region and the drain region before the gate replacement process.

20 Claims, 48 Drawing Sheets

(51) Int. Cl.
    *H01L 29/786*     (2006.01)
    *H01L 29/165*     (2006.01)
    *H01L 27/092*     (2006.01)
    *H01L 21/8238*    (2006.01)
    *H01L 29/423*     (2006.01)
    *H01L 29/40*      (2006.01)
    *H01L 29/775*     (2006.01)
    *H01L 29/06*      (2006.01)
    *B82Y 10/00*      (2011.01)

(52) U.S. Cl.
    CPC .... *H01L 21/823821* (2013.01); *H01L 27/092* (2013.01); *H01L 27/0924* (2013.01); *H01L 29/0649* (2013.01); *H01L 29/0653* (2013.01); *H01L 29/165* (2013.01); *H01L 29/401* (2013.01); *H01L 29/42392* (2013.01); *H01L 29/66439* (2013.01); *H01L 29/66545* (2013.01); *H01L 29/66553* (2013.01); *H01L 29/775* (2013.01); *H01L 29/78618* (2013.01); *H01L 29/78651* (2013.01); *H01L 29/78696* (2013.01); *B82Y 10/00* (2013.01)

(56) References Cited

U.S. PATENT DOCUMENTS

| | | | |
|---|---|---|---|
| 9,653,289 B1* | 5/2017 | Balakrishnan | H01L 27/088 |
| 2014/0001441 A1 | 1/2014 | Kim et al. | |
| 2014/0203327 A1 | 7/2014 | Pillarisetty et al. | |
| 2014/0264280 A1* | 9/2014 | Kim | H01L 29/785 257/29 |
| 2015/0348848 A1 | 12/2015 | Fu et al. | |
| 2016/0155800 A1 | 6/2016 | Zang et al. | |
| 2018/0006139 A1* | 1/2018 | Seo | H01L 29/66795 |

\* cited by examiner

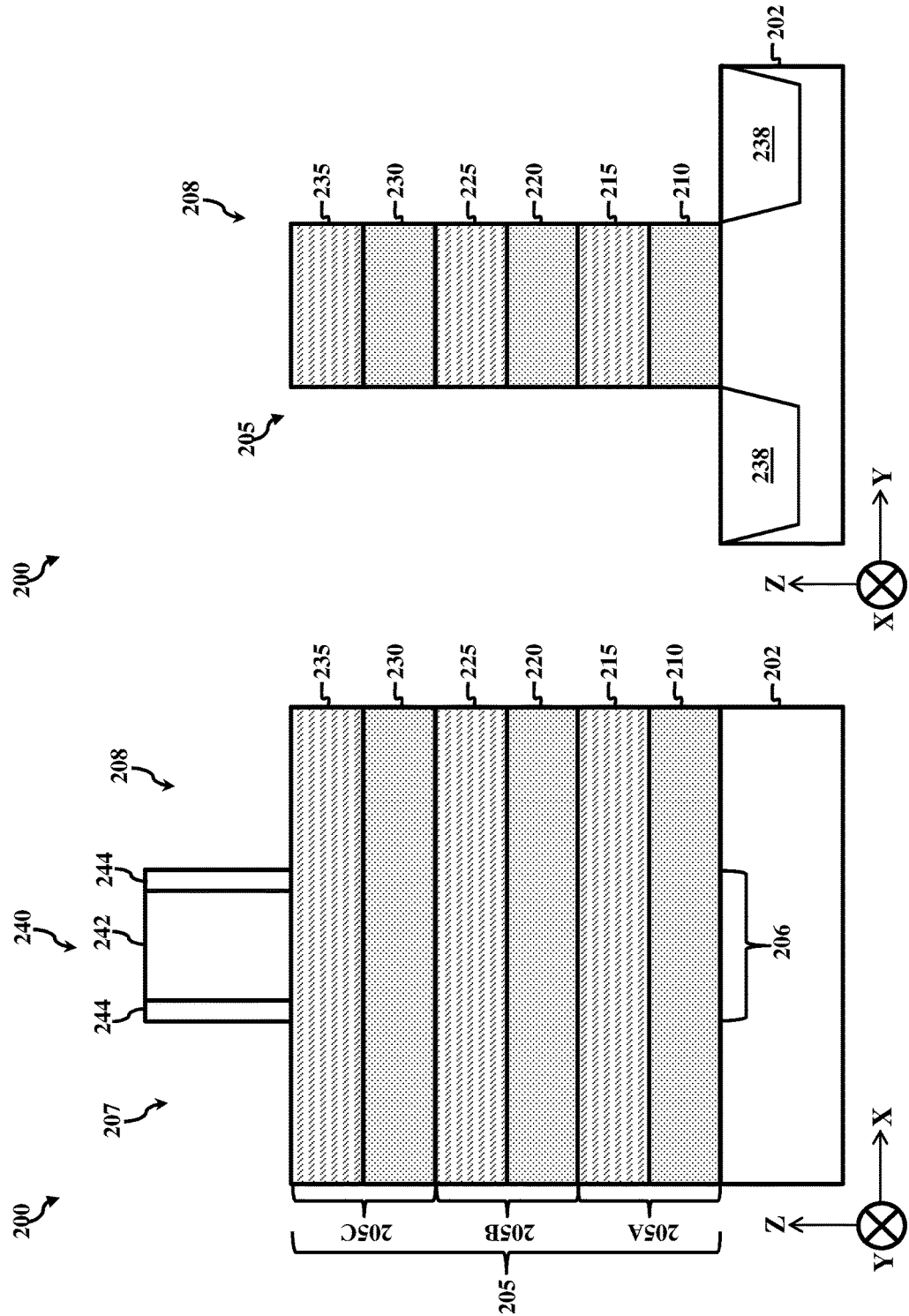

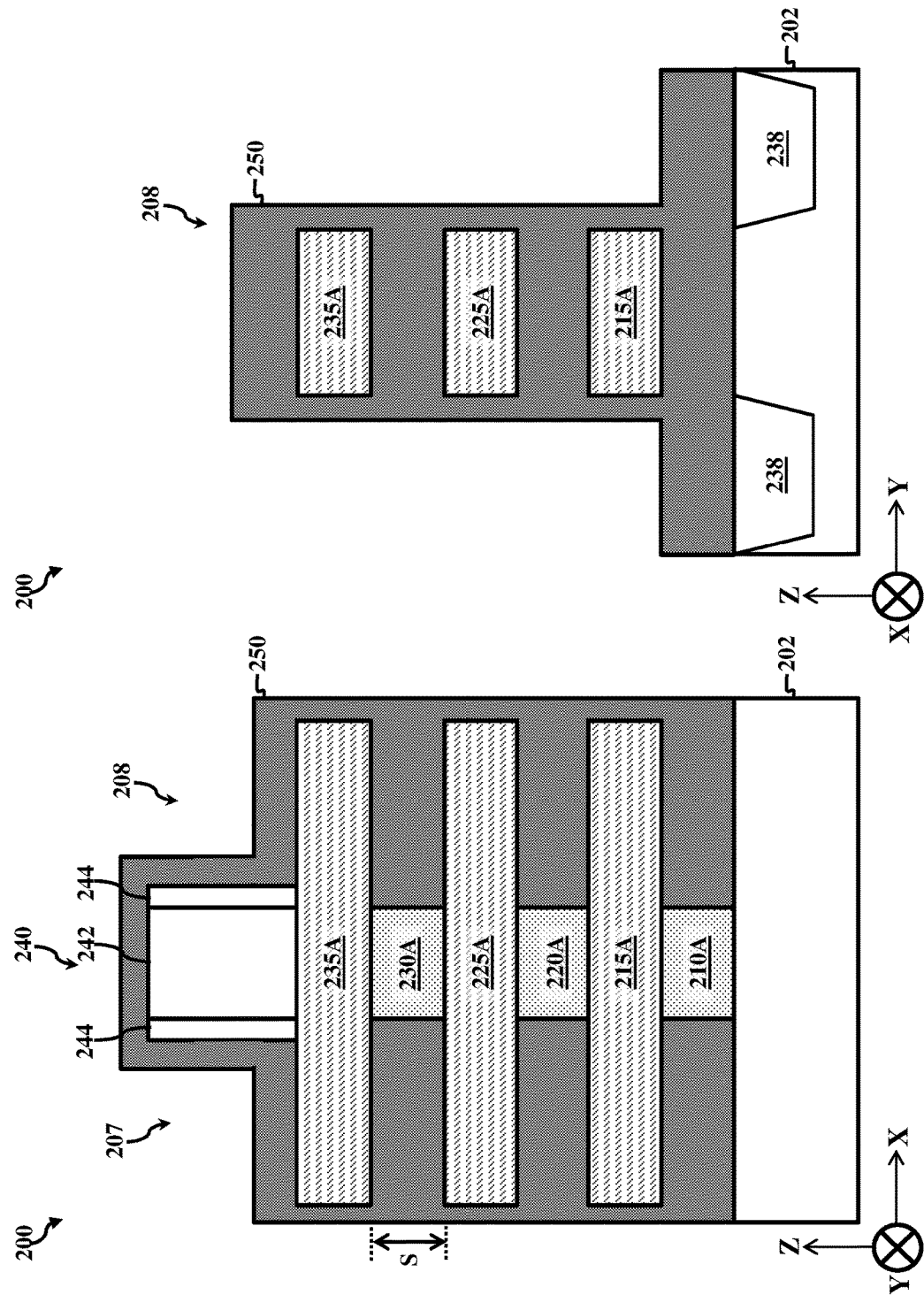

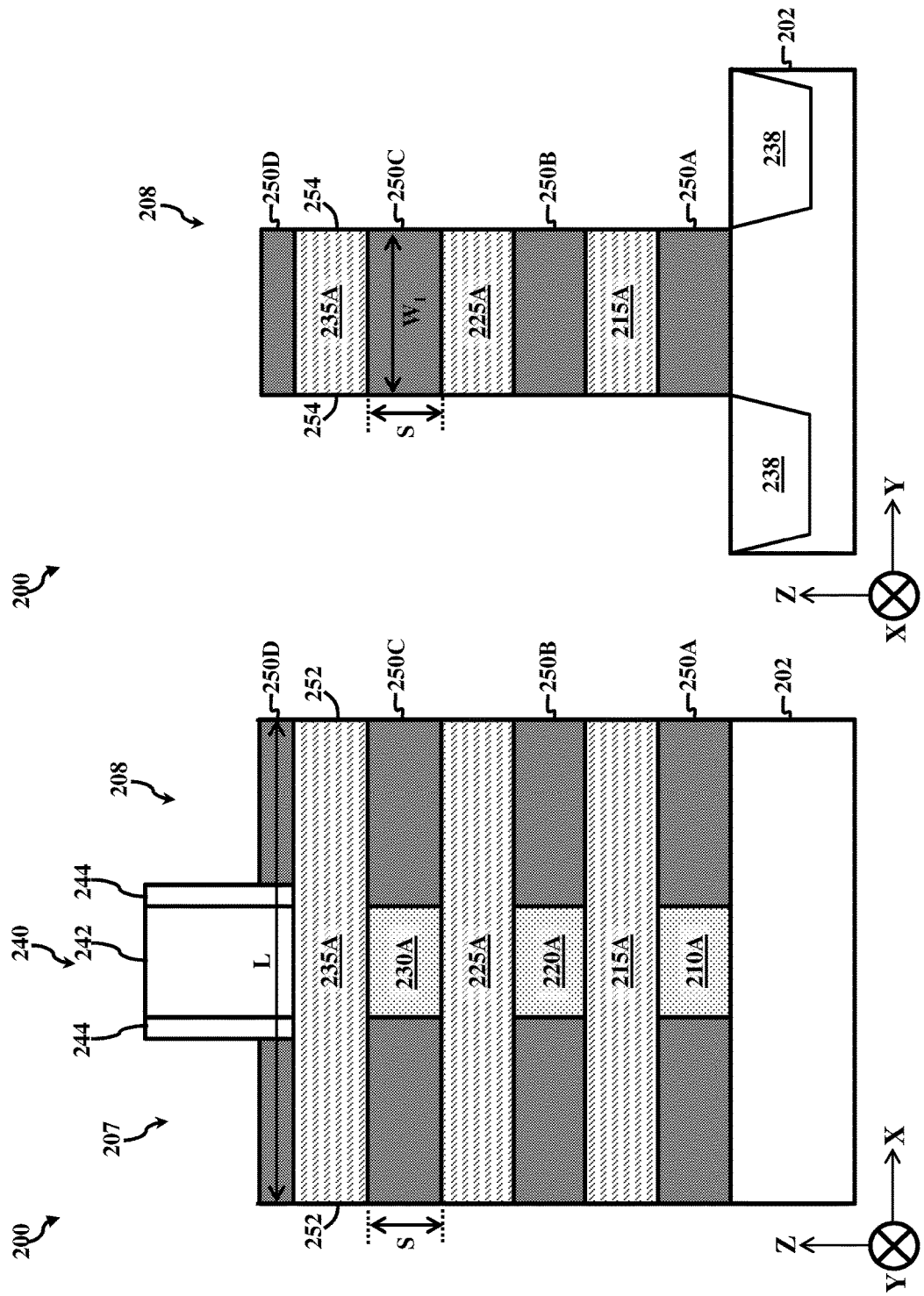

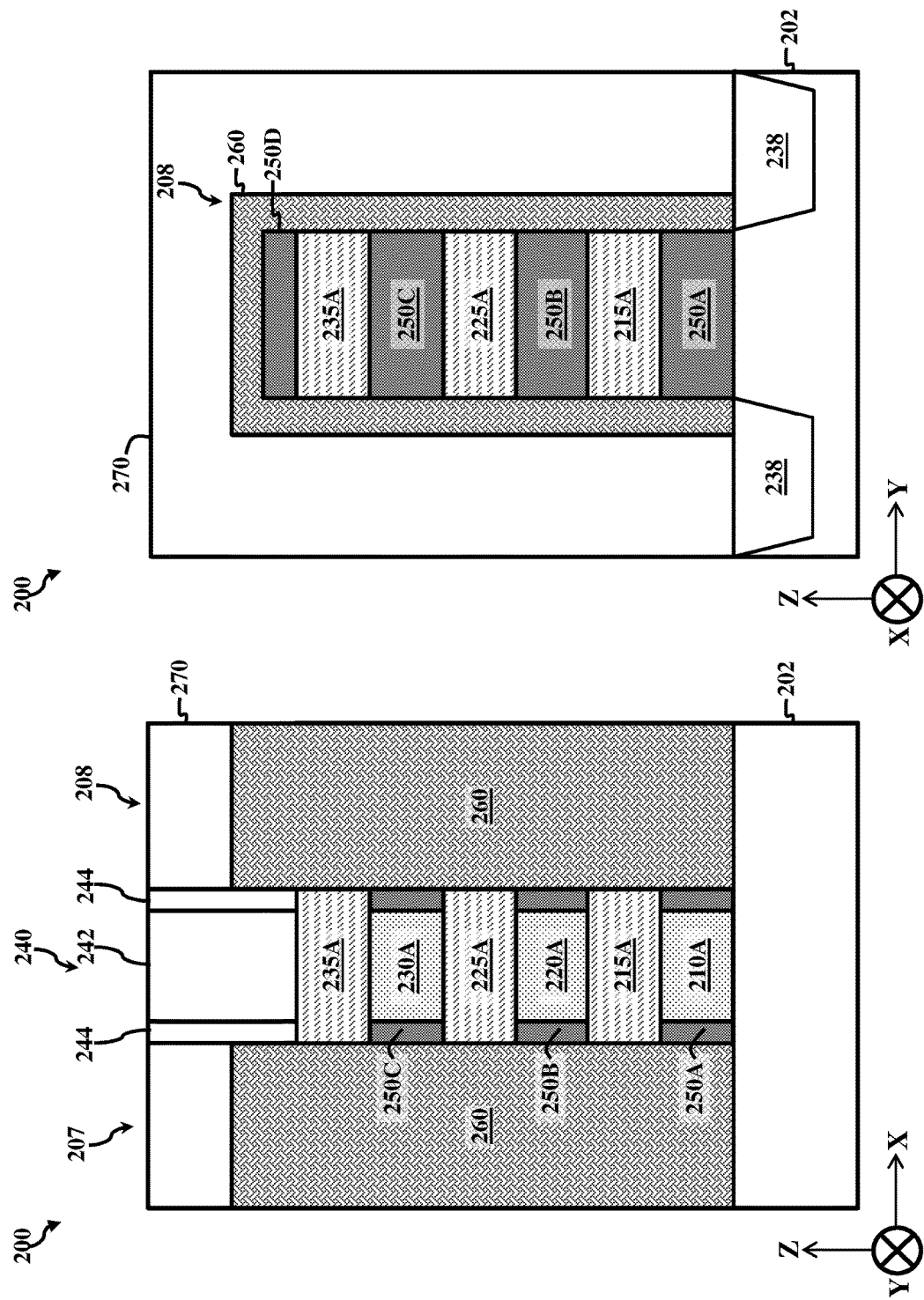

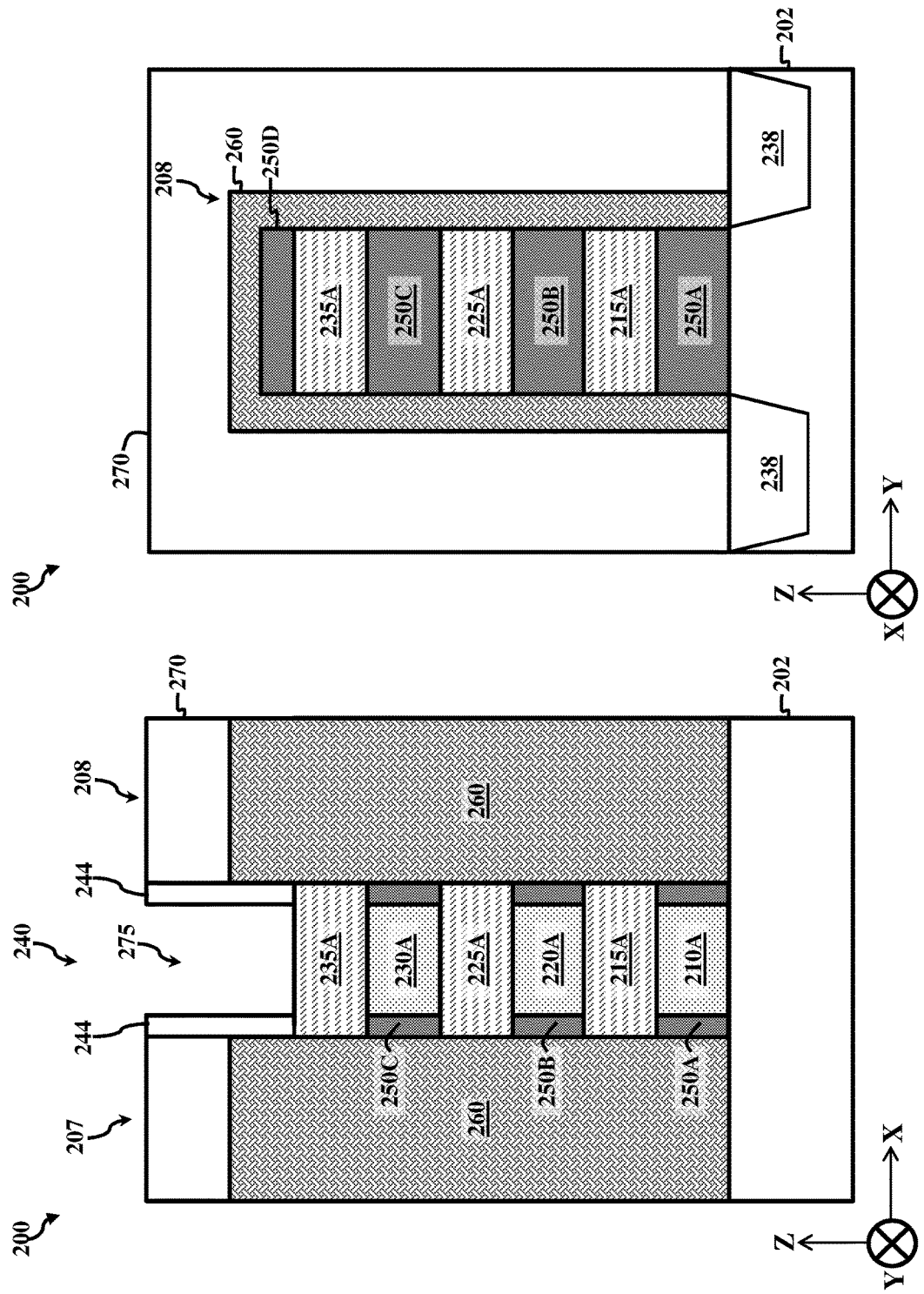

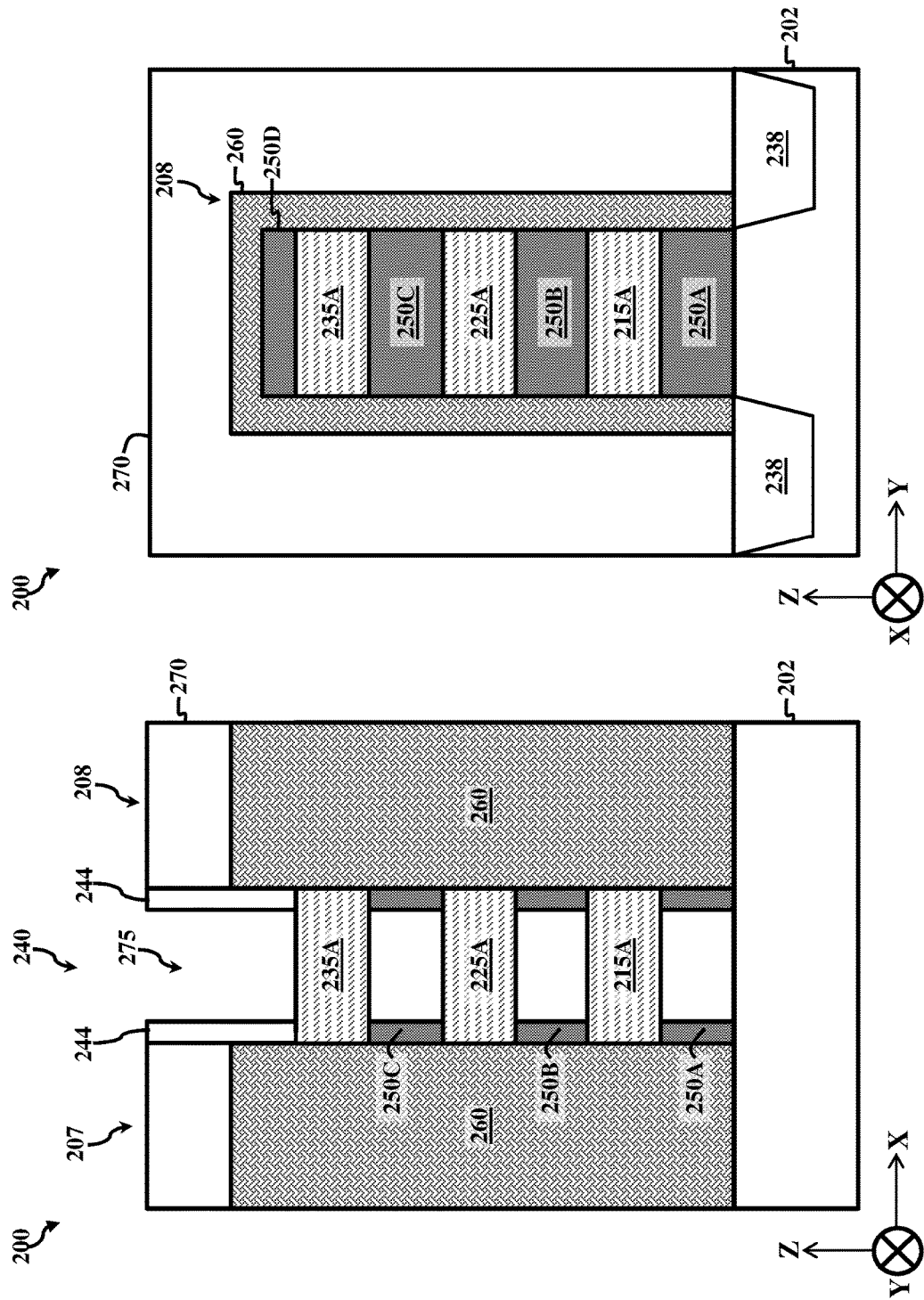

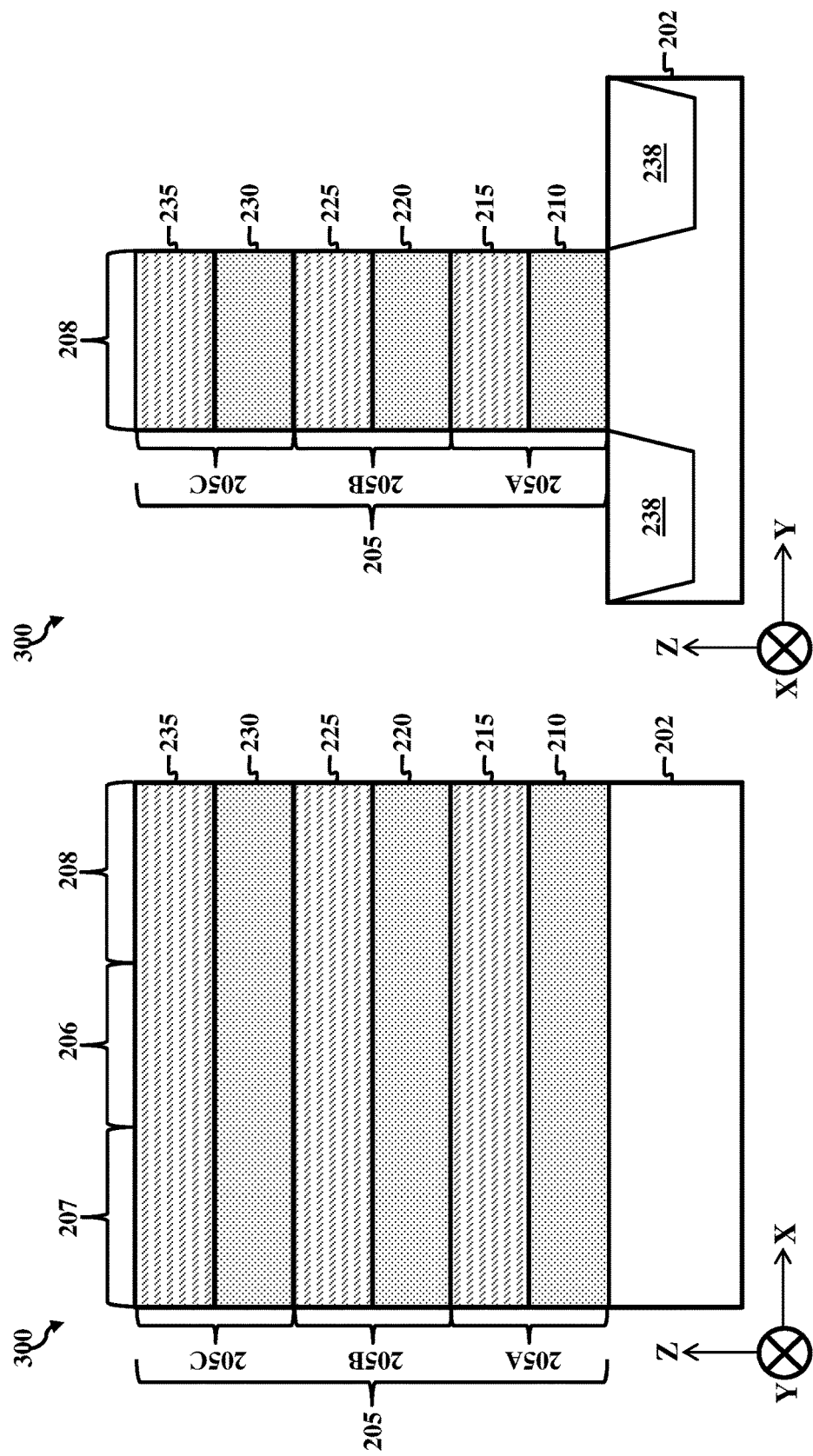

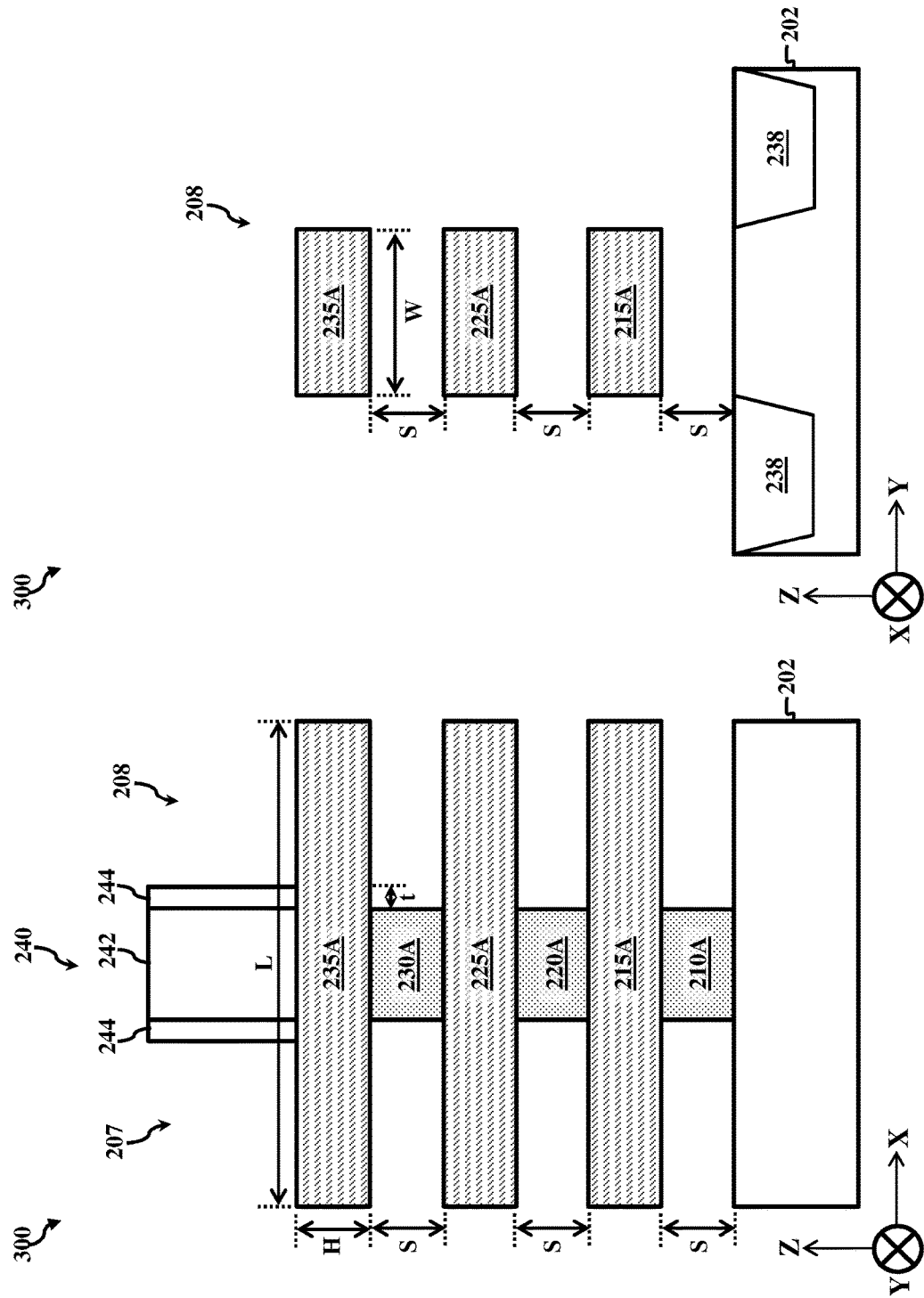

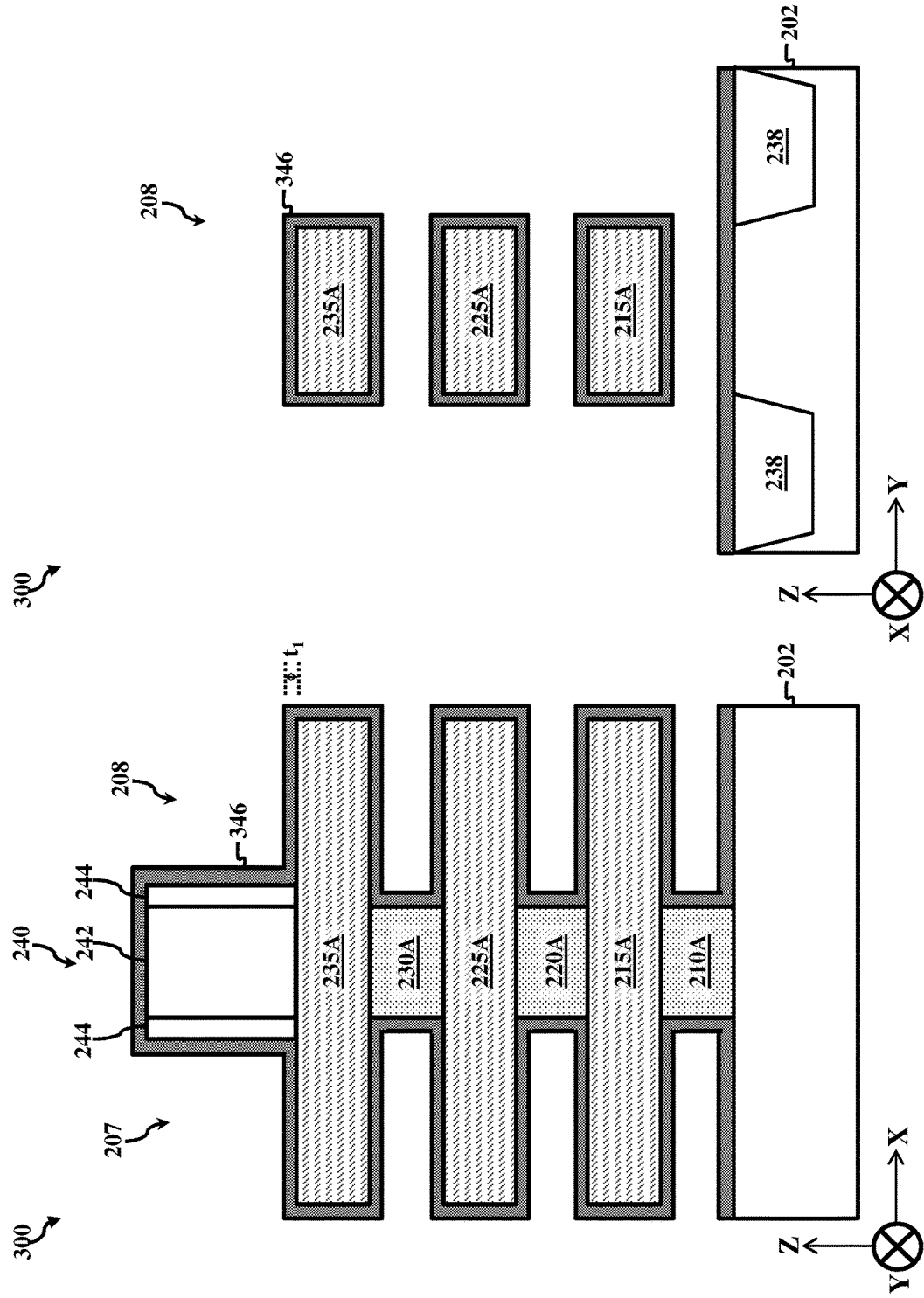

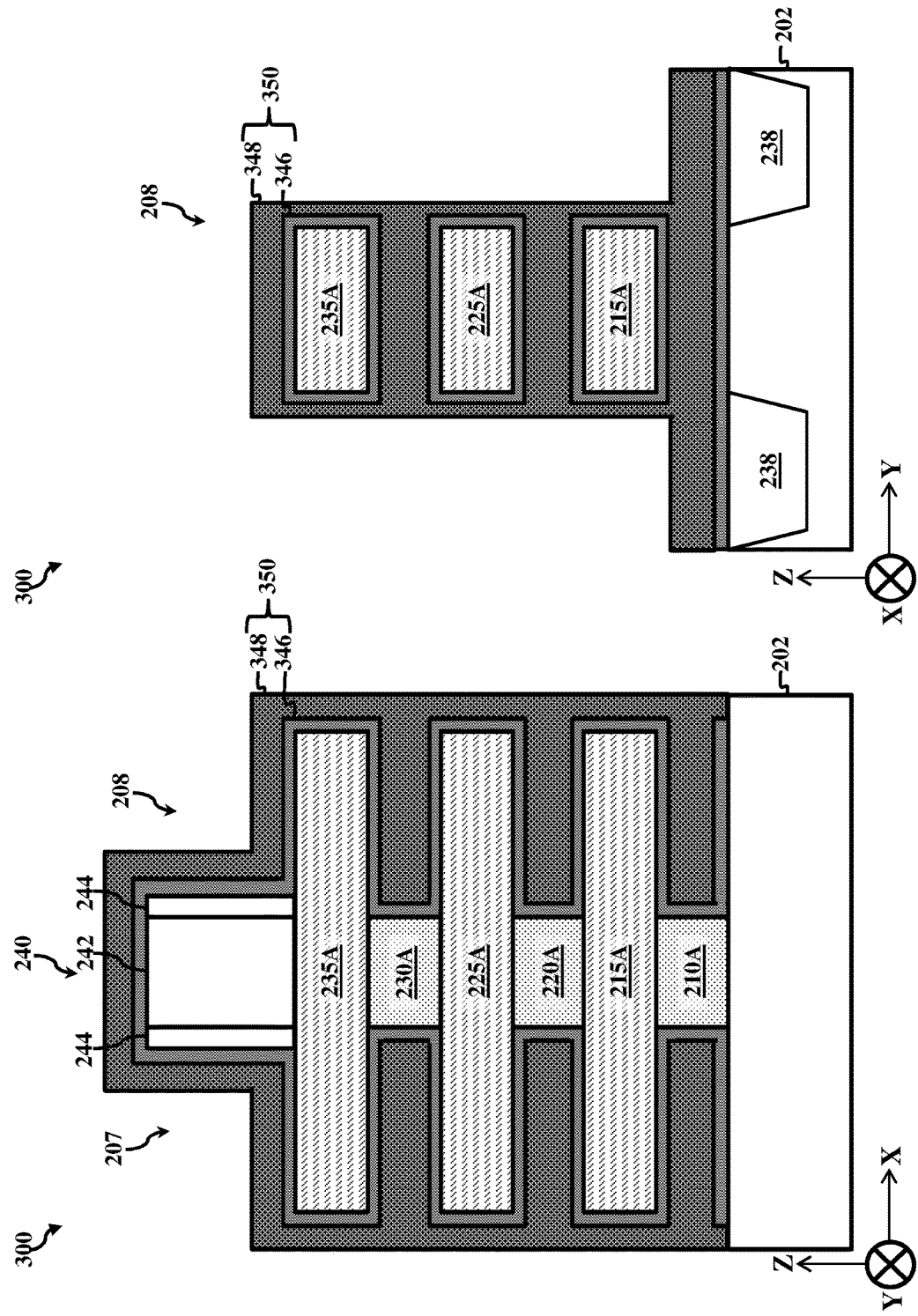

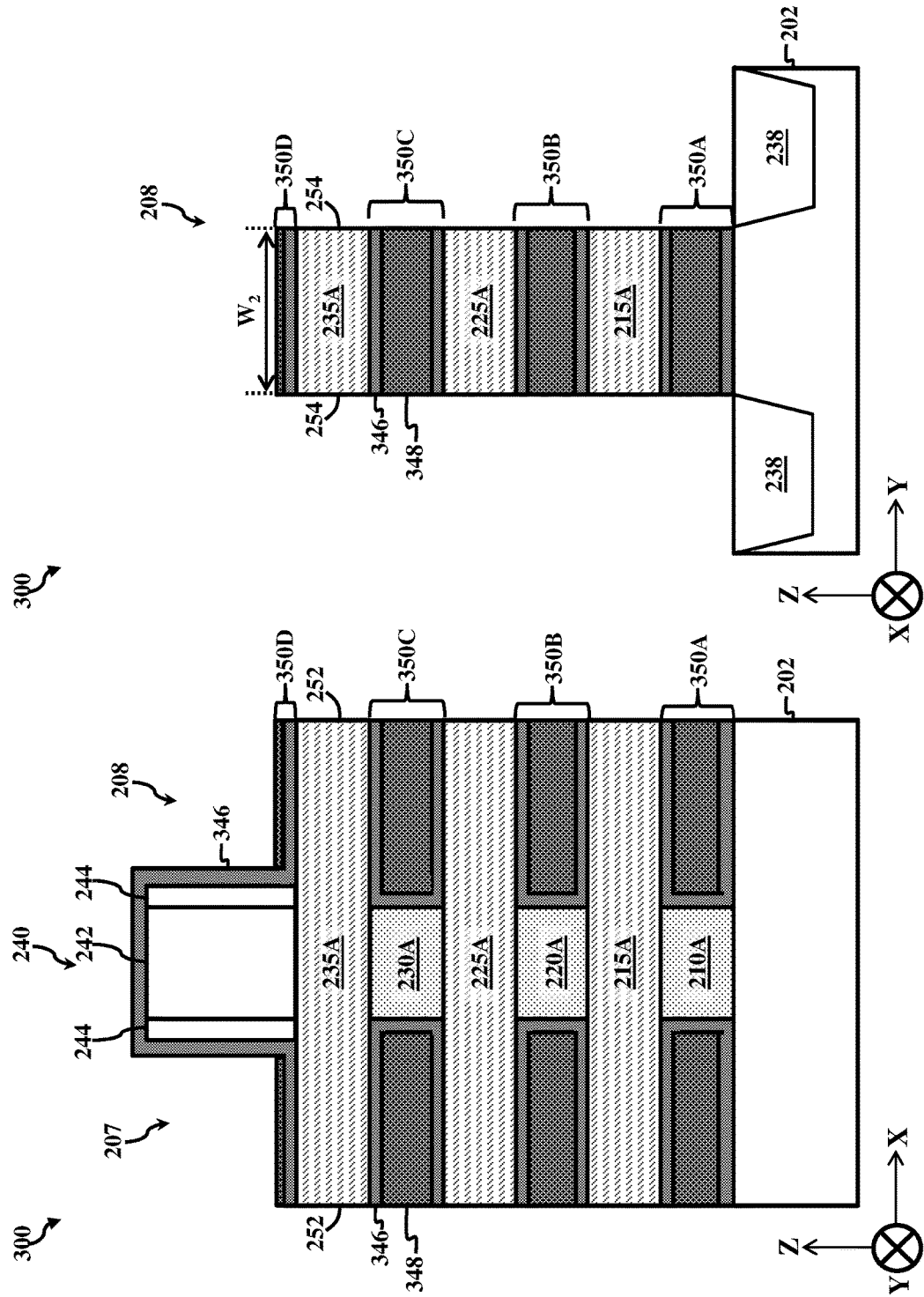

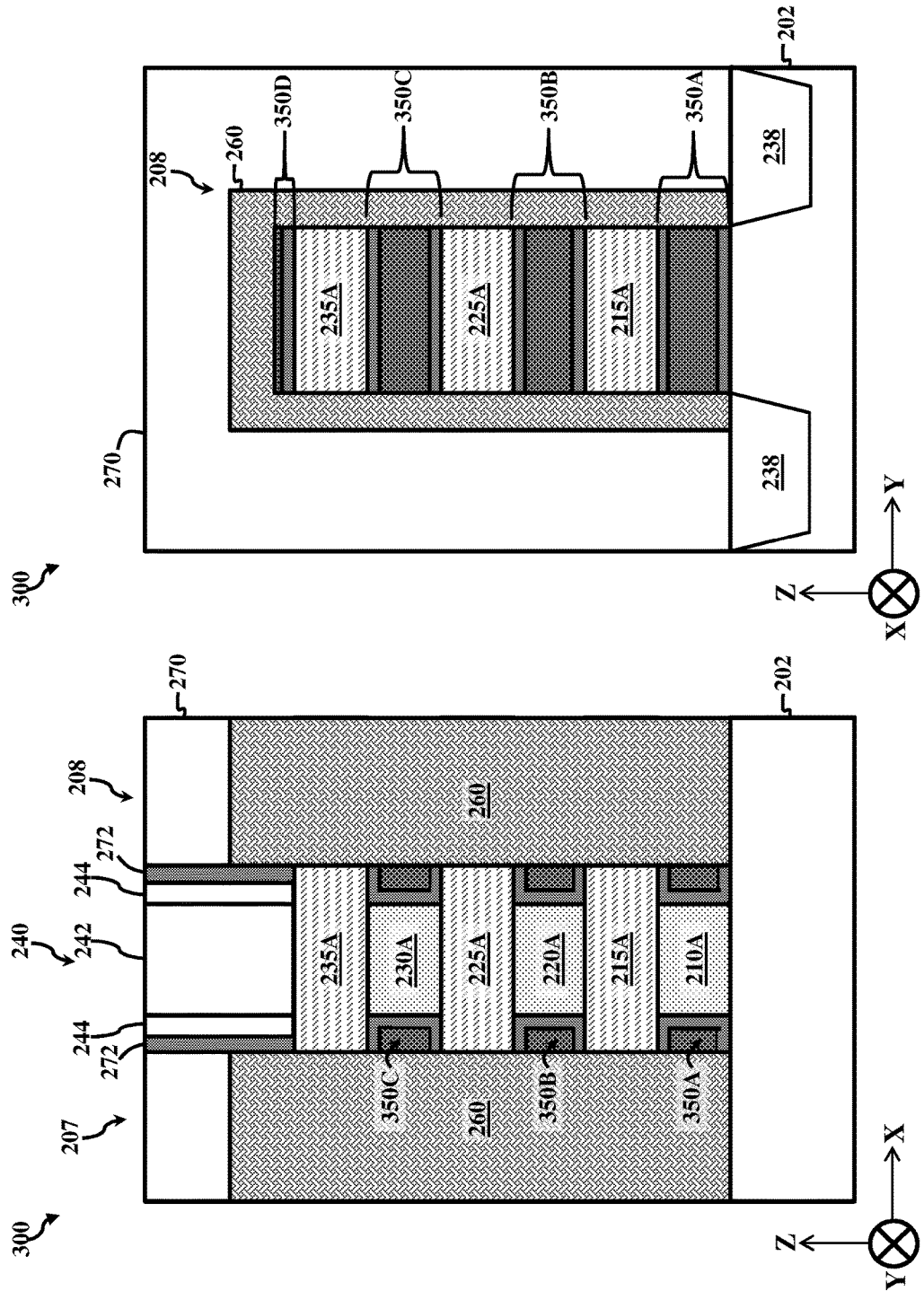

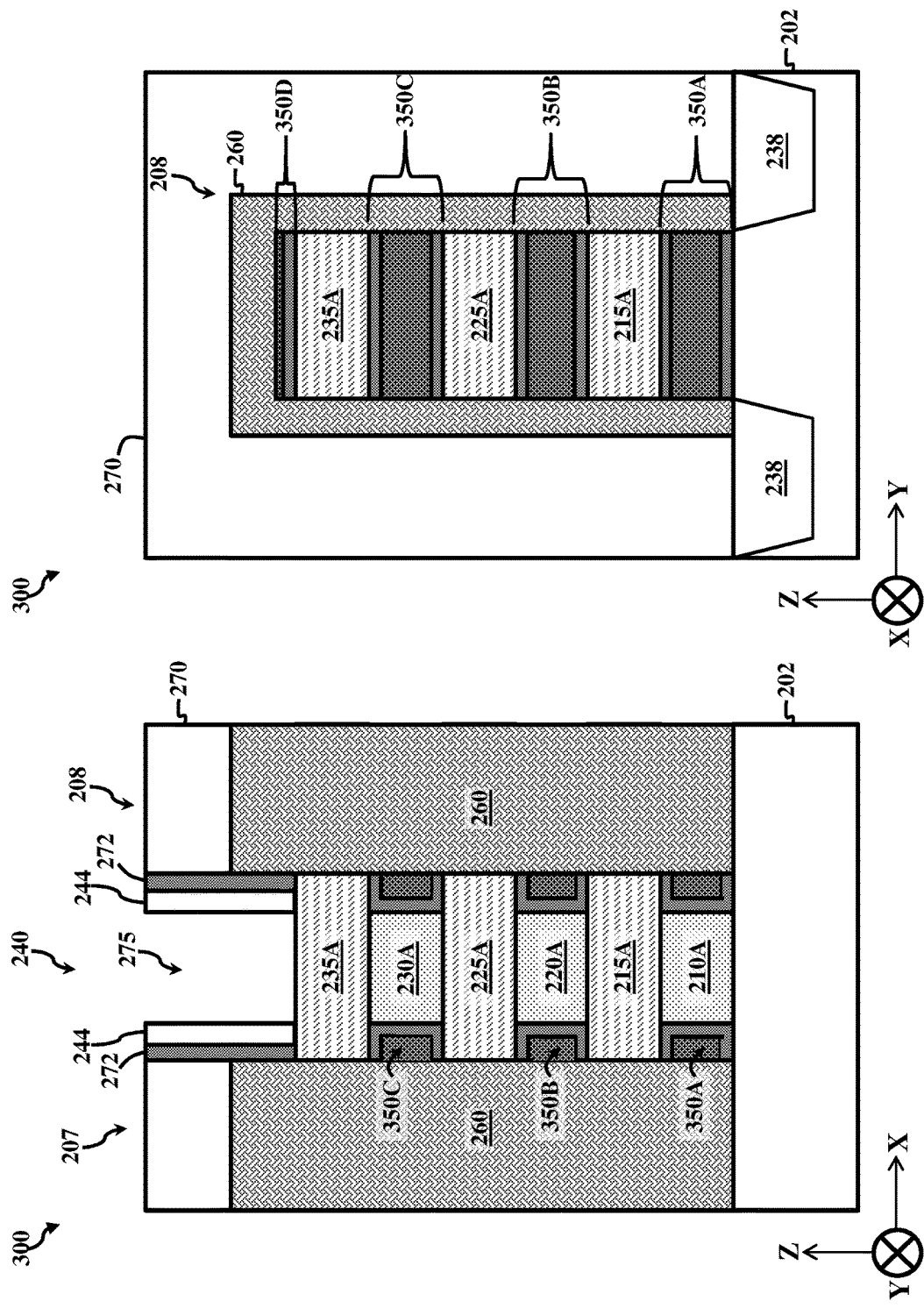

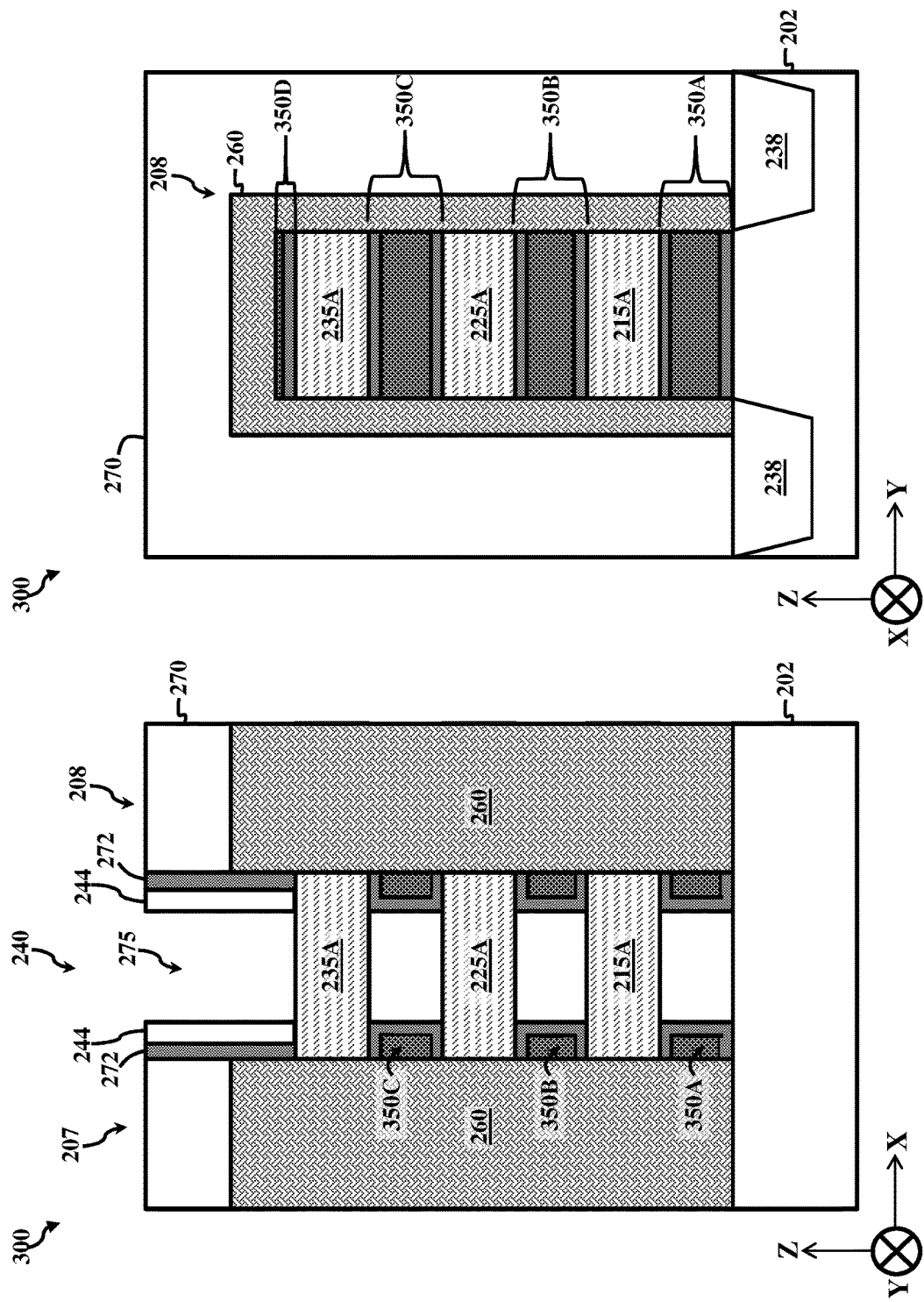

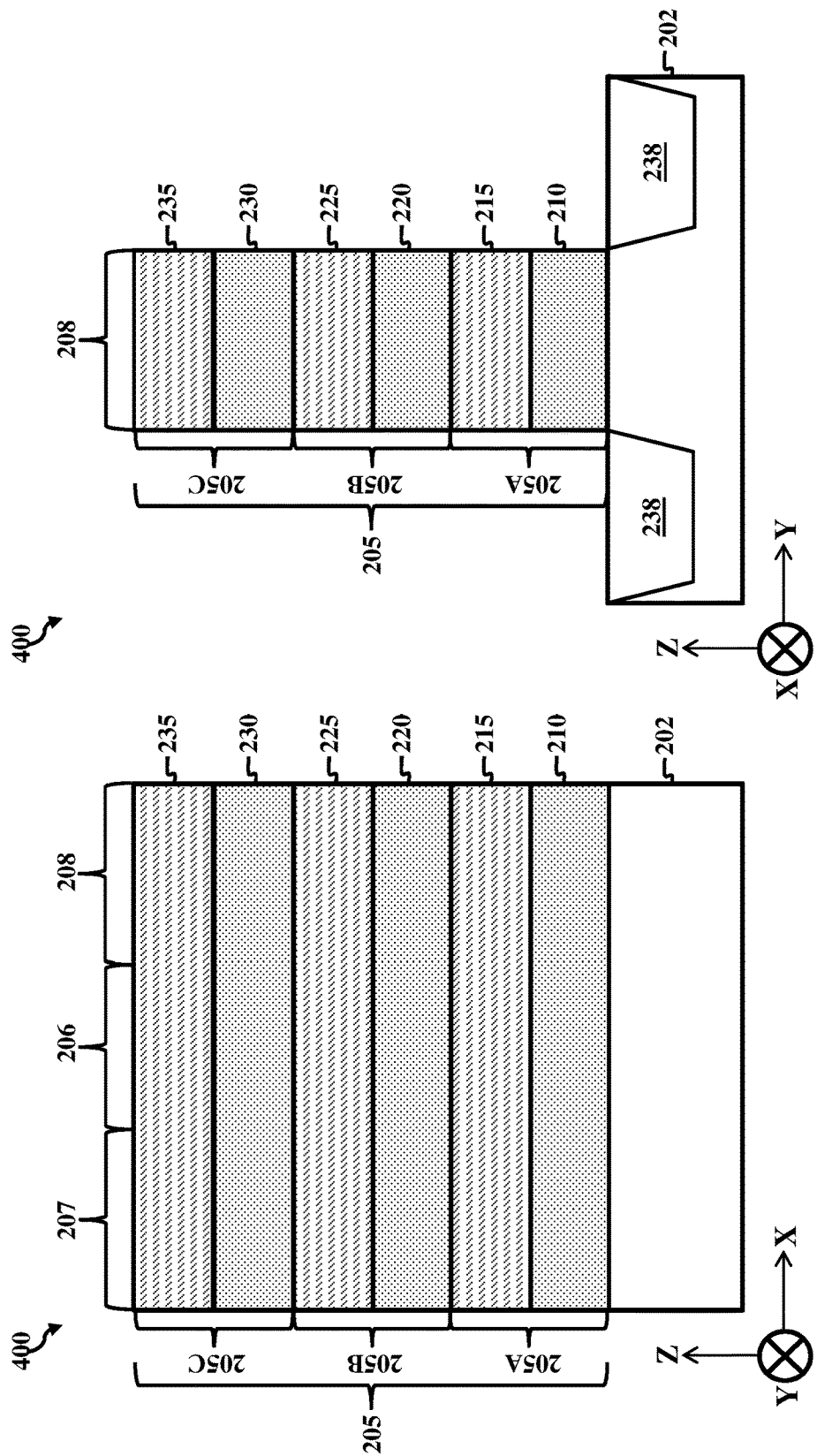

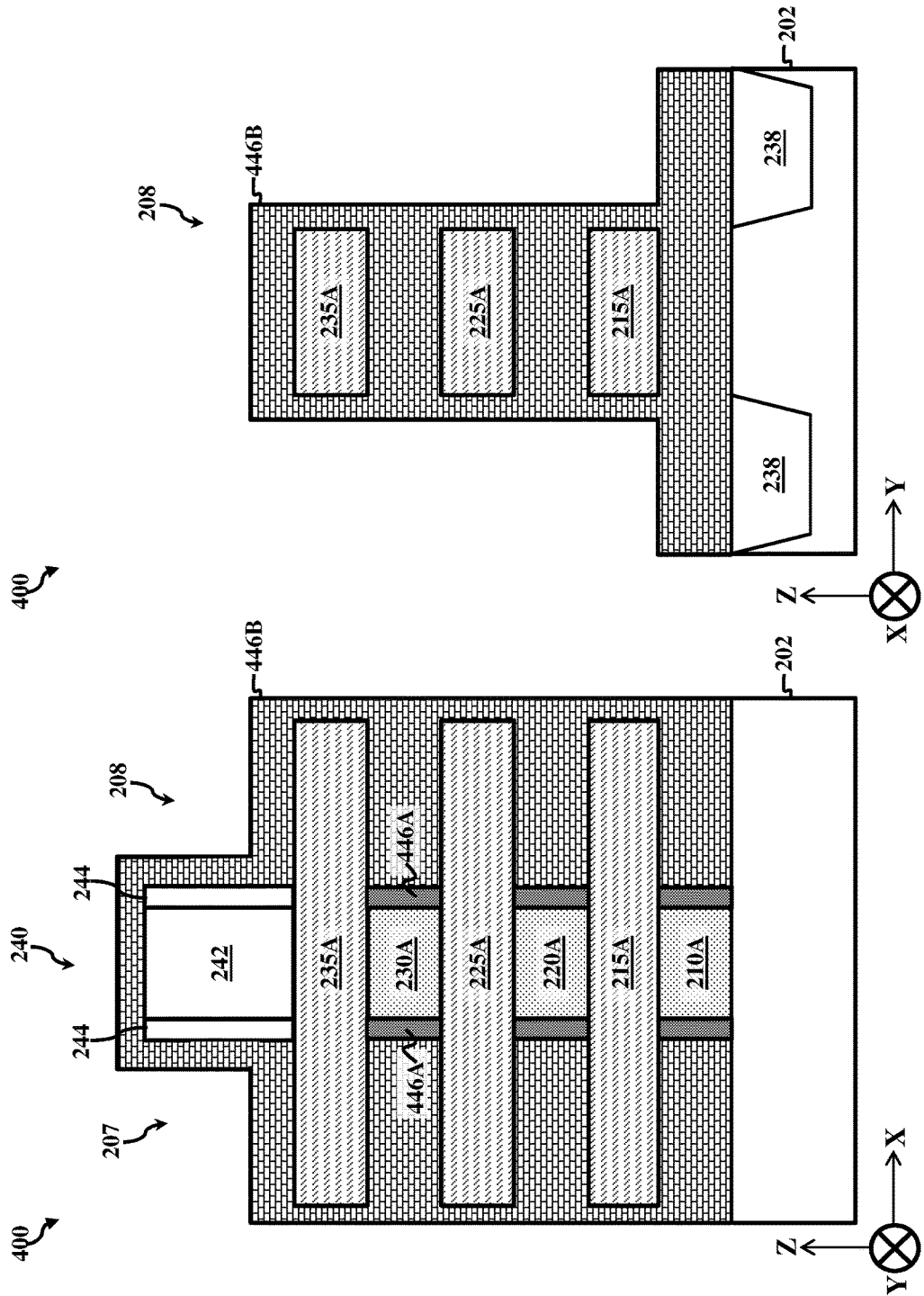

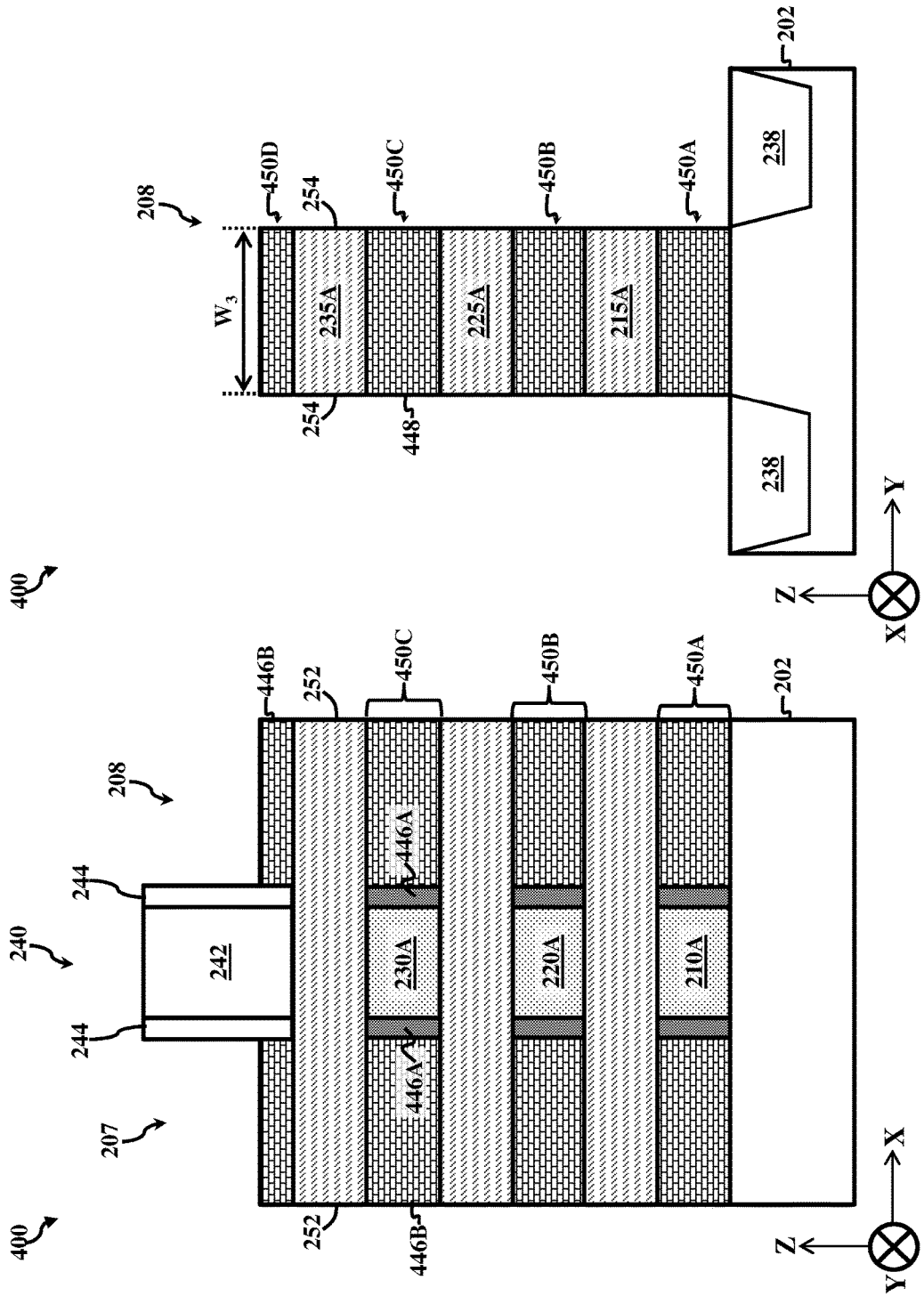

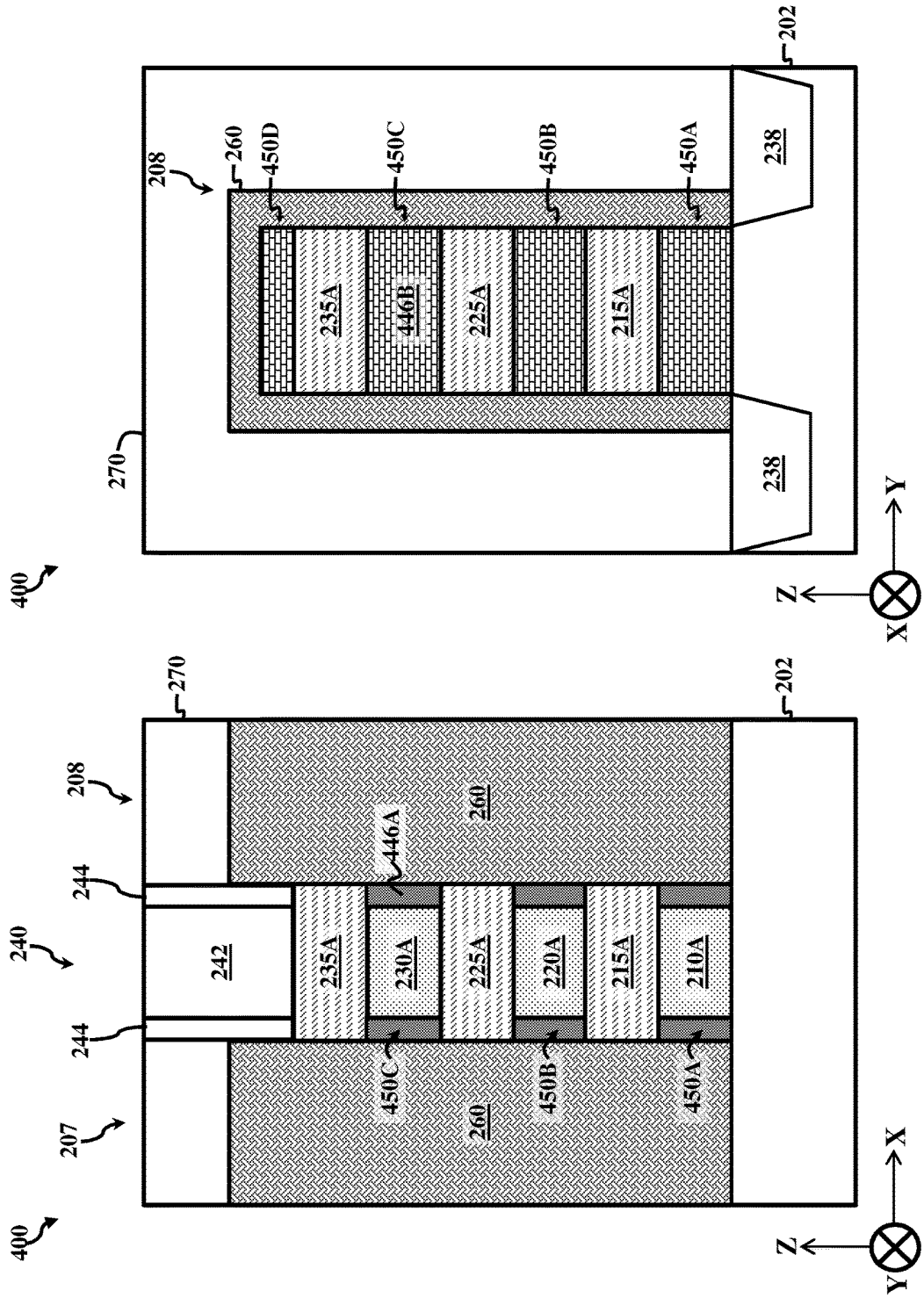

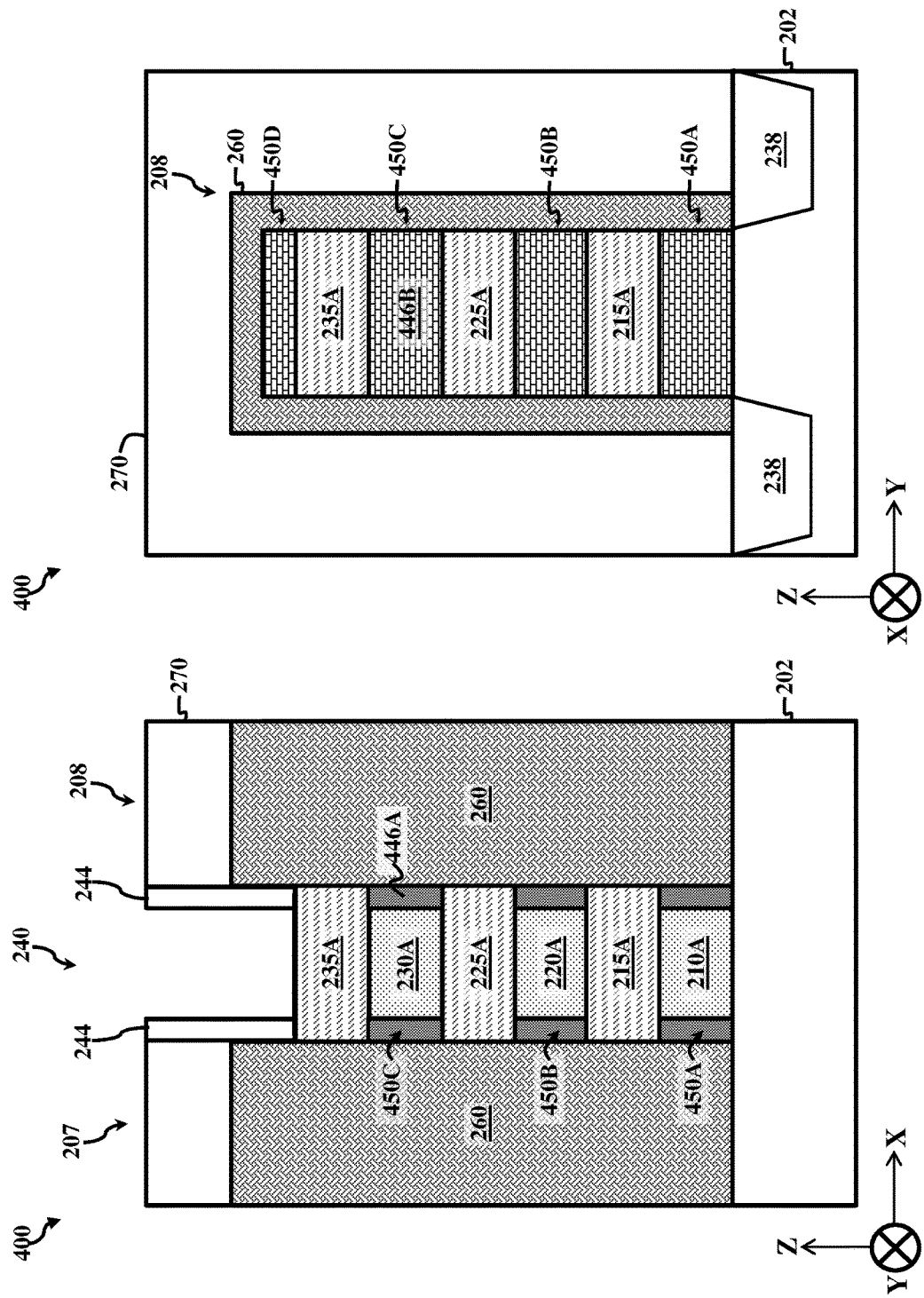

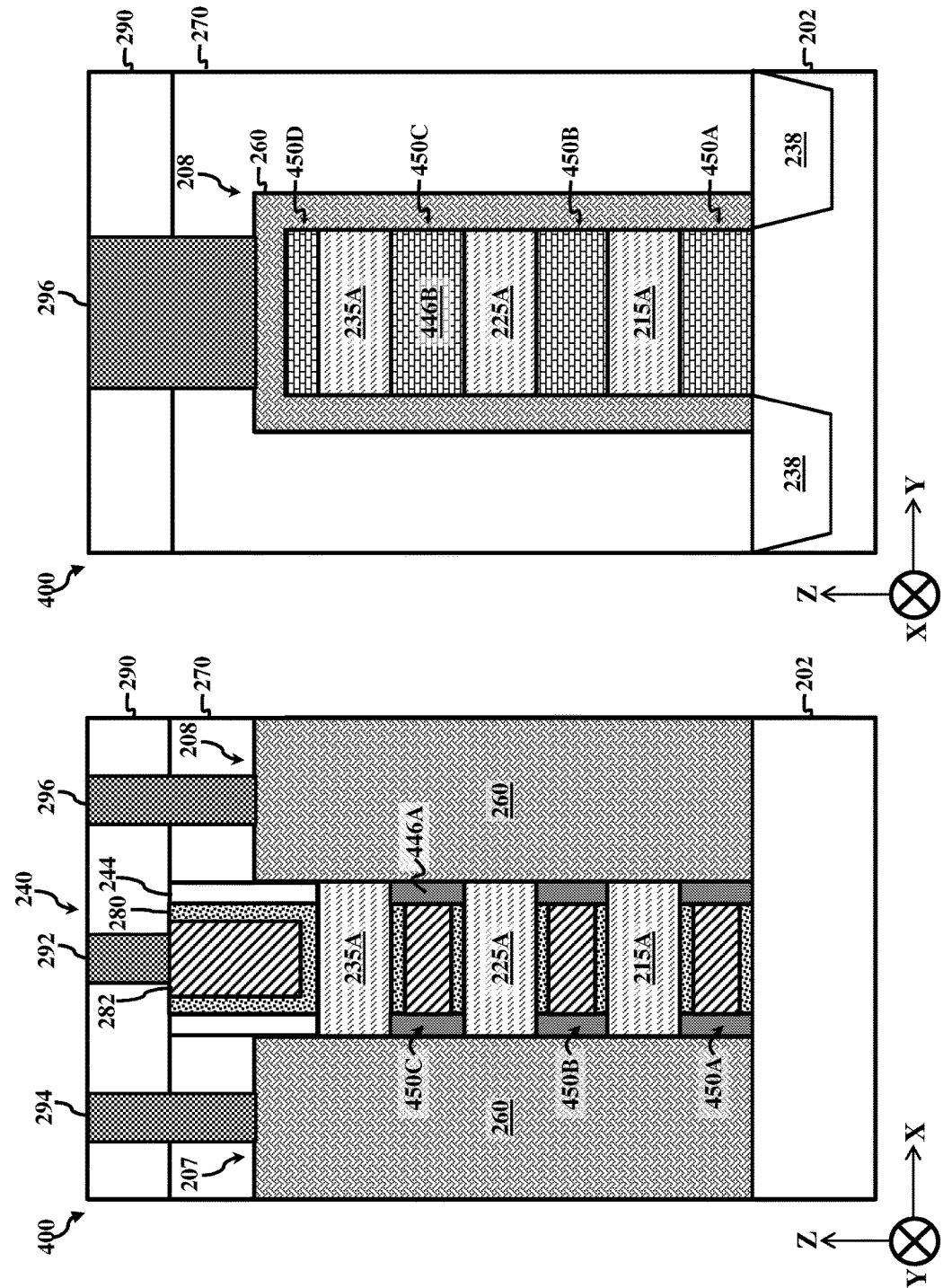

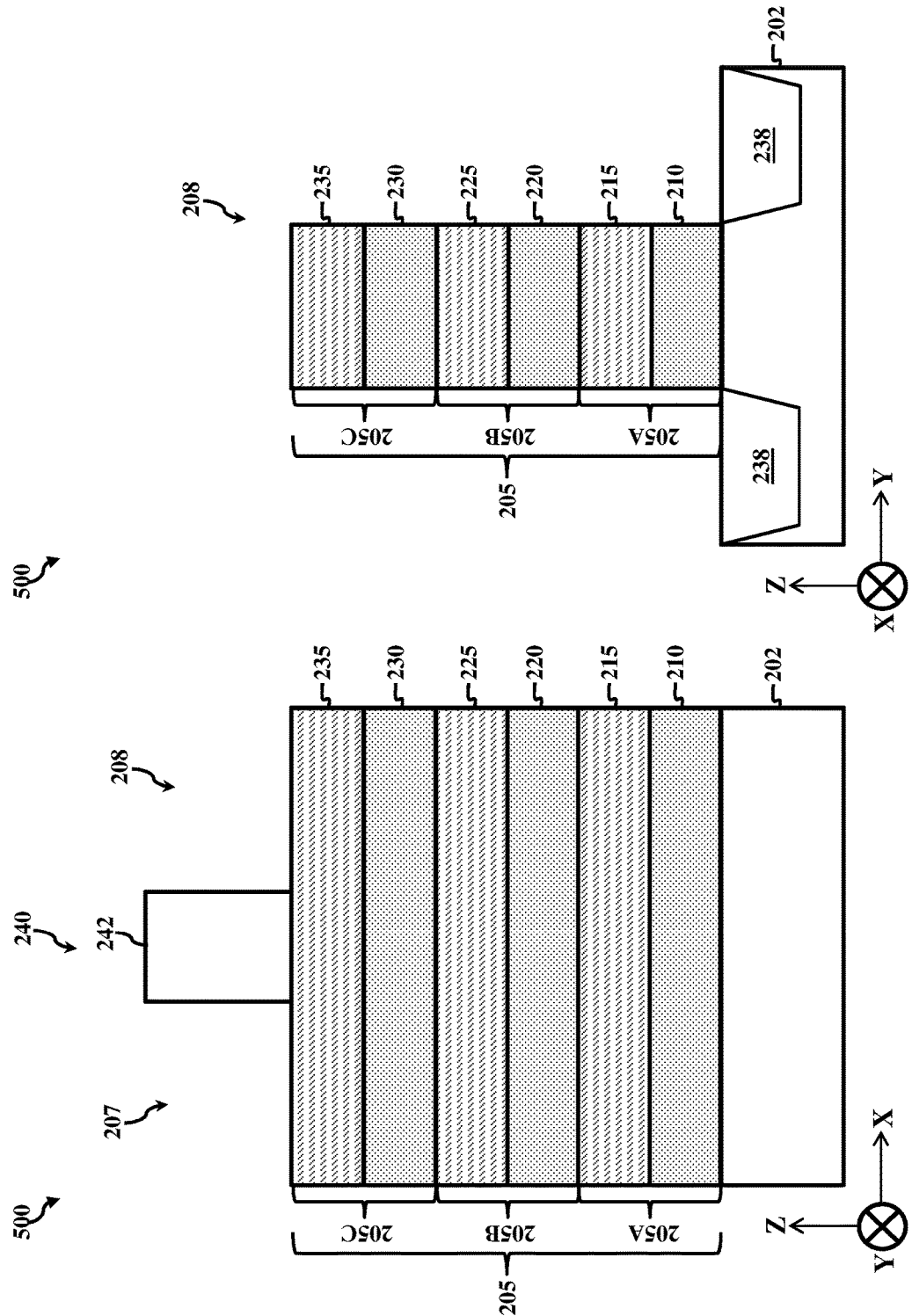

SPACERS FOR NANOWIRE-BASED INTEGRATED CIRCUIT DEVICE AND METHOD OF FABRICATING SAME

This application is a non-provisional application of and claims benefit of U.S. Provisional Patent Application Ser. No. 62/511,775, filed May 26, 2017, the entire disclosure of which is incorporated herein by reference.

BACKGROUND

The electronics industry has experienced an ever increasing demand for smaller and faster electronic devices that are simultaneously able to support a greater number of increasingly complex and sophisticated functions. To meet these demands, there is a continuing trend in the integrated circuit (IC) industry to manufacture low-cost, high-performance, and low-power ICs. Thus far, these goals have been achieved in large part by reducing IC dimensions (for example, minimum IC feature size), thereby improving production efficiency and lowering associated costs. However, such scaling has also increased complexity of the IC manufacturing processes. Thus, realizing continued advances in IC devices and their performance requires similar advances in IC manufacturing processes and technology.

Recently, multi-gate devices have been introduced to improve gate control. Multi-gate devices have been observed to increase gate-channel coupling, reduce OFF-state current, and/or reduce short-channel effects (SCEs). One such multi-gate device is the gate-all around (GAA) device, which includes a gate structure that can extend, partially or fully, around a channel region to provide access to the channel region on two or more sides. GAA devices enable aggressive scaling down of IC technologies, maintaining gate control and mitigating SCEs, while seamlessly integrating with conventional IC manufacturing processes. GAA devices often include nanowire-based structures, where nanowires are fabricated using a two-step release process—a source/drain nanowire release process and a channel nanowire release process. Challenges have arisen during the channel nanowire release process that degrade device performance and increase processing complexity. Accordingly, although existing GAA devices and methods for fabricating such have been generally adequate for their intended purposes, they have not been entirely satisfactory in all respects.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 3A-13A and FIGS. 3B-13B are fragmentary diagrammatic views of an integrated circuit device, in portion or entirety, at various fabrication stages (such as those associated with the method of FIG. 1) according to various aspects of the present disclosure.

FIGS. 14A-25A and FIGS. 14B-25B are fragmentary diagrammatic views of another integrated circuit device, in portion or entirety, at various fabrication stages (such as those associated with the method of FIG. 1) according to various aspects of the present disclosure.

FIGS. 26A-37A and FIGS. 26B-37B are fragmentary diagrammatic views of another integrated circuit device, in portion or entirety, at various fabrication stages (such as those associated with the method of FIG. 1) according to various aspects of the present disclosure.

FIGS. 38A-48A and FIGS. 38B-48B are fragmentary diagrammatic views of another integrated circuit device, in portion or entirety, at various fabrication stages (such as those associated with the method of FIG. 1) according to various aspects of the present disclosure.

DETAILED DESCRIPTION

Figure 1:
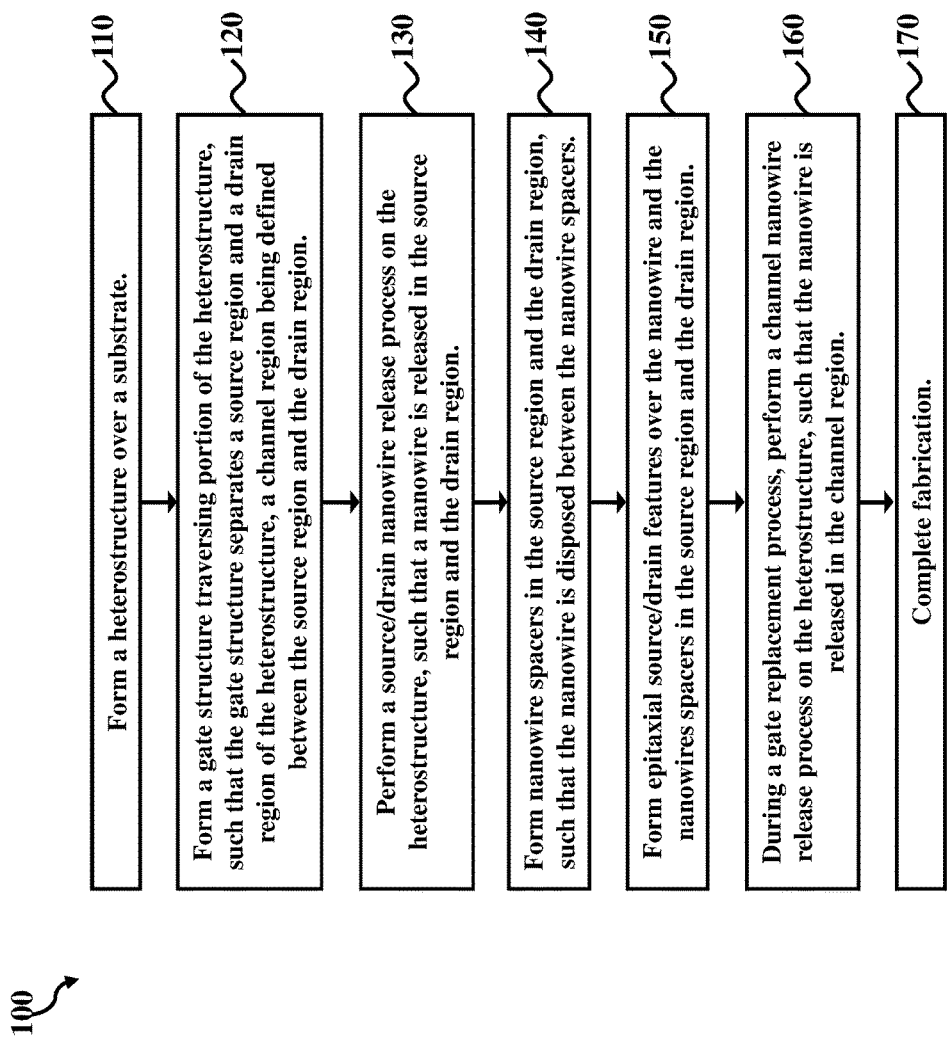
FIG. 1 is a flow chart of a method for fabricating an integrated circuit device according to various aspects of the present disclosure.

The present disclosure relates generally to integrated circuit devices, and more particularly, to nanowire-based integrated circuit devices.

The following disclosure provides many different embodiments, or examples, for implementing different features. Reference numerals and/or letters may be repeated in the various examples described herein. This repetition is for the purpose of simplicity and clarity and does not in itself dictate a relationship between the various disclosed embodiments and/or configurations. Further, specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. Moreover, the formation of a feature on, connected to, and/or coupled to another feature in the present disclosure may include embodiments in which the features are formed in direct contact, and may also include embodiments in which additional features may be formed interposing the features, such that the features may not be in direct contact.

Further, spatially relative terms, for example, "lower," "upper," "horizontal," "vertical," "above," "over," "below," "beneath," "up," "down," "top," "bottom," etc. as well as derivatives thereof (e.g., "horizontally," "downwardly," "upwardly," etc.) are used herein for ease of description to describe one element or feature's relationship to another element(s) or feature(s). The spatially relative terms are intended to encompass different orientations than as depicted of a device (or system or apparatus) including the element(s) or feature(s), including orientations associated with the device's use or operation. The apparatus may be otherwise oriented (rotated 90 degrees or at other orientations) and the spatially relative descriptors used herein may likewise be interpreted accordingly.

FIG. 1 is a flow chart of a method 100 for fabricating an integrated circuit device according to various aspects of the present disclosure. In the present embodiment, method 100 fabricates a nanowire-based integrated circuit device, such as a gate-all around (GAA) transistor. At block 110, a heterostructure is formed over a substrate. The heterostructure includes at least one semiconductor layer pair having a first semiconductor layer and a second semiconductor layer disposed over the first semiconductor layer. The second semiconductor layer is different than the first semiconductor layer. At block 120, a gate structure is formed over a portion of the heterostructure, such that the gate structure separates a source region and a drain region of the heterostructure. A channel region is defined between the source region and the drain region. The gate structure includes a dummy gate stack. In some implementations, the gate structure includes gate spacers. At block 130, a source/drain nanowire release process is performed on the heterostructure, such that a nanowire is released in the source region and the drain region. In some implementations, the source/drain nanowire release process includes selectively removing the first semiconductor layer from the source region and the drain region of the heterostructure, such that the nanowire is formed from the second semiconductor layer. At block 140, nanowire spacers are formed in the source region and the drain region, such that the nanowire is disposed between the nanowire spacers. The nanowire spacers extend into the channel region under gate spacers. In some implementations, the second semiconductor layer is disposed between the nanowire spacers in the source region and the drain region. In some implementations, gate spacers are formed while forming the nanowire spacers. In some implementations, the nanowire spacers include a multi-layer structure, such as a first nanowire layer and a second nanowire layer. In some implementations, forming the nanowire spacers includes depositing a nanowire spacer layer over the nanowire and selectively etching the nanowire spacer layer to expose sidewalls of the nanowire. In some implementations, the nanowire spacer layer is treated (for example, by an ion implantation process) before the etching. The treated nanowire spacer layer includes a treated portion and an untreated portion, where the treated portion has a different functional characteristic (for example, a different etching characteristic) than the untreated portion. At block 150, epitaxial source/drain features are formed over the nanowire and the nanowire spacers in the source region and the drain region. In some implementations, where the nanowire spacers have been patterned (for example, etched) to include a space (or void), the epitaxial source/drain features fill the space in the nanowire spacers. At block 160, a channel nanowire release process is performed on the heterostructure during a gate replacement process, such that the nanowire is released in the channel region. The gate replacement process can include removing the dummy gate stack from the gate structure, thereby forming an opening in the gate structure. In some implementations, the opening exposes a remaining portion of the first semiconductor layer, and the channel nanowire release process can include selectively removing the remaining portion of the first semiconductor layer from the channel region of the heterostructure. A metal gate stack can then be formed in the opening of the gate structure. At block 170, the method 100 may continue to complete fabrication of the integrated circuit device. Additional steps can be provided before, during, and after method 100, and some of the steps described can be moved, replaced, or eliminated for additional embodiments of method 100. The discussion that follows illustrates various embodiments of nanowire-based integrated circuit devices that can be fabricated according to method 100.

Figure 2:
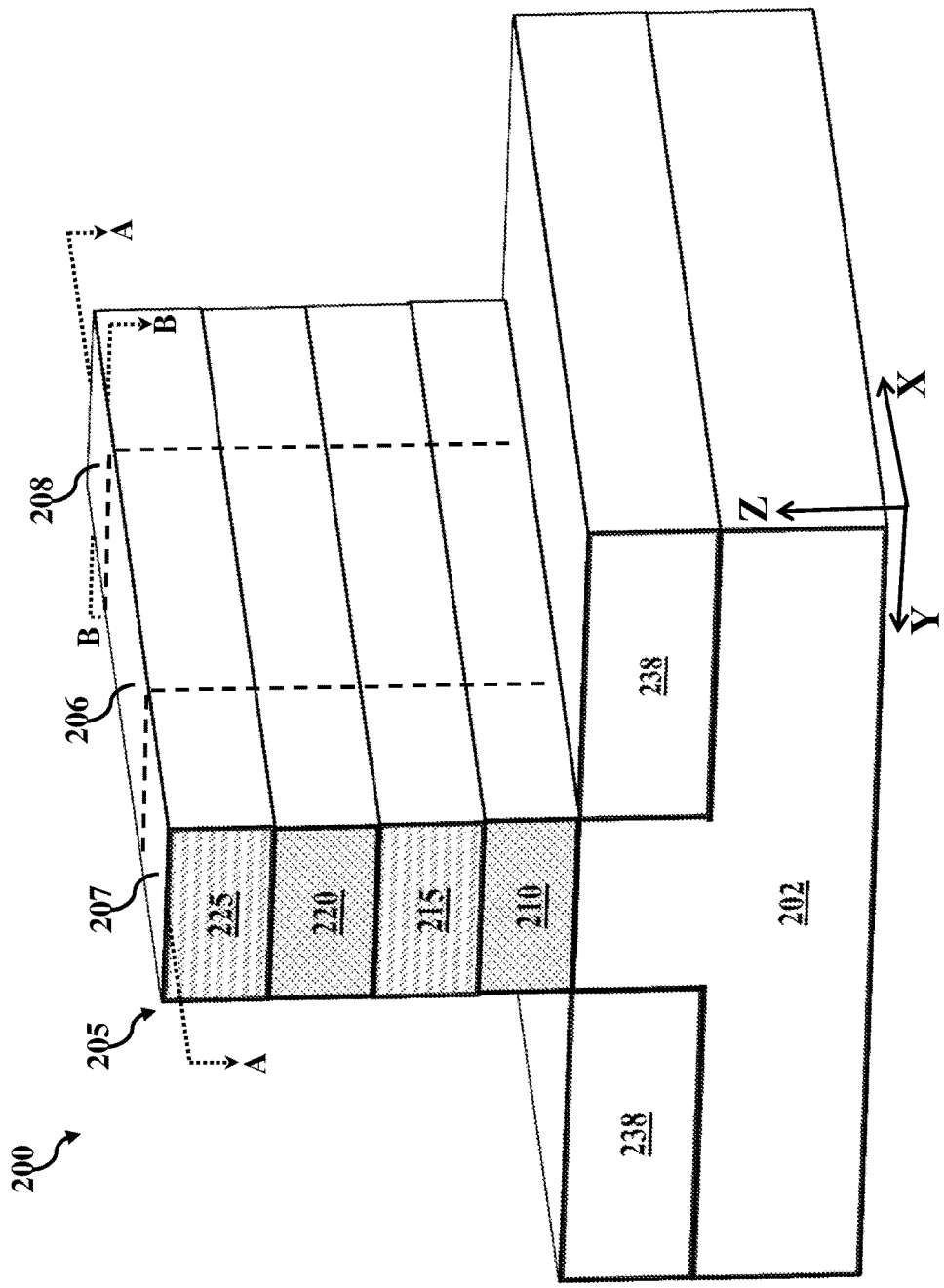
FIG. 2 is a perspective, three-dimensional view of an integrated circuit device, in portion or entirety, according to various aspects of the present disclosure.

FIG. 2, FIGS. 3A-13A, and FIGS. 3B-13B are fragmentary diagrammatic views of an integrated circuit device 200, in portion or entirety, at various fabrication stages (such as those associated with method 100) according to various aspects of the present disclosure. In particular, FIG. 2 is a perspective, three-dimensional view of integrated circuit device 200 in an X-Y-Z plane, FIGS. 3A-13A are diagrammatic cross-sectional views of integrated circuit device 200 in an X-Z plane along line A-A of FIG. 2, and FIGS. 3B-13B are diagrammatic cross-sectional views of integrated circuit device 200 in a Y-Z plane along line B-B of FIG. 2. Integrated circuit device 200 may be included in a microprocessor, a memory, and/or other integrated circuit device. In some implementations, integrated circuit device 200 is a portion of an integrated circuit (IC) chip, a system on chip (SoC), or portion thereof, that includes various passive and active microelectronic devices such as resistors, capacitors, inductors, diodes, p-type field effect transistors (PFETs), n-type field effect transistors (NFETs), metal-oxide semiconductor field effect transistors (MOSFETs), complementary metal-oxide semiconductor (CMOS) transistors, bipolar junction transistors (BJTs), laterally diffused MOS (LDMOS) transistors, high voltage transistors, high frequency transistors, other suitable components, or combinations thereof. In some implementations, integrated circuit device 200 is included in a non-volatile memory, such as a non-volatile random access memory (NVRAM), a flash memory, an electrically erasable programmable read only memory (EEPROM), an electrically programmable read-only memory (EPROM), other suitable memory type, or combinations thereof. FIG. 2, FIGS. 3A-13A, and FIGS. 3B-13B have been simplified for the sake of clarity to better understand the inventive concepts of the present disclosure. Additional features can be added in integrated circuit device 200, and some of the features described below can be replaced, modified, or eliminated in other embodiments of integrated circuit device 200.

Figures 3A, 3B:
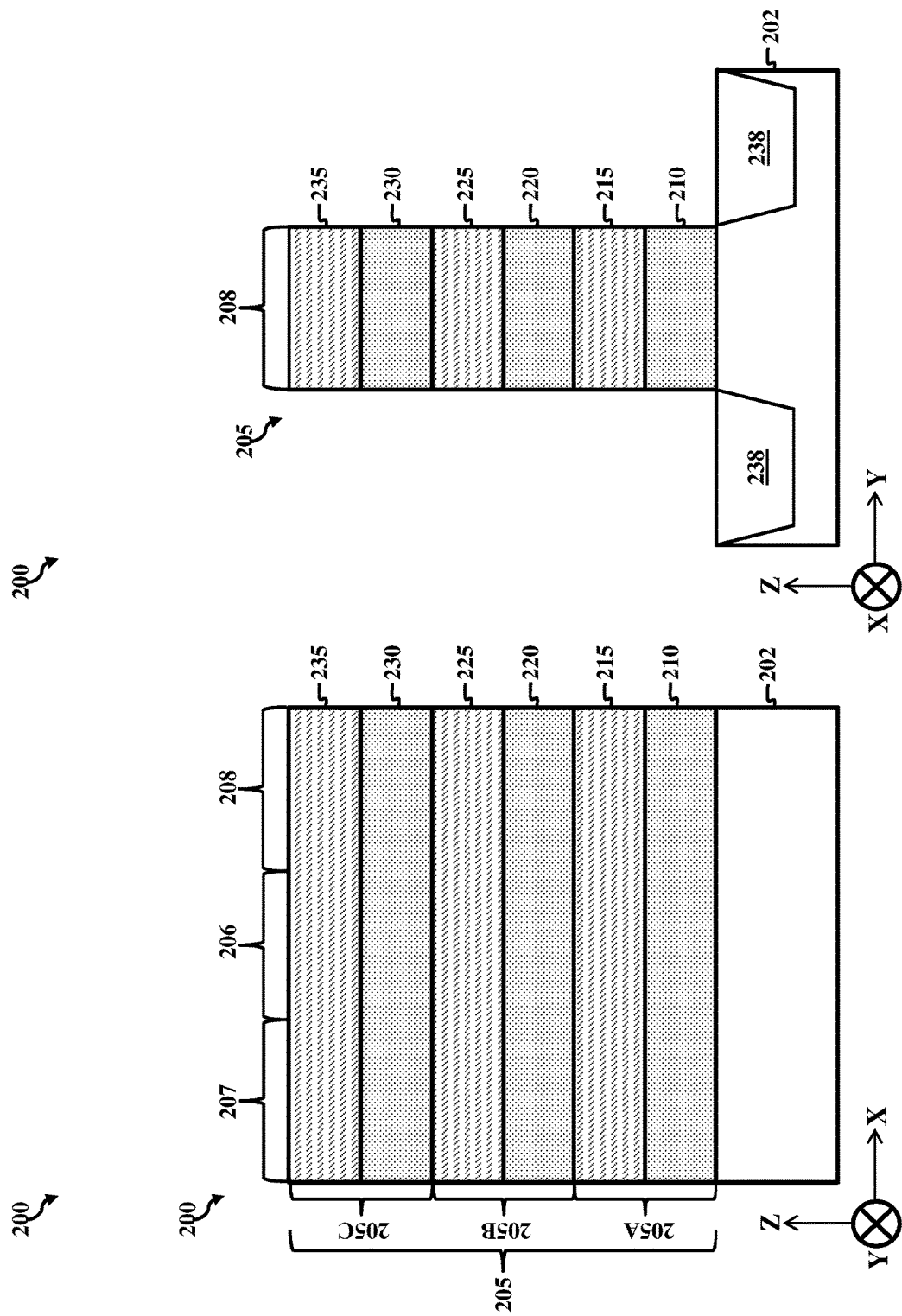

In FIG. 2, FIG. 3A, and FIG. 3B, integrated circuit device 200 includes a substrate (wafer) 202. In the depicted embodiment, substrate 202 includes silicon. Alternatively or additionally, substrate 202 includes another elementary semiconductor, such as germanium; a compound semiconductor, such as silicon carbide, gallium arsenide, gallium phosphide, indium phosphide, indium arsenide, and/or indium antimonide; an alloy semiconductor, such as silicon germanium (SiGe), GaAsP, AlInAs, AlGaAs, GaInAs, GaInP, and/or GaInAsP; or combinations thereof. Alternatively, substrate 202 is a semiconductor-on-insulator substrate, such as a silicon-on-insulator (SOI) substrate, a silicon germanium-on-insulator (SGOI) substrate, or a germanium-on-insulator (GOI) substrate. Semiconductor-on-insulator substrates can be fabricated using separation by implantation of oxygen (SIMOX), wafer bonding, and/or other suitable methods. Substrate 202 can include various doped regions depending on design requirements of integrated circuit device 200. For example, substrate 202 includes p-type doped regions (for example, p-type wells) doped with p-type dopants, such as boron (for example, $BF_2$), indium, other p-type dopant, or combinations thereof. Alternatively or additionally, substrate 202 includes n-type doped regions (for example, n-type wells) doped with n-type dopants, such as phosphorus, arsenic, other n-type dopant, or combinations thereof. In some implementations, substrate 202 includes doped regions formed with a combination of p-type dopants and n-type dopants. The various doped regions can be formed directly on and/or in substrate 202, for example, providing a p-well structure, an n-well structure, a dual-well structure, a raised structure, or combinations thereof. An ion implantation process, a diffusion process, and/or other suitable doping process can be performed to form the various doped regions.

A heterostructure 205 is disposed over substrate 202. In FIG. 2, FIG. 3A, and FIG. 3B, heterostructure 205 (also referred to as a fin and/or a fin structure) extends along an x-direction, having a length defined in the x-direction, a width defined in a y-direction, and a height defined in a z-direction. A channel region 206, a source region 207, and a drain region 208 are defined in heterostructure 205, where channel region 206 (also referred to as a gate region herein) is disposed between source region 207 and drain region 208 (also generally referred to as source/drain regions). The semiconductor layer stack includes various semiconductor layers, such as a semiconductor layer 210, a semiconductor layer 215, a semiconductor layer 220, a semiconductor layer 225, a semiconductor layer 230, and a semiconductor layer 235. Though semiconductor layer 210 is depicted as a separate layer, the present disclosure contemplates embodiments where semiconductor layer 210 is an extension of substrate 202 (for example, where portions of substrate 202 are removed to form semiconductor layer 210 extending from substrate 202). The semiconductor layers include any suitable material, such as silicon, germanium, silicon germanium, other suitable material, or combinations thereof. The semiconductor layers can include same or different materials, etching rates, constituent atomic percentages, constituent weight percentages, thicknesses (heights), and/or configurations depending on design requirements of integrated circuit device 200. In some implementations, the semiconductor layer stack includes at least one semiconductor layer pair having a first semiconductor layer and a second semiconductor layer disposed over the first semiconductor layer, where the second semiconductor layer is different than the first semiconductor layer. For example, in the depicted embodiment, heterostructure 205 includes a semiconductor layer pair 205A that includes semiconductor layer 210 and semiconductor layer 215, a semiconductor layer pair 205B that includes semiconductor layer 220 and semiconductor layer 225, and a semiconductor layer pair 205C that includes semiconductor layer 230 and semiconductor layer 235. In some implementations, semiconductor layer 210, semiconductor layer 220, and semiconductor layer 230 include a same material, while semiconductor layer 215, semiconductor layer 225, and semiconductor layer 235 include a same material that is different than the material of semiconductor layer 210, semiconductor layer 220, and semiconductor layer 230. The present disclosure contemplates embodiments where the semiconductor layer stack includes more or less semiconductor layers, semiconductor layer pairs, and/or configurations depending on design requirements of integrated circuit device 200.

In some implementations, the semiconductor layer stack includes semiconductor layers including materials with different etch rates. For example, semiconductor layer 210, semiconductor layer 220, and semiconductor layer 230 include a material having a first etch rate, and semiconductor layer 215, semiconductor layer 225, and semiconductor layer 235 include a material having a second etch rate. The material of semiconductor layer 210, semiconductor layer 220, and semiconductor layer 230 may exhibit a high etch rate relative to the material of semiconductor layer 215, semiconductor layer 225, and semiconductor layer 235, or vice versa. In some implementations, the semiconductor layer stack includes alternating semiconductor layers, such as semiconductor layers composed of a first material and semiconductor layers composed of a second material. For example, heterostructure 205 can include a semiconductor layer stack that alternates silicon layers and silicon germanium layers (for example, SiGe/Si/SiGe/Si/SiGe/Si from a bottom to a top of heterostructure 205). In such implementations, semiconductor layer 210, semiconductor layer 220, and semiconductor layer 230 include silicon germanium, and semiconductor layer 215, semiconductor layer 225, and semiconductor layer 235 include silicon. In some implementations, the semiconductor layer stack includes semiconductor layers of the same material but with alternating constituent atomic percentages, such as semiconductor layers having a constituent of a first atomic percent and semiconductor layers having the constituent of a second atomic percent. For example, heterostructure 205 can include a semiconductor layer stack that includes silicon germanium layers having alternating silicon atomic percentages and/or germanium atomic percentages (for example, $Si_aGe_b/Si_xGe_y/Si_aGe_b/Si_xGe_y/Si_aGe_b/Si_xGe_y$ from a bottom to a top of heterostructure 205, where a is an atomic percentage of silicon, b is an atomic percentage of germanium, x is an atomic percentage of silicon, and y is an atomic percentage of germanium). In such implementations, semiconductor layer 210, semiconductor layer 220, and semiconductor layer 230 are silicon germanium layers having a first silicon atomic percentage and/or a first germanium atomic percentage, and semiconductor layer 215, semiconductor layer 225, and semiconductor layer 235 are silicon germanium layers having a second silicon atomic percentage and/or a second germanium atomic percentage that is different than the first silicon atomic percentage and/or first germanium atomic percentage. In some implementations, a germanium atomic percentage of semiconductor layer 210, semiconductor layer 220, and semiconductor layer 230 ranges from about 20% to about 60%, while a germanium atomic percentage of semiconductor layer 215, semiconductor layer 225, and semiconductor layer 235 ranges from about 0% to about 30%. In some implementations, a silicon atomic percentage of semiconductor layer 210, semiconductor layer 220, and semiconductor layer 230 ranges from about 40% to about 80%, while a silicon atomic percentage of semiconductor layer 215, semiconductor layer 225, and semiconductor layer 235 ranges from about 70% to about 100%. For example, semiconductor layer 210, semiconductor layer 220, and semiconductor layer 230 have a silicon atomic percentage of about 50% and a germanium atomic percentage of about 50%, while semiconductor layer 215, semiconductor layer 225, and semiconductor layer 235 have a silicon atomic percentage of about 80% and a germanium atomic percentage of about 20%.

Heterostructure 205 is formed over substrate 202 using any suitable process. In some implementations, semiconductor layer 210 is epitaxially grown on substrate 202, semiconductor layer 215 is epitaxially grown on semiconductor layer 210, semiconductor layer 220 is epitaxially grown on semiconductor layer 215, semiconductor layer 225 is epitaxially grown on semiconductor layer 220, semiconductor layer 230 is epitaxially grown on semiconductor layer 225, and semiconductor layer 235 is epitaxially grown on semiconductor layer 230. An epitaxy process can use chemical vapor deposition (CVD) deposition techniques (for example, vapor-phase epitaxy (VPE) and/or ultra-high vacuum CVD (UHV-CVD)), molecular beam epitaxy, other suitable epitaxial growth processes, or combinations thereof. In some implementations, a lithography and/or etching process is performed to form the fin-like structure of heterostructure 205, such that heterostructure 205 extends from substrate 202. The lithography process can include forming a resist layer over heterostructure 205 (for example, by spin coating), performing a pre-exposure baking process, performing an exposure process using a mask, performing a post-exposure baking process, and performing a developing process. During the exposure process, the resist layer is exposed to radiation energy (such as ultraviolet (UV) light, deep UV (DUV) light, or extreme UV (EUV) light), where the mask blocks, transmits, and/or reflects radiation to the resist layer depending on a mask pattern of the mask and/or mask type (for example, binary mask, phase shift mask, or EUV mask), such that an image is projected onto the resist layer that corresponds with the mask pattern. Since the resist layer is sensitive to radiation energy, exposed portions of the resist layer chemically change, and exposed (or non-exposed) portions of the resist layer are dissolved during the developing process depending on characteristics of the resist layer and characteristics of a developing solution used in the developing process. After development, the patterned resist layer includes a resist pattern that corresponds with the mask. The etching process removes portions of heterostructure 205 using the patterned resist layer as an etch mask. The etching process can include a dry etching process, a wet etching process, other suitable etching process, or combinations thereof. In some implementations, a reactive ion etching (RIE) process is performed. After the etching process, the patterned resist layer is removed, for example, by a resist stripping process. Alternatively, heterostructure 205 is formed by a multiple patterning process, such as a double patterning lithography (DPL) process (for example, a lithography-etch-lithography-etch (LELE) process, a self-aligned double patterning (SADP) process, a spacer-is-dielectric (SID) SADP process, other double patterning process, or combinations thereof), a triple patterning process (for example, a lithography-etch-lithography-etch-lithography-etch (LELELE) process, a self-aligned triple patterning (SATP) process, other triple patterning process, or combinations thereof), other multiple patterning process (for example, self-aligned quadruple patterning (SAQP) process), or combinations thereof. In some implementations, directed self-assembly (DSA) techniques are implemented while forming heterostructure 205. Further, in some alternate implementations, the exposure process can implement maskless lithography, electron-beam (e-beam) writing, ion-beam writing, and/or nanoimprint technology for patterning the resist layer.

An isolation feature(s) 238 is formed over and/or in substrate 202 to isolate various regions, such as various device regions, of integrated circuit device 200. For example, isolation features 238 separate and isolate heterostructure (fin structure) 205 from other heterostructures (not shown) formed over substrate 202. Isolation features 238 include silicon oxide, silicon nitride, silicon oxynitride, other suitable isolation material (for example, including silicon, oxygen, nitrogen, carbon, or other suitable isolation constituent), or combinations thereof. Isolation features 238 can include different structures, such as shallow trench isolation (STI) structures, deep trench isolation (DTI) structures, and/or local oxidation of silicon (LOCOS) structures. For example, isolation features 238 can include STI features that define and electrically isolate heterostructure 205 from other active device regions (such as other heterostructures) and/or passive device regions. For example, STI features can be formed by etching a trench in substrate 202 (for example, by using a dry etching process and/or a wet etching process) and filling the trench with insulator material (for example, by using a CVD process or a spin-on glass process). A chemical mechanical polishing (CMP) process may be performed to remove excessive insulator material and/or planarize a top surface of isolation features 238. In another example, STI features can be formed by depositing an insulator material over substrate 202 after forming heterostructure 205 (in some implementations, such that the insulator material layer fills gaps (trenches) between heterostructures) and etching back the insulator material layer to form isolation features 238. In some embodiments, STI features include a multi-layer structure that fills the trenches, such as a silicon nitride containing layer disposed over a thermal oxide containing liner layer. In another example, STI features include a dielectric layer disposed over a doped liner layer (including, for example, boron silicate glass (BSG) or phosphosilicate glass (PSG)). In yet another example, STI features include a bulk dielectric layer disposed over a liner dielectric layer, where the bulk dielectric layer and the liner dielectric layer include materials depending on design requirements.

Turning to FIG. 4A and FIG. 4B, a gate structure 240 is formed over heterostructure 205. Gate structure 240 includes a dummy gate stack (represented by a dummy gate electrode 242, and in some implementations, a dummy gate dielectric) and gate spacers 244. Gate structure 240 wraps a portion of heterostructure 205 in the Y-Z plane (not shown), particularly wrapping a portion of channel region 206. In the X-Z plane, gate structure 240 is disposed over channel region 206, interposing source region 207 and drain region 208. Dummy gate electrode 242 includes a suitable dummy gate material, such as polysilicon. In implementations where the dummy gate stack includes a dummy gate dielectric disposed between dummy gate electrode 242 and heterostructure 205, the dummy gate dielectric includes a dielectric material, such as silicon oxide, a high-k dielectric material, other suitable dielectric material, or combinations thereof. Examples of high-k dielectric material include $HfO_2$, HfSiO, HfSiON, HfTaO, HfTiO, HfZrO, zirconium oxide, aluminum oxide, hafnium dioxide-alumina ($HfO_2$—$Al_2O_3$) alloy, other suitable high-k dielectric materials, or combinations thereof. The dummy gate stack can include numerous other layers, for example, capping layers, interface layers, diffusion layers, barrier layers, hard mask layers, or combinations thereof. In some implementations, the dummy gate stack further includes an interfacial layer (including, for example, silicon oxide) disposed between dummy gate electrode 242 and heterostructure 205 (for example, between dummy gate electrode 242 and a dummy gate dielectric). In some implementations, a capping layer (including, for example, titanium and nitrogen (such as a TiN capping layer)) can be disposed between dummy gate electrode 242 and heterostructure 205.

Gate structure 240 is formed by deposition processes, lithography processes, etching processes, other suitable processes, or combinations thereof. For example, a deposition process is performed to form a dummy gate electrode layer over substrate 202, particularly over heterostructure 205 and isolation features 238. In some implementations, a deposition process is performed to form a dummy gate dielectric layer over heterostructure 205 before forming the dummy gate electrode layer, where the dummy gate electrode layer is formed over the dummy gate dielectric layer. The deposition process includes CVD, physical vapor deposition (PVD), atomic layer deposition (ALD), high density plasma CVD (HDPCVD), metal organic CVD (MOCVD), remote plasma CVD (RPCVD), plasma enhanced CVD (PECVD), low-pressure CVD (LPCVD), atomic layer CVD (ALCVD), atmospheric pressure CVD (APCVD), plating, other suitable methods, or combinations thereof. A lithography patterning and etching process is then performed to pattern the dummy gate electrode layer (and, in some implementations, the dummy gate dielectric layer) to form the dummy gate stack, such that the dummy gate stack (including dummy gate electrode 242, dummy gate dielectric, and/or other suitable layers) wraps a portion of channel region 206. The lithography patterning processes include resist coating (for example, spin-on coating), soft baking, mask aligning, exposure, post-exposure baking, developing the resist, rinsing, drying (for example, hard baking), other suitable processes, or combinations thereof. Alternatively, the lithography exposing process is assisted, implemented, or replaced by other methods, such as maskless lithography, electron-beam writing, or ion-beam writing. In yet another alternative, the lithography patterning process implements nanoimprint technology. The etching processes include dry etching processes, wet etching processes, other etching methods, or combinations thereof.

Gate spacers 244 are formed adjacent to the dummy gate stack of gate structure 240. For example, gate spacers 244 are disposed adjacent to (for example, along sidewalls of) dummy gate electrode 242. Gate spacers 244 are formed by any suitable process and include a dielectric material. The dielectric material can include silicon, oxygen, carbon, nitrogen, other suitable material, or combinations thereof (for example, silicon oxide, silicon nitride, silicon oxynitride, or silicon carbide). For example, in the depicted embodiment, a dielectric layer including silicon and nitrogen, such as a silicon nitride layer, can be deposited over heterostructure 205 and subsequently anisotropically etched to form gate spacers 244. In some implementations, gate spacers 244 include a multi-layer structure, such as a first dielectric layer that includes silicon nitride and a second dielectric layer that includes silicon oxide. In some implementations, more than one set of spacers, such as seal spacers, offset spacers, sacrificial spacers, dummy spacers, and/or main spacers, are formed adjacent to the dummy gate stack. In such implementations, the various sets of spacers can include materials having different etch rates. For example, a first dielectric layer including silicon and oxygen (for example, silicon oxide) can be deposited over heterostructure 205 and subsequently anisotropically etched to form a first spacer set adjacent to the dummy gate stack, and a second dielectric layer including silicon and nitrogen (for example, silicon nitride) can be deposited over heterostructure 205 and subsequently anisotropically etched to form a second spacer set adjacent to the first spacer set.

Figures 5A, 5B:
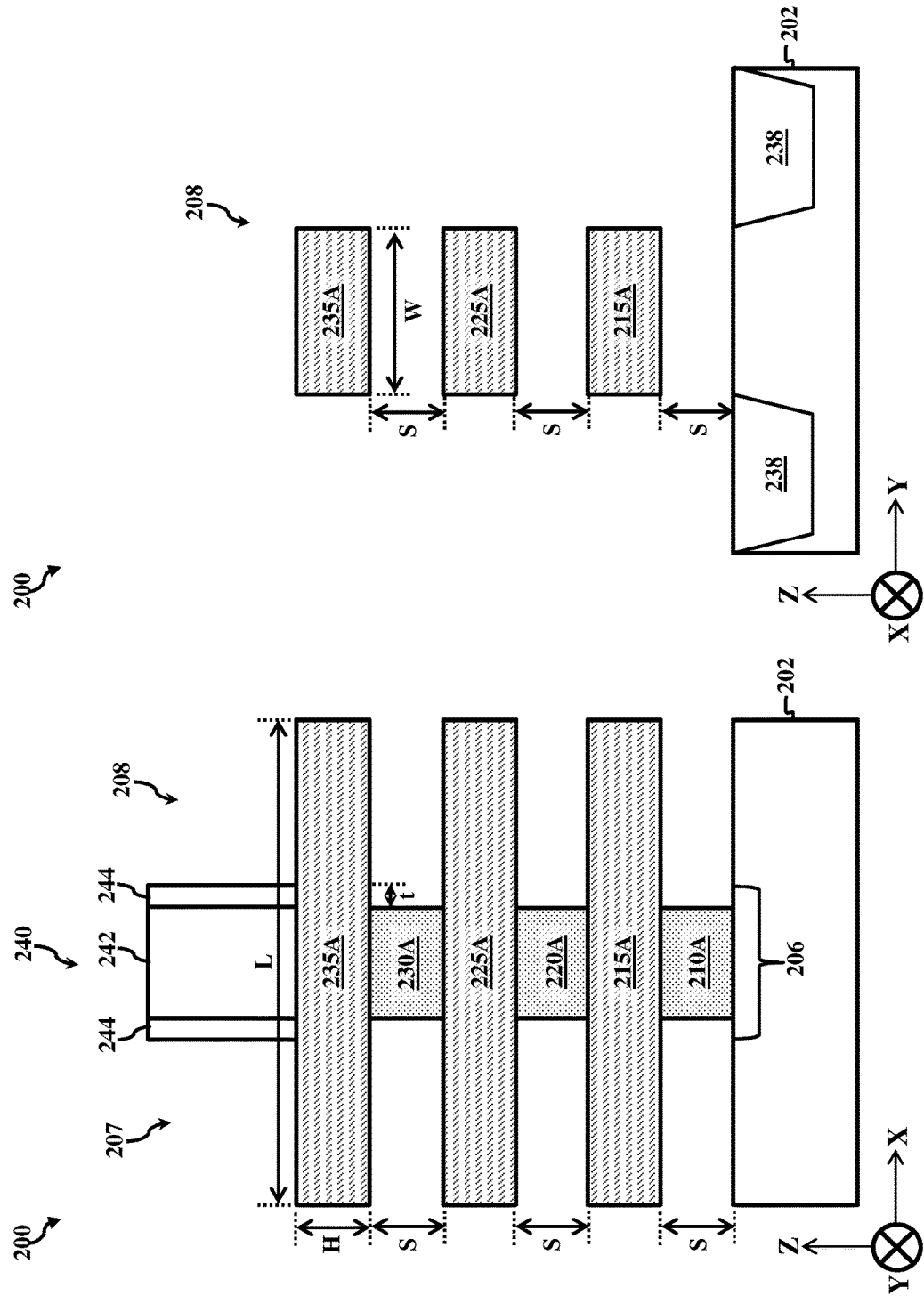

Turning to FIG. 5A and FIG. 5B, portions of heterostructure 205 are selectively removed from source region 207 and drain region 208, thereby partially releasing other portions of heterostructure 205 to form nanowires. Such process is often referred to as a source/drain nanowire release process. For example, semiconductor layer 210, semiconductor layer 220, and semiconductor layer 230 are selectively removed from source region 207 and drain region 208 to release semiconductor layer 215, semiconductor layer 225, and semiconductor layer 235 in source region 207 and drain region 208, thereby forming a nanowire 215A, a nanowire 225A, and a nanowire 235A. Remaining portions of semiconductor layer 210, semiconductor layer 220, and semiconductor layer 230, which are disposed in channel region 206, form a semiconductor island 210A, a semiconductor island 220A, and a semiconductor island 230A. Nanowire 215A, nanowire 225A, and nanowire 235A each have a length (L) extending along the x-direction, a width (W) extending along the y-direction, and a height (H) extending along the z-direction. A nanowire spacing (S) is defined between adjacent nanowires, such as nanowire 225A and nanowire 235A, and/or between a substrate and adjacent nanowire, such as substrate 202 and nanowire 215A. In some implementations, S is about 5 nm to about 10 nm. Though the same nanowire spacing is depicted between adjacent nanowires and/or the substrate and the nanowires, the present disclosure contemplates embodiments with the same and/or different nanowire spacing configurations depending on design requirements.

A portion of semiconductor layer 210, semiconductor layer 220, and semiconductor layer 230 is also removed from channel region 206. For example, a portion of semiconductor layer 210, semiconductor layer 220, and semiconductor layer 230 underlying gate spacers 244 is removed, such that a thickness (t) of semiconductor layer 210, semiconductor layer 220, and semiconductor layer 230 removed in channel region 206 is about equal to a thickness of gate spacers 244. In some implementations, t is about 5 nm to about 10 nm. In some implementations, portions of semiconductor layer 210, semiconductor layer 220, and semiconductor layer 230 are removed from channel region 206, such that a width of semiconductor island 210A, semiconductor island 220A, and semiconductor island 230A is less than a width of gate structure 240 (in some implementations, less than a width of the dummy gate stack, such as dummy gate electrode 242). Though semiconductor island 210A, semiconductor island 220A, semiconductor island 230A, nanowire 215A, nanowire 225A, and nanowire 235A have rectangular shapes, the present disclosure contemplates any configuration, shape, and/or size (including cylindrical, triangular, hexagonal, trapezoidal, or other desired shape) depending on design requirements of integrated circuit device 200.

In some implementations, semiconductor layer 210, semiconductor layer 220, and semiconductor layer 230 are selectively etched in source region 207 and drain region 208 using a dry etching process, a wet etching process, or combination thereof. Where heterostructure 205 alternates between first semiconductor layers and second semiconductor layers having different materials, an etching process selectively removes the first material layers. For example, due to a high etch rate of the material of semiconductor layer 210, semiconductor layer 220, and semiconductor layer 230 relative to the material of semiconductor layer 215, semiconductor layer 225, and semiconductor layer 235, the etching process can remove portions of semiconductor layer 210, semiconductor layer 220, and semiconductor layer 230 while eliminating (or minimizing) removal of semiconductor layer 215, semiconductor layer 225, and semiconductor layer 235. Various etching parameters can be tuned to selectively etch semiconductor layer 210, semiconductor layer 220, and semiconductor layer 230, such as etchant composition, etching temperature, etching solution concentration, etching time, etching pressure, source power, RF bias voltage, RF bias power, etchant flow rate, other suitable etching parameters, or combinations thereof. In some implementations, semiconductor layer 210, semiconductor layer 220, and semiconductor layer 230 are etched using etch reactants having a high etch selectivity with respect to the material of semiconductor layer 210, semiconductor layer 220, and semiconductor layer 230. For example, in some implementations, a dry etching process (such as a reactive ion etching (RIE) process) utilizing a fluorine-containing gas (for example, $SF_6$) can selectively etch semiconductor layer 210, semiconductor layer 220, and semiconductor layer 230. In some implementations, a ratio of the fluorine-containing gas to an oxygen-containing gas (for example, $O_2$), an etching temperature (for example, above or below about 80° C.), and/or an RF power may be tuned to selectively etch silicon germanium or silicon. In another example, in some implementations, a wet etching process utilizing an etching solution that includes $NH_4OH$ and $H_2O$ can selectively etch semiconductor layer 210, semiconductor layer 220, and semiconductor layer 230. In some implementations, a chemical vapor phase etching process using hydrogen chloride (HCl) can selectively etch semiconductor layer 210, semiconductor layer 220, and semiconductor layer 230.

Turning to FIG. 6A and FIG. 6B, a nanowire spacer layer 250 is formed over substrate 202, particularly over heterostructure 205 and gate structure 240, by any suitable process, such as a deposition process (for example, CVD, PVD, ALD, HDPCVD, MOCVD, RPCVD, PECVD, LPCVD, ALCVD, APCVD, plating, other suitable methods, or combinations thereof). In the depicted embodiment, nanowire spacer layer 250 surrounds nanowire 215A, nanowire 225A, and nanowire 235A in source region 207 and drain region 208, filling nanowire spacing (S) adjacent to the nanowires. Though nanowire spacer layer 250 includes a single layer in the depicted embodiment, the present disclosure contemplates embodiments where nanowire spacer layer 250 includes multiple layers, as described further below. Nanowire spacer layer 250 includes a material different than the nanowires and the semiconductor islands of integrated circuit device 200 (here, semiconductor island 210A, semiconductor island 220A, and semiconductor islands 230A). In particular, nanowire spacer layer 250 includes a material having a different etch rate than materials of the nanowires and the semiconductor islands. For example, nanowire spacer layer 250 includes a material to achieve etch selectivity of the semiconductor islands (here, semiconductor island 210A, semiconductor island 220A, and semiconductor island 230A) to nanowire spacer layer 250, for example, during a subsequent channel nanowire release process. In some implementations, nanowire spacer layer 250 includes a material having a different etching characteristic than a material of gate spacers 244. In some implementations, nanowire spacer layer 250 includes a dielectric material. The dielectric material can include silicon, oxygen, carbon, nitrogen, other suitable material, or combinations thereof (for example, silicon oxide, silicon nitride, silicon oxynitride, silicon carbide, or silicon oxycarbonitride). For purposes of the following description, nanowire spacer layer 250 includes silicon and nitrogen (for example, silicon nitride). In some implementations, nanowire spacer layer 250 includes a low-k dielectric material. Exemplary low-k dielectric materials include fluorinated silica glass (FSG), carbon doped silicon oxide, Black Diamond® (Applied Materials of Santa Clara, Calif.), Xerogel, Aerogel, amorphous fluorinated carbon, Parylene, BCB (bis-benzocyclobutenes), SiLK (Dow Chemical, Midland, Mich.), polyimide, other low-k dielectric materials, or combinations thereof. In some implementations, dopants (for example, p-type dopants, n-type dopants, or combinations thereof) are introduced into the dielectric material, such that nanowire spacer layer 250 includes a doped dielectric material. Doping the dielectric material can improve a profile of a junction between source region 207 (and/or drain region 208) and channel region 206, which can improve performance of integrated circuit device 200. An ion implantation process, a diffusion process (for example, a solid phase diffusion (SPD) process), and/or other suitable doping process can be performed to introduce dopants into the dielectric material.

Turning to FIG. 7A and FIG. 7B, a patterning process is performed on nanowire spacer layer 250 to form nanowire spacers. For example, nanowire spacer layer 250 is selectively removed to expose sidewalls of nanowire 215A, nanowire 225A, and nanowire 235A, such as sidewalls 252 (between which length L of the nanowires is defined) and sidewalls 254 (between which width W is defined). In the depicted embodiment, nanowire spacer layer 250 remaining in source region 207 and drain region 208 completely fills spaces (defined by nanowire spacing S) between nanowire 215A, nanowire 225A, nanowire 235A, and/or substrate 202, though the present disclosure contemplates implementations where nanowire spacer layer 250 is partially removed between nanowire 215A, nanowire 225A, nanowire 235A, and/or substrate 202, such that the nanowire spacer layer 250 includes spaces (or voids defined therein). Nanowire spacer layer 250 is also removed from gate structure 240, such as dummy gate electrode 242 and gate spacers 244, where a thickness of nanowire spacer layer 250 remaining over nanowire 235A is reduced during the patterning process. In some implementations, an etching process selectively removes portions of nanowire spacer layer 250 while eliminating (or minimizing) removal of gate structure 240 (including gate spacers 244) and the nanowires. Various etching parameters can be tuned to selectively etch nanowire spacer layer 250, such as etchant composition, etching temperature, etching solution concentration, etching time, etching pressure, source power, RF bias voltage, RF bias power, etchant flow rate, other suitable etching parameters, or combinations thereof. In some implementations, nanowire spacer layer 250 is etched using etch reactants having a high etch selectivity with respect to the material of nanowire spacer layer 250. For example, where nanowire spacer layer 250 includes silicon nitride and the nanowires include silicon, etch reactants and/or etch solutions of the etching process are selected to ensure high etch selectivity to silicon nitride with minimal (to no) etching of silicon. In such implementations, a wet etching process using a phosphoric acid solution can selectively etch nanowire spacer layer 250 with minimal (to no) etching of the nanowires.

Nanowire spacer layer 250 thus remains in source region 207 and drain region 208, forming a nanowire spacer 250A (between substrate 202 and nanowire 215A), a nanowire spacer 250B (between nanowire 215A and nanowire 225A), a nanowire spacer 250C (between nanowire 225A and nanowire 235A), and a nanowire spacer 250D (over nanowire 235A). Nanowire spacers 250A-250C span source region 207, drain region 208, and a portion of channel region 206 (in the depicted embodiment, a portion of channel region 206 underlying gate spacers 244), whereas nanowire spacer 250D spans source region 207 and drain region 208. In the depicted embodiment, nanowire spacers 250A-250D do not extend (or negligibly extend) beyond nanowire 215A, nanowire 225A, and nanowire 235A along the x-direction and the y-direction, ensuring that nanowire 215A, nanowire 225A, and nanowire 235A are sufficiently exposed for forming subsequent source/drain features. For example, nanowire spacers 250A-250D each have a width ($W_1$) extending along the y-direction that is substantially equal to width W of the nanowires (in other words, $W_1 \approx W$). In some implementations, $W_1 \approx W$ when $W_1$ and W are within ±5% of each other. In furtherance of the depicted embodiment, nanowire spacers 250A-250D have sidewalls that substantially align with sidewalls 252 and sidewalls that substantially align with sidewalls 254. In some implementations, the sidewalls are considered substantially aligned when any shift (for example, $\Delta x$ or $\Delta y$) between sidewalls of nanowire spacers 250A-250D and sidewalls 252 or sidewalls 254 is less than about 2 nm.

Figures 8A, 8B:
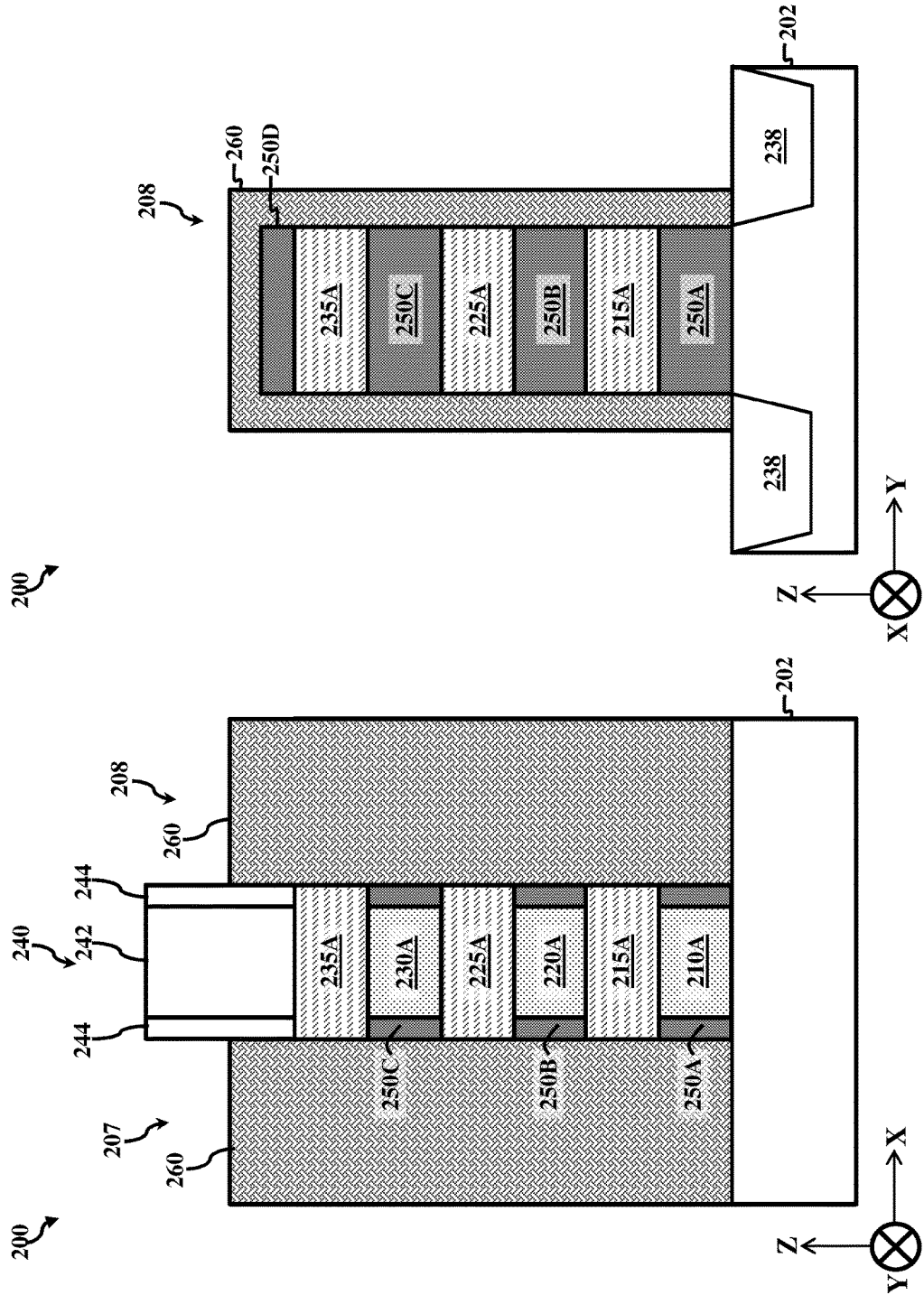

Turning to FIG. 8A and FIG. 8B, epitaxial source features and epitaxial drain features (referred to as epitaxial source/drain features) are formed in source/drain regions of heterostructure 205. For example, a semiconductor material is epitaxially grown on exposed portions of heterostructure 205, forming epitaxial source/drain features 260. In the depicted embodiment, epitaxial source/drain features 260 wrap heterostructure 205 in source region 207 and drain region 208. As depicted in FIG. 8A, a portion of nanowire spacers 250A-250C in channel region 206 is not covered by epitaxial source/drain features 260. An epitaxy process can use CVD deposition techniques (for example, VPE and/or UHV-CVD), molecular beam epitaxy, other suitable epitaxial growth processes, or combinations thereof. The epitaxy process can use gaseous and/or liquid precursors, which interact with the composition of heterostructure 205 (in particular, nanowire 215A, nanowire 225A, and nanowire 235A). Epitaxial source/drain features 260 are doped with n-type dopants and/or p-type dopants. In some implementations, where integrated circuit device 200 is configured as an n-type device (for example, having an n-channel), epitaxial source/drain features 260 are epitaxial layers including silicon and/or carbon, where silicon containing epitaxial layers or silicon carbon containing epitaxial layers are doped with phosphorous, other n-type dopant, or combinations thereof (for example, forming a Si:P epitaxial layer or a Si:C:P epitaxial layer). In some implementations, where integrated circuit device 200 is configured as a p-type device (for example, having a p-channel), epitaxial source/drain features 260 are epitaxial layers including silicon and germanium, where the silicon germanium containing epitaxial layers are doped with boron, other p-type dopant, or combinations thereof (for example, forming a Si:Ge:B epitaxial layer). In some implementations, epitaxial source/drain features 260 include materials and/or dopants that achieve desired tensile stress and/or compressive stress in channel region 206. In some implementations, epitaxial source/drain features 260 are doped during deposition by adding impurities to a source material of the epitaxy process. In some implementations, epitaxial source/drain features 260 are doped by an ion implantation process subsequent to a deposition process. In some implementations, annealing processes are performed to activate dopants in epitaxial source/drain features 260 and/or other source/drain regions of integrated circuit device 200 (for example, heavily doped source/drain regions and/or lightly doped source/drain (LDD) regions formed in the nanowires and/or epitaxial source/drain features 260).

Turning to FIG. 9A and FIG. 9B, an inter-level dielectric (ILD) layer 270 is formed over substrate 202, for example, by a deposition process (such as CVD, PVD, ALD, HDP-CVD, MOCVD, RPCVD, PECVD, LPCVD, ALCVD, APCVD, plating, other suitable methods, or combinations thereof). In the depicted embodiment, ILD layer 270 is disposed on epitaxial source/drain features 260. ILD layer 270 includes a dielectric material including, for example, silicon oxide, silicon nitride, silicon oxynitride, TEOS formed oxide, PSG, BPSG, low-k dielectric material, other suitable dielectric material, or combinations thereof. Exemplary low-k dielectric materials include FSG, carbon doped silicon oxide, Black Diamond® (Applied Materials of Santa Clara, Calif.), Xerogel, Aerogel, amorphous fluorinated carbon, Parylene, BCB, SILK (Dow Chemical, Midland, Mich.), polyimide, other low-k dielectric material, or combinations thereof. In the depicted embodiment, ILD layer 270 is a dielectric layer that includes a low-k dielectric material (generally referred to as a low-k dielectric layer). ILD layer 270 can include a multilayer structure having multiple dielectric materials. For example, in some implementations, ILD layer 270 includes a contact etch stop layer (CESL) disposed over substrate 202 and an ILD layer disposed over the CESL. Subsequent to the deposition of ILD layer 270, a CMP process may be performed, such that a top portion of gate structure 240 is exposed, such as a top portion (or top surface) of dummy gate electrode 242.

Turning to FIG. 10A and FIG. 10B, a portion of gate structure 240 is removed to expose portions of heterostructure 205. For example, an etching process selectively removes the dummy gate stack of gate structure 240 (here, dummy gate electrode 242 and/or dummy gate dielectric), thereby forming an opening (trench) 275 that exposes a portion of channel region 206 of heterostructure 205. As depicted in FIG. 10A, nanowire 235A, semiconductor island 230A, nanowire 225A, semiconductor island 220A, nanowire 215A, and semiconductor island 210A are exposed in channel region 206 after removing dummy gate electrode 242. The etching process is a dry etching process, a wet etching process, or combinations thereof. The etching process can be tuned as described herein, such that dummy gate electrode 242 is removed without (or minimally) etching other features of integrated circuit device 200, such as ILD layer 270, gate spacers 244, the nanowires, and/or the semiconductor islands.

Turning to FIG. 11A and FIG. 11B, portions of heterostructure 205 are removed from channel region 206. For example, semiconductor island 210A, semiconductor island 220A, and semiconductor island 230A are selectively removed from channel region 206, thereby releasing nanowire 215A, nanowire 225A, and nanowire 235A in channel region 206. Such process is often referred to as a channel nanowire release process. In some implementations, semiconductor island 210A, semiconductor island 220A, and semiconductor island 230A are selectively etched in channel region 206 using a dry etching process, a wet etching process, or combinations thereof. For example, due to a high etch rate of the material of semiconductor island 210A, semiconductor island 220A, and semiconductor island 230A relative to the material of nanowire 215A, nanowire 225A, and nanowire 235A, the etching process can remove semiconductor island 210A, semiconductor island 220A, and semiconductor island 230A without (or minimally) removing nanowire 215A, nanowire 225A, and nanowire 235A. Various etching parameters can be tuned to selectively etch semiconductor island 210A, semiconductor island 220A, and semiconductor island 230A, such as etchant composition, etching temperature, etching solution concentration, etching time, etching pressure, source power, RF bias voltage, RF bias power, etchant flow rate, other suitable etching parameters, or combinations thereof. In some implementations, semiconductor island 210A, semiconductor island 220A, and semiconductor island 230A are etched using etch reactants having a high etch selectivity with respect to the material of semiconductor island 210A, semiconductor island 220A, and semiconductor island 230A. For example, in some implementations, a dry etching process (such as a RIE process) utilizing a fluorine-containing gas (for example, $SF_6$) can selectively etch semiconductor island 210A, semiconductor island 220A, and semiconductor island 230A. In some implementations, a ratio of the fluorine-containing gas to an oxygen-containing gas (for example, $O_2$), an etching temperature (for example, above or below about 80° C.), and/or an RF power may be tuned to selectively etch silicon germanium or silicon. In another example, in some implementations, a wet etching process utilizing an etching solution that includes $NH_4OH$ and $H_2O$ can selectively etch semiconductor island 210A, semiconductor island 220A, and semiconductor island 230A. In some implementations, a chemical vapor phase etching process using HCl can selectively etch semiconductor island 210A, semiconductor island 220A, and semiconductor island 230A.

Controlling lateral etching of the etching process (in the depicted embodiment, along the x-direction) is very difficult. This can lead to unintended removal of source/drain features in the source region and the drain region of an integrated circuit device, such as source region 207 and drain region 208. For example, conventional nanowire fabrication techniques do not form nanowire spacers, such as nanowire spacers 250A-250D, in the source region and the drain region (which, in some implementations, extend into the channel region) adjacent to the semiconductor islands. Instead, source/drain material fills the spaces between the nanowires. For example, epitaxial source/drain features 260 would typically fill the spaces between nanowire 215A, nanowire 225A, nanowire 235A, and/or substrate 202. However, because current etching techniques lack adequate lateral etch control, the etching process used to remove the semiconductor islands (such as semiconductor island 210A, semiconductor island 220A, and semiconductor island 230A) from the channel region often unintentionally etches (partially or fully) source/drain material during the nanowire channel release process. Source/drain features in an integrated circuit device fabricated according to conventional nanowire fabrication techniques thus often have voids, in particular, areas of the source/drain features where source/drain material is missing. Insufficient etch selectivity between material of the semiconductor islands and material of the source/drain material further exacerbates such issues. For example, tuning etching parameters to eliminate (or minimize) any etching of the source/drain material may result in an etching process that does not adequately etch the material of the semiconductor islands in the channel region, such that the etching process fails to completely release the nanowires in the channel region.

The present disclosure overcomes such challenges by forming nanowire spacers 250A-250D in source region 207 and drain region 208. For example, nanowire spacers 250A-250C function as etch stop layers, preventing lateral etching into source region 207 and drain region 208 during the channel nanowire release process. Nanowire spacers 250A-250C thus prevent lateral etching of epitaxial source/drain features 260, such that epitaxial source/drain features 260 are free of voids (resulting from missing epitaxial source/drain material). In the depicted embodiment, extending nanowire spacers 250A-250C into channel region 206, such as under gate spacers 244, enables more flexibility to the etching process used during the channel nanowire release process. For example, unintentional etching of source/drain material can still be avoided even where the etching process slightly etches the nanowire spacers 250A-250C, increasing etching process windows for the channel nanowire release process. Further, leaving nanowire spacers 250A-250C spanning source region 207 and drain region 208, instead of patterning nanowire spacer layer 250 to achieve nanowire spacers 250A-250C that do not (or only minimally) extend into source region 207 and drain region 208, also significantly eases IC fabrication complexity and costs. For example, patterning nanowire spacer layer 250 to form nanowire spacers 250A-250C only in channel region 206 underlying gate spacers 244 introduces complexities into the etching process that requires tradeoffs between achieving an ideal shape of nanowire spacers 250A-250C and ensuring that no residue from nanowire spacer layer 250 remains on the nanowires. More specifically, tuning the etching process to adequately remove nanowire spacer layer 250 from nanowire 215A, nanowire 225A, and nanowire 235A often results in over etching of nanowire spacer layer 250, such that nanowire spacers 250A-250C cannot provide adequate lateral etch control. On the other hand, tuning the etching process to achieve nanowire spacers 250A-250C that do not (or only minimally) extend into source region 207 and drain region 208 often results in under etching of nanowire spacer layer 250 on surfaces of nanowire 215A, nanowire 225A, and nanowire 235A, such that residue, such as a dielectric residue, remains on the nanowires. Different embodiments may have different advantages, and no particular advantage is necessarily required of any embodiment.

Alternatively, in implementations where integrated circuit device 200 is configured for a memory device, the etching process can be tuned to partially remove semiconductor island 210A, semiconductor island 220A, and semiconductor island 230A, thereby forming nanocrystals in channel region 206. In some implementations, a width of the nanocrystals is less than a width of opening 275 (or dummy gate electrode 242). In furtherance of such implementations, a tunnel oxide layer is formed surrounding the nanocrystals, thereby forming nanocrystal floating gates (also referred to as charge storing nanocrystals) that can store electrical charge (electrons or holes). For example, a thermal oxidation process is performed on the nanocrystals (portions of semiconductor island 210A, semiconductor island 220A, and semiconductor island 230A remaining after the channel nanowire release process), nanowire 215A, nanowire 225A, and nanowire 235A. An oxidation rate of the nanocrystals (in some implementations, including silicon germanium) is higher than an oxidation rate of the nanowires (in some implementations, including silicon), such that greater portions of the nanocrystals are consumed during the thermal oxidation process. A thickness of an oxide layer formed on the nanocrystals is thus greater than a thickness of an oxide layer formed on the nanowires. The oxide layer on the nanowires is subsequently removed, for example, using an etching process, such that the nanocrystals (which are remaining portions of semiconductor island 210A, semiconductor island 220A, and semiconductor island 230A after various processing, such as the described etching and oxidation process) are surrounded by tunnel oxide layers. In some implementations, a wet etching process is tuned (for example, by controlling etching time) to ensure that the oxide layer is sufficiently removed from the nanowires.

Figures 12A, 12B:
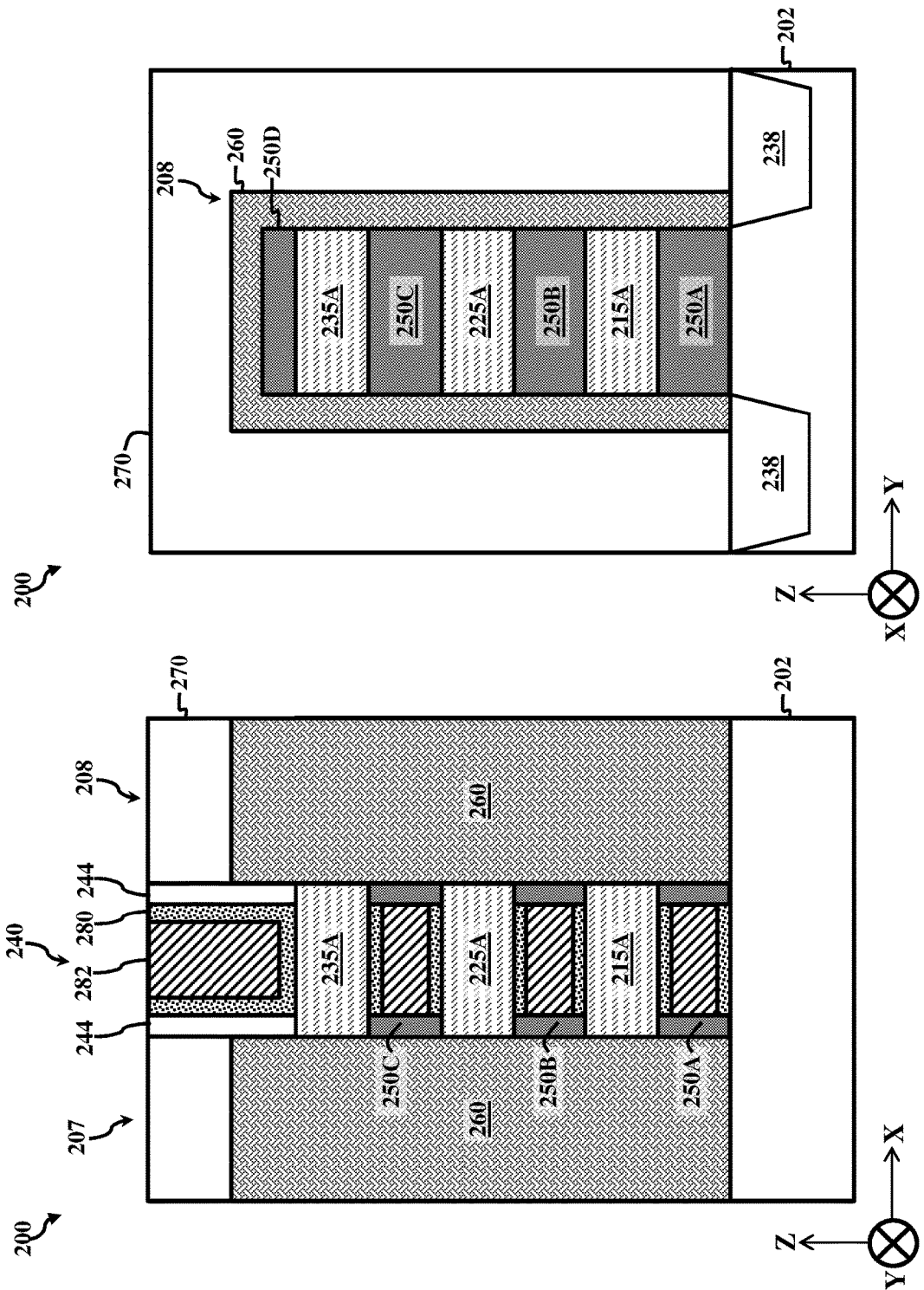

Turning to FIG. 12A and FIG. 12B, a metal gate stack of gate structure 240 is formed in opening (trench) 275. The metal gate stack includes a gate dielectric 280 and a gate electrode 282. The metal gate stack of gate structure 240 may include numerous other layers, for example, capping layers, interface layers, diffusion layers, barrier layers, hard mask layers, or combinations thereof. In FIG. 12A, it is noted that nanowire spacers 250A-250C are disposed between gate electrode 282 and epitaxial source/drain features 260, such that gate electrode 282 does not directly contact source region 207 and drain region 208 (in particular, epitaxial source/drain features 260). It has been observed that gate-to-drain capacitance ($C_{gd}$) significantly increases without an insulating region disposed between gate electrode 282 and source region 207 (and/or drain region 208). Nanowire spacers 250A-250C thus provide an insulating region between gate electrode 282 and source region 207 (and/or drain region 208), significantly decreasing gate-to-drain capacitance of integrated circuit device 200, and thereby improving performance of integrated circuit device 200 (in particular, speed).

Gate dielectric 280 is formed over exposed portions of integrated circuit device 200 in opening 275 by a deposition process, such as an ALD process. For example, gate dielectric 280 conforms to exposed surfaces of opening 275, including exposed surfaces of the nanowires (here, nanowire 215A, nanowire 225A, and nanowire 235A). Gate dielectric 280 includes a dielectric material, which can include silicon, oxygen, high-k dielectric material, other suitable dielectric material, or combinations thereof. Examples of high-k dielectric material include $HfO_2$, HfSiO, HfSiON, HfTaO, HfTiO, HfZrO, zirconium oxide, aluminum oxide, hafnium dioxide-alumina ($HfO_2$—$Al_2O_3$) alloy, other suitable high-k dielectric material, or combinations thereof. In some implementations, gate dielectric 280 includes a high-k dielectric material (and is thus generally referred to as a high-k dielectric layer). In some implementations, gate dielectric 280 includes an interfacial layer (including, for example, silicon and oxygen, such as silicon oxide), and a high-k dielectric layer disposed over the interfacial layer.

Gate electrode 282 is formed over gate dielectric 280 in opening 275 by a deposition process, such as an ALD process. A CMP process can be performed to remove excess gate dielectric layer and/or gate electrode layer, planarizing the metal gate stack. Gate electrode 282 includes a conductive material, such as polysilicon, Al, Cu, Ti, Ta, W, Mo, TaN, NiSi, CoSi, TiN, WN, TiAl, TiAlN, TaCN, TaC, TaSiN, other conductive material, or combinations thereof. In some implementations, gate electrode 282 includes a work function layer, which is a conductive layer tuned to have a desired work function (such as an n-type work function or a p-type work function), and a conductive layer formed over the work function layer. In various examples, the work function layer includes Ta, TaN, NiSi, CoSi, TiN, WN, TiAl, TiAlN, TaCN, TaC, TaSiN, other material suitable for achieving a desired work function, or combinations thereof. The conductive layer formed over the work function layer includes a suitable conductive material, such as aluminum, tungsten, or copper. The conductive layer may additionally or collectively include polysilicon, titanium, tantulum, metal alloys, other suitable materials, or combinations thereof. In some implementations, silicide features are subsequently formed in gate regions and/or source/drain regions. For example, silicide features can be formed on epitaxial source/drain features 260 and additionally on gate electrode 282 (for example, when gate electrode 282 includes polysilicon). The silicide features are formed by a silicidation process, such as a self-aligned silicide (salicide) process.

Figures 13A, 13B:
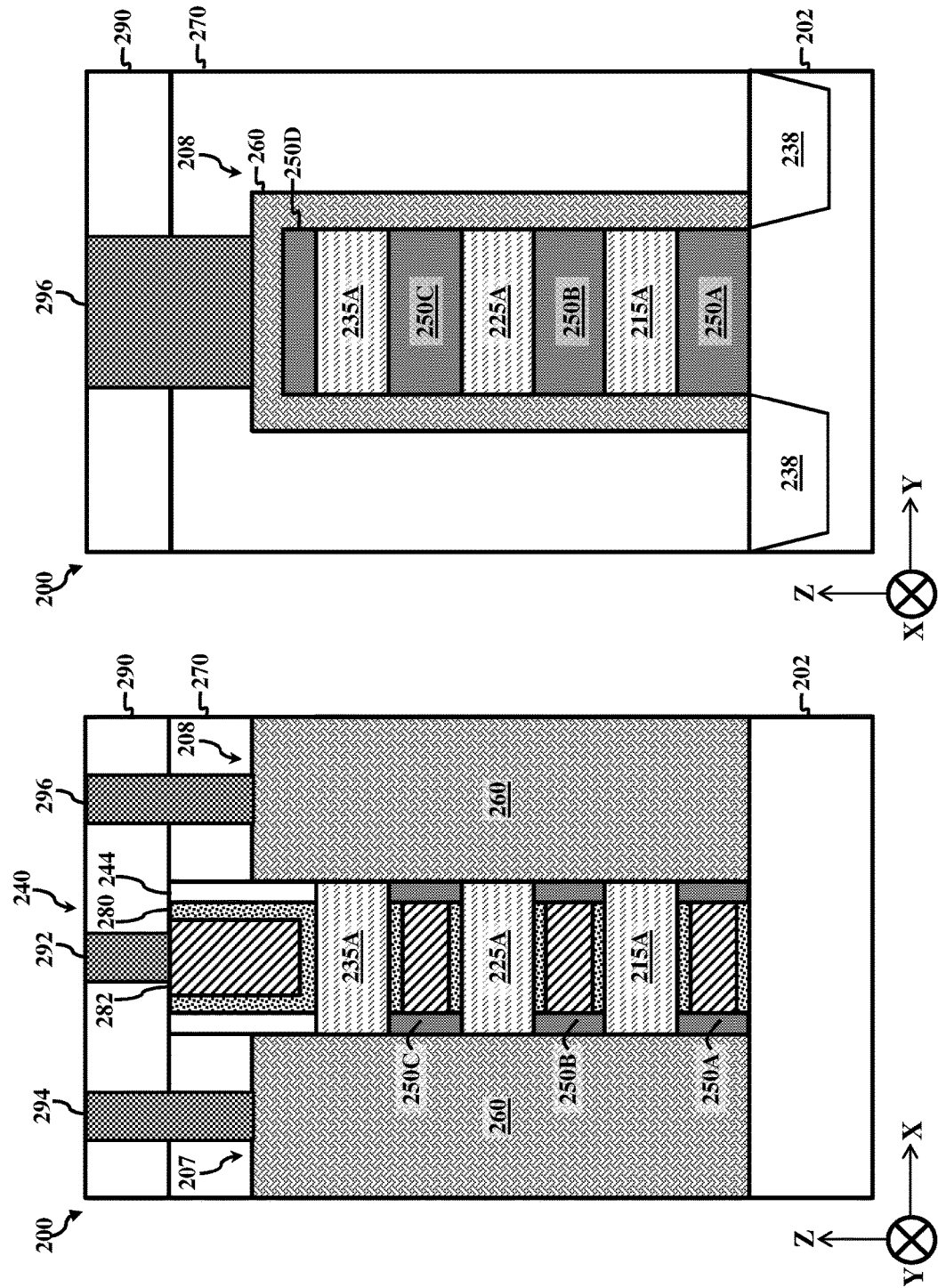

Turning to FIG. 13A and FIG. 13B, various contacts are formed to facilitate operation of integrated circuit device 200. For example, an ILD layer 290, similar to ILD layer 270, can be formed over substrate 202 (in the depicted embodiment, over ILD layer 270 and gate structure 240). Contacts can be formed in ILD layer 270 and/or ILD layer 290, such as a contact 292 that is electrically coupled with a gate structure (in particular, gate electrode 282), a contact 294 that is electrically coupled with source region 207 (in particular, epitaxial source/drain feature 260), and a contact 296 that is electrically coupled with drain region 208 (in particular, epitaxial source/drain feature 260). Contacts 292, 294, and 296 include a conductive material, such as metal. Metals include aluminum, aluminum alloy (such as aluminum/silicon/copper alloy), copper, copper alloy, titanium, titanium nitride, tantalum, tantalum nitride, tungsten, polysilicon, metal silicide, other suitable metals, or combinations thereof. The metal silicide may include nickel silicide, cobalt silicide, tungsten silicide, tantalum silicide, titanium silicide, platinum silicide, erbium silicide, palladium silicide, or combinations thereof. In some implementations, ILD layer 270, ILD layer 290, contact 292, contact 294, and/or contact 296 are a portion of a multilayer interconnect (MLI) feature disposed over substrate 202. The MLI feature electrically couples various components of integrated circuit device 200, such that the various components are operable to function as specified by design requirements. The MLI feature can include a combination of metal layers and ILD layers configured to form vertical interconnect features, such as contacts and/or vias, and/or horizontal interconnect features, such as lines. The various conductive features include materials similar to contacts 292, 294, and 296. In some implementations, a damascene process and/or dual damascene process is used to form a copper-based multilayer interconnection structure. Integrated circuit device 200 can undergo subsequent processing to complete fabrication depending on design requirements.

FIGS. 14A-25A and FIGS. 14B-25B are fragmentary diagrammatic views of an integrated circuit device 300, in portion or entirety, at various fabrication stages (such as those associated with method 100) according to various aspects of the present disclosure. FIGS. 14A-25A are diagrammatic cross-sectional views of integrated circuit device 300 in an X-Z plane, and FIGS. 14B-25B are diagrammatic cross-sectional views of integrated circuit device 300 in a Y-Z plane. Integrated circuit device 300 may be included in a microprocessor, a memory, and/or other integrated circuit device. In some implementations, integrated circuit device 300 is a portion of an IC chip, an SoC, or portion thereof, that includes various passive and active microelectronic devices such as resistors, capacitors, inductors, diodes, PFETs, NFETs, MOSFETs, CMOS transistors, BJTs, LDMOS transistors, high voltage transistors, high frequency transistors, other suitable components, or combinations thereof. In some implementations, integrated circuit device 300 is included in a non-volatile memory, such as a NVRAM, a flash memory, an EEPROM, an EPROM, other suitable memory type, or combinations thereof. Integrated circuit device 300 is similar in many respects to integrated circuit device 200. Accordingly, similar features in FIGS. 14A-25A, FIGS. 14B-25B and FIGS. 3A-13A, FIGS. 3B-13B are identified by the same reference numerals for clarity and simplicity. FIGS. 14A-25A and FIGS. 14B-25B have been simplified for the sake of clarity to better understand the inventive concepts of the present disclosure. Additional features can be added in integrated circuit device 300, and some of the features described below can be replaced, modified, or eliminated in other embodiments of integrated circuit device 300.

Figures 15A, 15B:
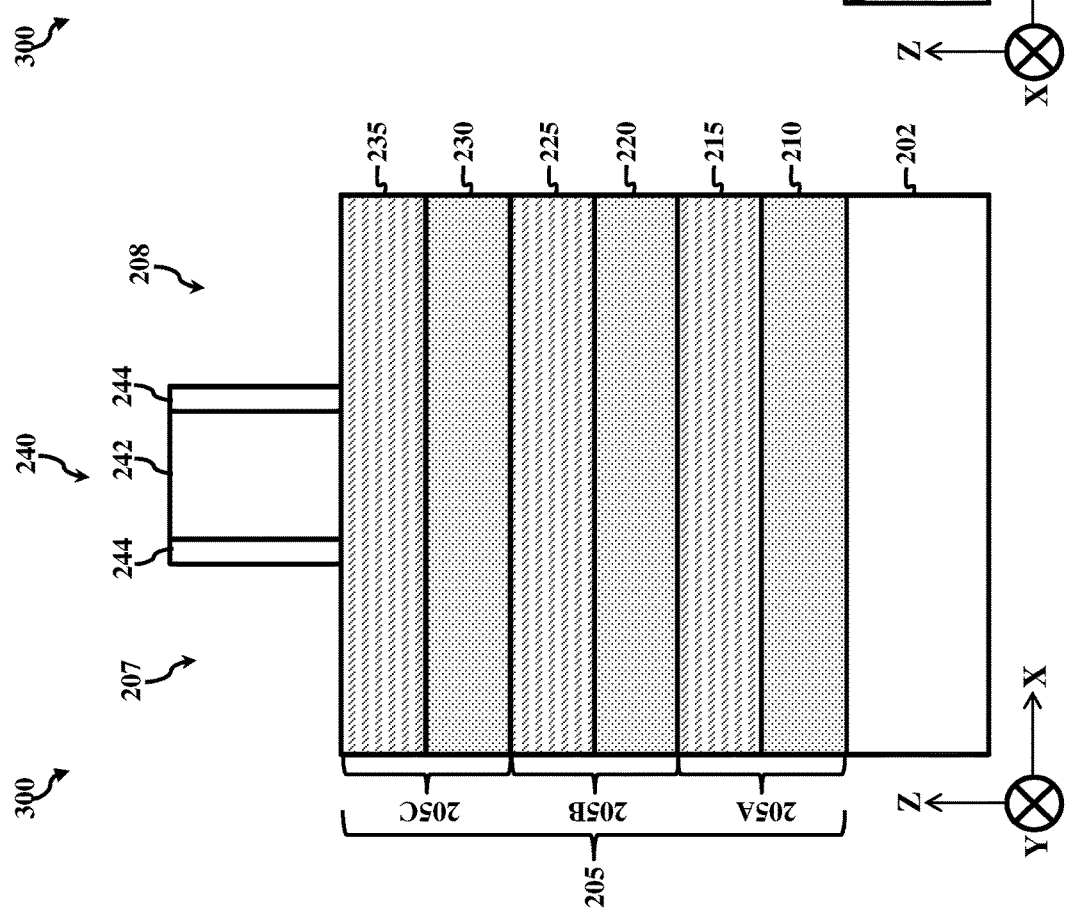

Fabrication of integrated circuit device 300 begins similar to fabrication of integrated circuit device 200. For example, in FIG. 14A and FIG. 14B, integrated circuit device 300 includes substrate 202 and heterostructure 205 disposed thereover, as described in detail above with reference to FIG. 3A and FIG. 3B. In FIG. 15A and FIG. 15B, gate structure 240 is formed over heterostructure 205 of integrated circuit device 300, as described in detail above with reference to FIG. 4A and FIG. 4B. In FIG. 16A and FIG. 16B, integrated circuit device 300 undergoes a source/drain nanowire release process, thereby forming nanowire 215A, nanowire 225A, and nanowire 235A (where semiconductor island 210A, semiconductor island 220A, and semiconductor island 230A remain in channel region 206), as described in detail above with reference to FIG. 5A and FIG. 5B. Fabrication of integrated circuit device 300 then continues with forming nanowire spacers, except in contrast to fabrication of integrated circuit device 200, the nanowire spacers have a multi-layer structure, each layer having a different etching characteristic, as described in detail below with reference to FIGS. 17A-19A and FIGS. 17B-19B. The multi-layer structure facilitates greater flexibility in subsequent etching processes, such as those used during a channel nanowire release process, in particular, by enlarging etch tuning windows needed to ensure selective etching, thereby easing constraints associated with manufacturing integrated circuit device 300.

Turning to FIG. 17A and FIG. 17B, a nanowire spacer layer 346 is formed over substrate 202, particularly over heterostructure 205 and gate structure 240. Nanowire spacer layer 346 is formed by any suitable process, such as a deposition process (for example, CVD, PVD, ALD, HDPCVD, MOCVD, RPCVD, PECVD, LPCVD, ALCVD, APCVD, plating, other suitable methods, or combinations thereof). Nanowire spacer layer 346 surrounds nanowire 215A, nanowire 225A, nanowire 235A, yet does not fill spaces between nanowire 215A, nanowire 225A, nanowire 235A, and/or substrate 202 (defined, for example, by nanowire spacing S). In some implementations, nanowire spacer layer 346 is conformally deposited over gate structure 240, the nanowires, the semiconductor islands, and substrate 202, such that nanowire spacer layer 346 has a thickness $t_1$. In some implementations, $t_1$ is about equal to a thickness of gate spacers 244 (for example, $t_1 \approx t$). In some implementations, $t_1$ is less than t (for example, $t_1 < t$). In some implementations, $t_1$ is about 1 nm to about 10 nm. Nanowire spacer layer 346 includes a material different than the nanowires and the semiconductor islands. In particular, nanowire spacer layer 346 includes a material having a different etch rate than materials of the nanowires and the semiconductor islands. For example, nanowire spacer layer 346 includes a material to achieve etch selectivity of semiconductor island 210A, semiconductor island 220A, and semiconductor island 230A to nanowire spacer layer 346, for example, during a subsequent channel nanowire release process. In some implementations, nanowire spacer layer 346 includes a material having a different etching characteristic than a material of gate spacers 244. In some implementations, nanowire spacer layer 346 includes a dielectric material. The dielectric material can include silicon, oxygen, carbon, nitrogen, other suitable material, or combinations thereof (for example, silicon oxide, silicon nitride, silicon oxynitride, silicon carbide, or silicon oxycarbonitride). For purposes of the following description, nanowire spacer layer 346 includes silicon, oxygen, carbon, and nitrogen (for example, SiOCN). In some implementations, nanowire spacer layer 346 includes a low-k dielectric material. Exemplary low-k dielectric materials include FSG, carbon doped silicon oxide, Black Diamond® (Applied Materials of Santa Clara, Calif.), Xerogel, Aerogel, amorphous fluorinated carbon, Parylene, BCB (bis-benzocyclobutenes), SiLK (Dow Chemical, Midland, Mich.), polyimide, other low-k dielectric materials, or combinations thereof. In some implementations, dopants (for example, p-type dopants, n-type dopants, or combinations thereof) are introduced into the dielectric material, such that nanowire spacer layer 346 includes a doped dielectric material. Doping the dielectric material can improve a profile of a junction between source region 207 (and/or drain region 208) and channel region 206. An ion implantation process, a diffusion process (for example, a SPD process), and/or other suitable doping process can be performed to introduce dopants into the dielectric material.

Turning to FIG. 18A and FIG. 18B, a nanowire spacer layer 348 is formed over nanowire spacer layer 346, where nanowire spacer layer 348 and nanowire spacer layer 346 are collectively referred to as a nanowire spacer multi-layer 350. Nanowire spacer layer 348 is formed by any suitable process, such as a deposition process (for example, CVD, PVD, ALD, HDPCVD, MOCVD, RPCVD, PECVD, LPCVD, ALCVD, APCVD, plating, other suitable methods, or combinations thereof). Nanowire spacer layer 348 fills any remaining space between nanowire 215A, nanowire 225A, nanowire 235A, and/or substrate 202, such that nanowire spacer multi-layer 350 completely fills nanowire spacings S. Nanowire spacer layer 348 includes a material different than nanowire spacer layer 346, the nanowires, and the semiconductor islands. In particular, nanowire spacer layer 348 includes a material having a different etch rate than materials of nanowire spacer layer 346, the nanowires, and the semiconductor islands. For example, nanowire spacer layer 348 includes a material to achieve etch selectivity of semiconductor island 210A, semiconductor island 220A, and semiconductor island 230A to nanowire spacer layer 348, for example, during a subsequent channel nanowire release process. Materials of nanowire spacer layer 348 and nanowire spacer layer 346 are also selected to achieve etch selectivity of nanowire spacer layer 348 to nanowire spacer layer 346, such that nanowire spacer layer 348 can be easily removed (selectively etched) relative to nanowire spacer layer 346. In some implementations, nanowire spacer layer 348 includes a dielectric material. The dielectric material can include silicon, oxygen, carbon, nitrogen, other suitable material, or combinations thereof (for example, silicon oxide, silicon nitride, silicon oxynitride, silicon carbide, or silicon oxycarbonitride). For purposes of the following description, nanowire spacer layer 348 includes silicon and nitrogen (for example, silicon nitride). Nanowire spacer layer 348 can thus include the same material as gate spacers 244, though the present disclosure contemplates embodiments where nanowire spacer layer 348 includes a material having a different etching characteristic than a material of gate spacers 244. In some implementations, a dielectric constant (k) of a material of nanowire spacer layer 348 is higher than a dielectric constant of a material of nanowire spacer layer 346. In some implementations, nanowire spacer layer 348 includes a low-k dielectric material. Exemplary low-k dielectric materials include FSG, carbon doped silicon oxide, Black Diamond® (Applied Materials of Santa Clara, Calif.), Xerogel, Aerogel, amorphous fluorinated carbon, Parylene, BCB (bis-benzocyclobutenes), SiLK (Dow Chemical, Midland, Mich.), polyimide, other low-k dielectric materials, or combinations thereof. In some implementations, dopants (for example, p-type dopants, n-type dopants, or combinations thereof) are introduced into the dielectric material, such that nanowire spacer layer 348 includes a doped dielectric material. Doping the dielectric material can improve a profile of a junction between source region 207 (and/or drain region 208) and channel region 206. An ion implantation process, a diffusion process (for example, a SPD process), and/or other suitable doping process can be performed to introduce dopants into the dielectric material.

Turning to FIG. 19A and FIG. 19B, a patterning process is performed on nanowire spacer multi-layer 350 (here, nanowire spacer layer 346 and nanowire spacer layer 348) to form nanowire spacers. For example, nanowire spacer layer 346 and nanowire spacer layer 348 are selectively removed to expose sidewalls 252 and sidewalls 254 of nanowire 215A, nanowire 225A, and nanowire 235A, yet remain in spaces between nanowire 215A, nanowire 225A, nanowire 235A, and/or substrate 202. In the depicted embodiment, nanowire spacer layer 348 is removed from over gate structure 240, where a thickness of nanowire spacer layer 348 remaining over nanowire spacer layer 346 and nanowire 235A is reduced during the patterning process. In furtherance of the depicted embodiment, nanowire spacer layer 346 remains over gate structure 240 and nanowire 235A after the patterning process. In some implementations, nanowire spacer layer 348 is completely removed from over nanowire spacer layer 346 and nanowire 235A. In such implementations, a thickness of nanowire spacer layer 346 remaining over nanowire 235A may be reduced during the patterning process. In some implementations, the present disclosure contemplates a minimal thickness of nanowire spacer layer 348 remaining over gate structure 240. In some implementations, an etching process selectively removes portions of nanowire spacer layer 348 while eliminating (or minimizing) removal of the nanowires and/or nanowire spacer layer 346. Various etching parameters can be tuned to selectively etch nanowire spacer layer 348, such as etchant composition, etching temperature, etching solution concentration, etching time, etching pressure, source power, RF bias voltage, RF bias power, etchant flow rate, other suitable etching parameters, or combinations thereof. In some implementations, nanowire spacer layer 348 is etched using etch reactants having a high etch selectivity with respect to the material of nanowire spacer layer 348. For example, where nanowire spacer layer 348 includes silicon nitride, nanowire spacer layer 346 includes silicon oxycarbonitride, and the nanowires include silicon, etch reactants and/or etch solutions of the etching process are selected to ensure high etch selectivity to silicon nitride with minimal (to no) etching of silicon oxycarbonitride and/or silicon. In such implementations, a wet etching process using a phosphoric acid solution can selectively etch nanowire spacer layer 348 with minimal (to no) etching of the nanowires and/or nanowire spacer layer 346.

Nanowire spacer multi-layer 350 thus remains in source region 207 and drain region 208, forming a nanowire spacer 350A (between substrate 202 and nanowire 215A), a nanowire spacer 350B (between nanowire 215A and nanowire 225A), a nanowire spacer 350C (between nanowire 225A and nanowire 235A), and a nanowire spacer 350D (over nanowire 235A). Nanowire spacers 350A-350C span source region 207, drain region 208, and a portion of channel region 206 (in the depicted embodiment, a portion of channel region 206 underlying gate spacers 244), whereas nanowire spacer 350D spans source region 207 and drain region 208. In the depicted embodiment, nanowire spacers 350A-350D do not extend (or negligibly extend) beyond nanowire 215A, nanowire 225A, and nanowire 235A along the x-direction and the y-direction, ensuring that nanowire 215A, nanowire 225A, and nanowire 235A are sufficiently exposed for forming subsequent source/drain features. For example, nanowire spacers 350A-350D each have a width $W_2$ extending along the y-direction that is substantially equal to width W of the nanowires (in other words, $W_2 \approx W$). In some implementations, $W_2 \approx W$ when $W_2$ and W are within ±5% of each other. In furtherance of the depicted embodiment, nanowire spacers 350A-350D have sidewalls that substantially align with sidewalls 252 and sidewalls that substantially align with sidewalls 254. In some implementations, the sidewalls are considered substantially aligned when any shift (for example, $\Delta x$ or $\Delta y$) between sidewalls of nanowire spacers 350A-350D and sidewalls 252 or sidewalls 254 is less than about 2 nm.

Figures 20A, 20B:
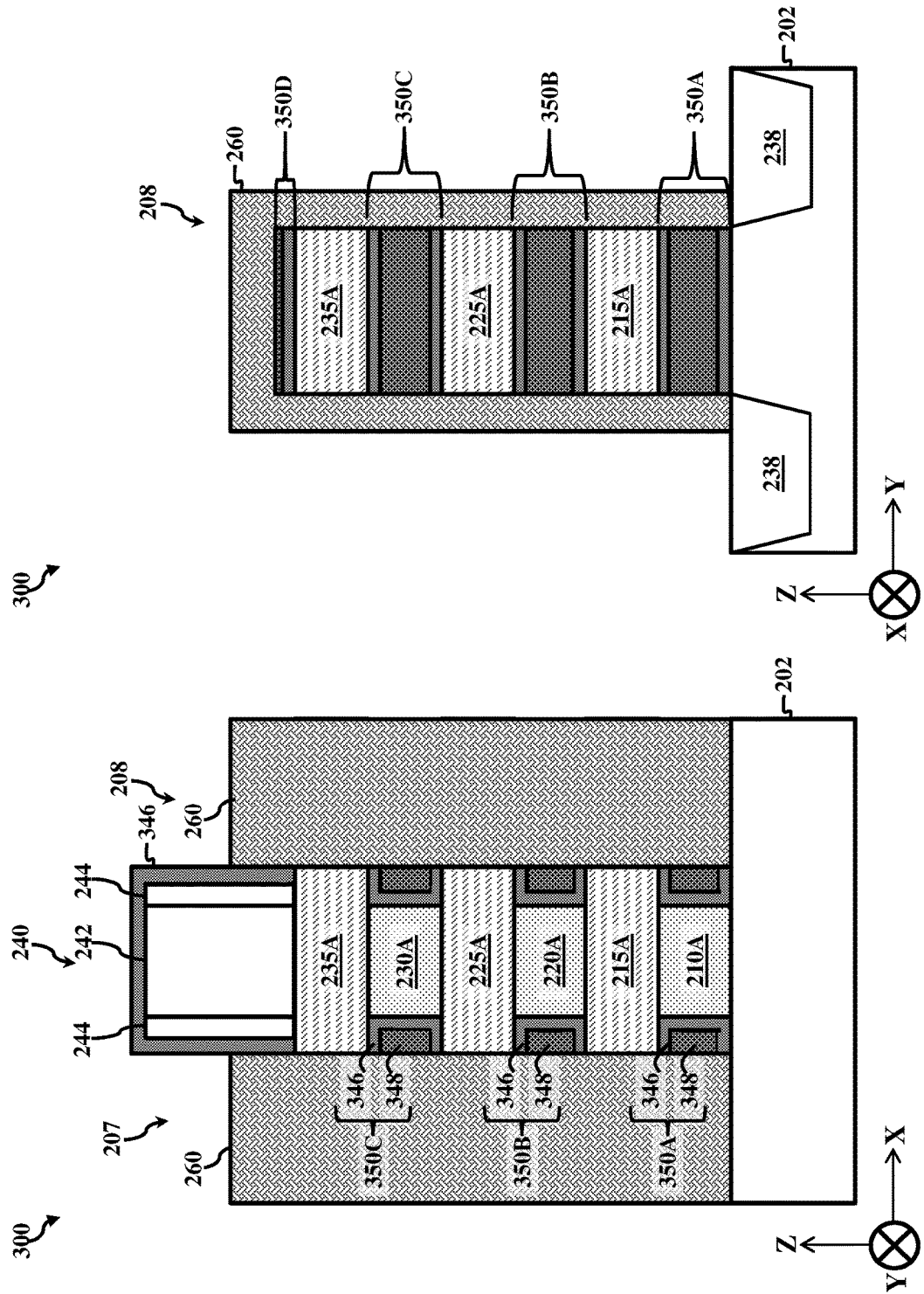
Figures 24A, 24B:
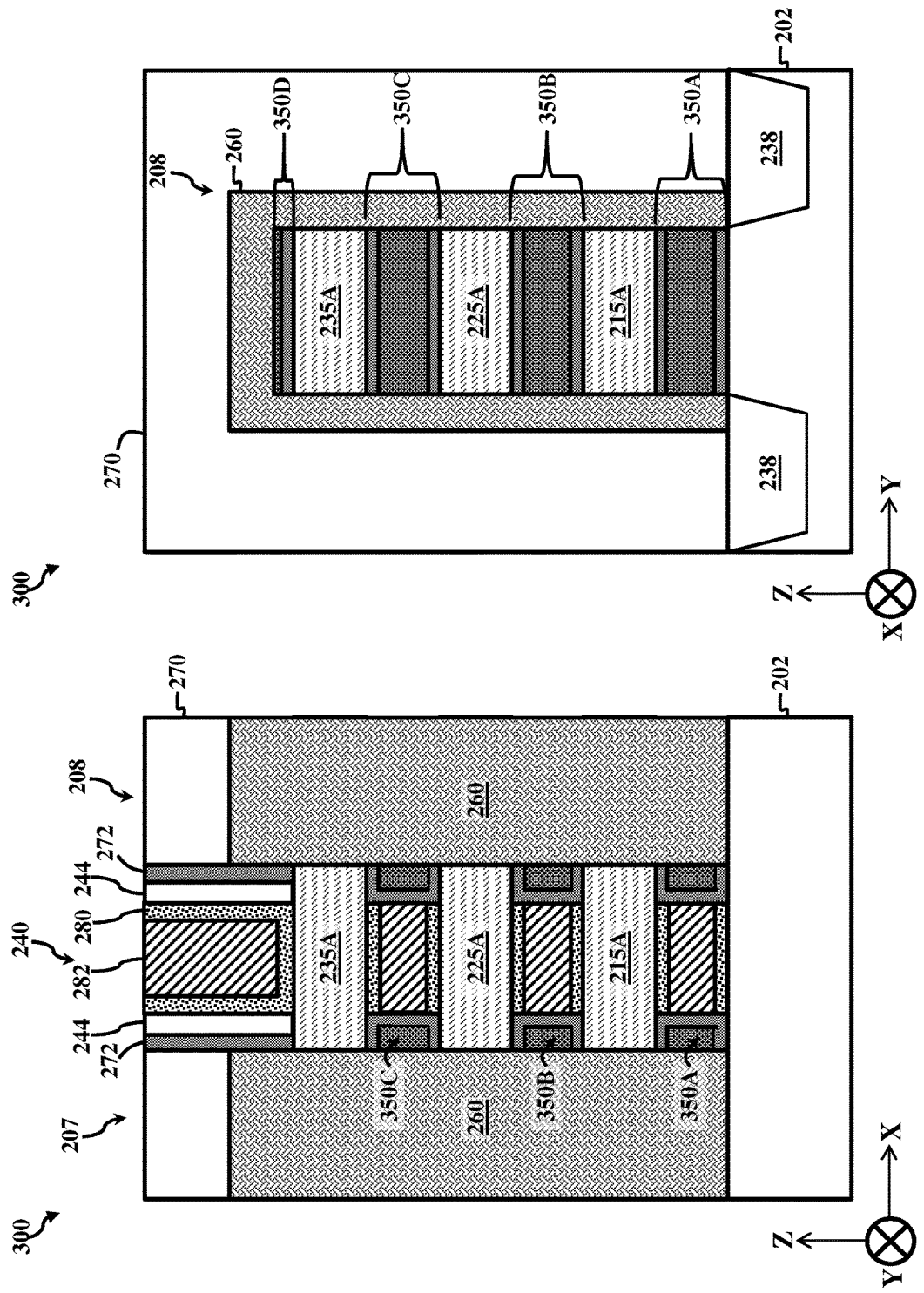
Figures 25A, 25B:
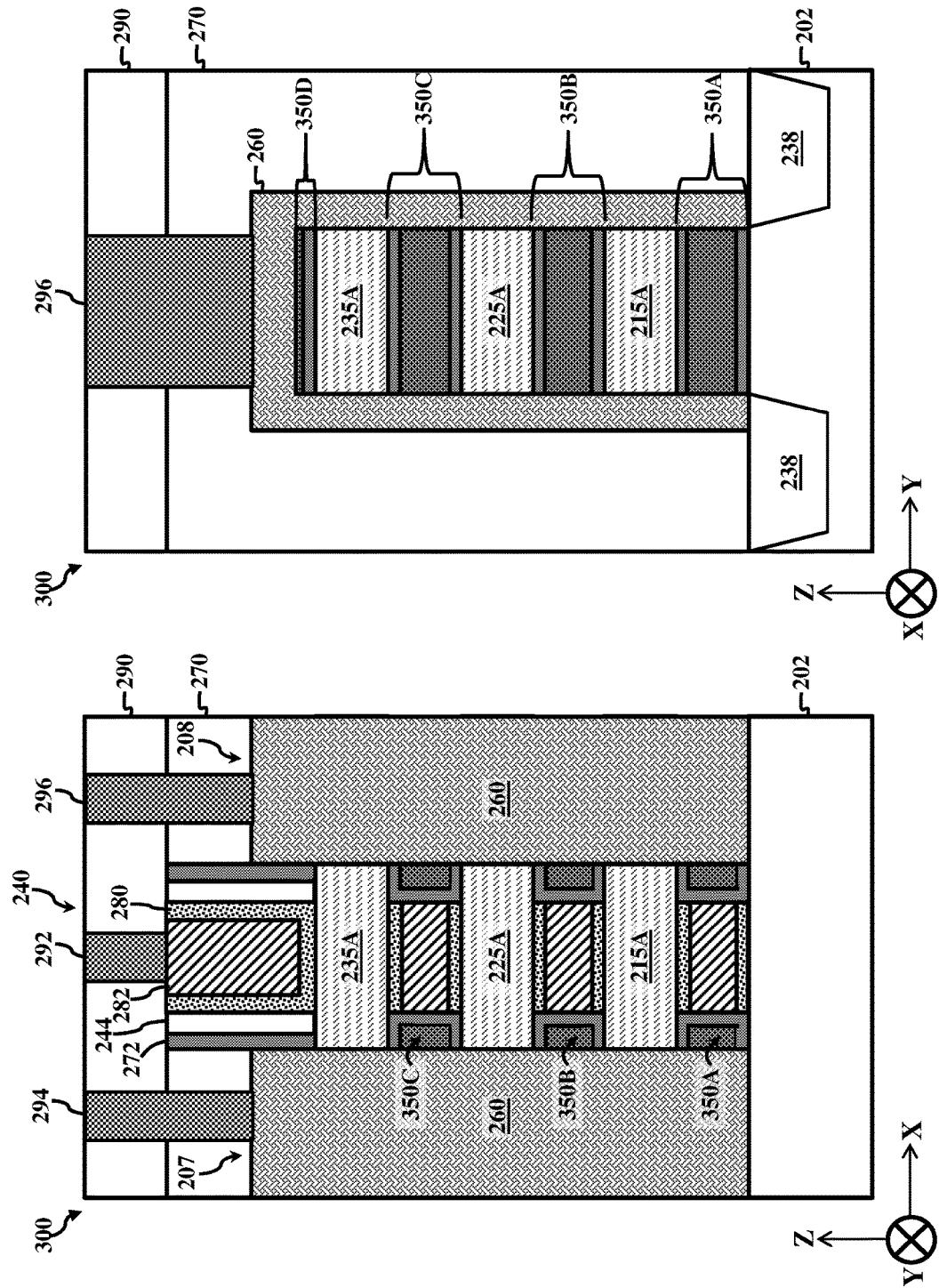

Fabrication of integrated circuit device 300 then proceeds similar to fabrication of integrated circuit device 200. For example, in FIG. 20A and FIG. 20B, epitaxial source/drain features 260 are formed in source region 207 and drain region 208 of heterostructure 205 of integrated circuit device 300, as described in detail above with reference to FIG. 8A and FIG. 8B. As depicted in FIG. 20A, a portion of nanowire spacers 350A-350C (including nanowire spacer layer 346 and nanowire spacer layer 348) in channel region 206 is not covered by epitaxial source/drain features 260. In FIG. 21A and FIG. 21B, ILD layer 270 is formed over substrate 202, as described in detail above with reference to FIG. 9A and FIG. 9B. In the depicted embodiment, a CMP process (or etch back process) is performed on ILD layer 270 and any nanowire spacer layer(s) remaining over gate structure 240 (here, nanowire spacer layer 346) to expose a top portion of gate structure 240, such as a top portion (or top surface) of dummy gate electrode 242. Remaining portions of the nanowire spacer layer(s) form spacers 272 disposed adjacent to gate spacers 244, thereby providing two spacer sets. In FIG. 22A and FIG. 22B, a portion of gate structure 240 is removed to expose channel region 206 of integrated circuit device 300, thereby forming opening 275, as described in detail above with reference to FIG. 10A and FIG. 10B. In FIG. 23A and FIG. 23B, integrated circuit device 300 undergoes a channel nanowire release process, thereby releasing nanowire 215A, nanowire 225A, and nanowire 235A in channel region 206, as described in detail above with reference to FIG. 11A and FIG. 11B. Similar to nanowire spacers 250A-250C, nanowire spacers 350A-350C function as etch stop layers during the channel nanowire release process, providing lateral etch control and preventing unintentional removal of source/drain material, such as epitaxial source/drain features 260. Nanowire spacers 350A-350C also provide an insulation region between a subsequently formed metal gate stack and source region 207 (and drain region 208), improving performance of integrated circuit device 300. In FIG. 24A and FIG. 24B, a metal gate stack of gate structure 240 (including, for example, gate dielectric 280 and gate electrode 282) is formed in opening 275, as described in detail above with reference to FIG. 12A and FIG. 12B. In FIG. 25A and FIG. 25B, various contacts are formed to facilitate operation of integrated circuit device 300 (for example, contact 292, contact 294, and contact 296 extending through ILD layer 270 and/or ILD layer 290), as described in detail above with reference to FIG. 13A and FIG. 13B.

FIGS. 26A-37A and FIGS. 26B-37B are fragmentary diagrammatic views of an integrated circuit device 400, in portion or entirety, at various fabrication stages (such as those associated with method 100) according to various aspects of the present disclosure. FIGS. 26A-37A are diagrammatic cross-sectional views of integrated circuit device 400 in an X-Z plane, and FIGS. 26B-37B are diagrammatic cross-sectional views of integrated circuit device 400 in a Y-Z plane. Integrated circuit device 400 may be included in a microprocessor, a memory, and/or other integrated circuit device. In some implementations, integrated circuit device 400 is a portion of an IC chip, an SoC, or portion thereof, that includes various passive and active microelectronic devices such as resistors, capacitors, inductors, diodes, PFETs, NFETs, MOSFETs, CMOS transistors, BJTs, LDMOS transistors, high voltage transistors, high frequency transistors, other suitable components, or combinations thereof. In some implementations, integrated circuit device 400 is included in a non-volatile memory, such as a NVRAM, a flash memory, an EEPROM, an EPROM, other suitable memory type, or combinations thereof. Integrated circuit device 400 is similar in many respects to integrated circuit device 200. Accordingly, similar features in FIGS. 26A-37A, FIGS. 26B-37B and FIGS. 3A-13A, FIGS. 3B-13B are identified by the same reference numerals for clarity and simplicity. FIGS. 26A-37A and FIGS. 26B-37B have been simplified for the sake of clarity to better understand the inventive concepts of the present disclosure. Additional features can be added in integrated circuit device 400, and some of the features described below can be replaced, modified, or eliminated in other embodiments of integrated circuit device 400.

Figures 27A, 27B:
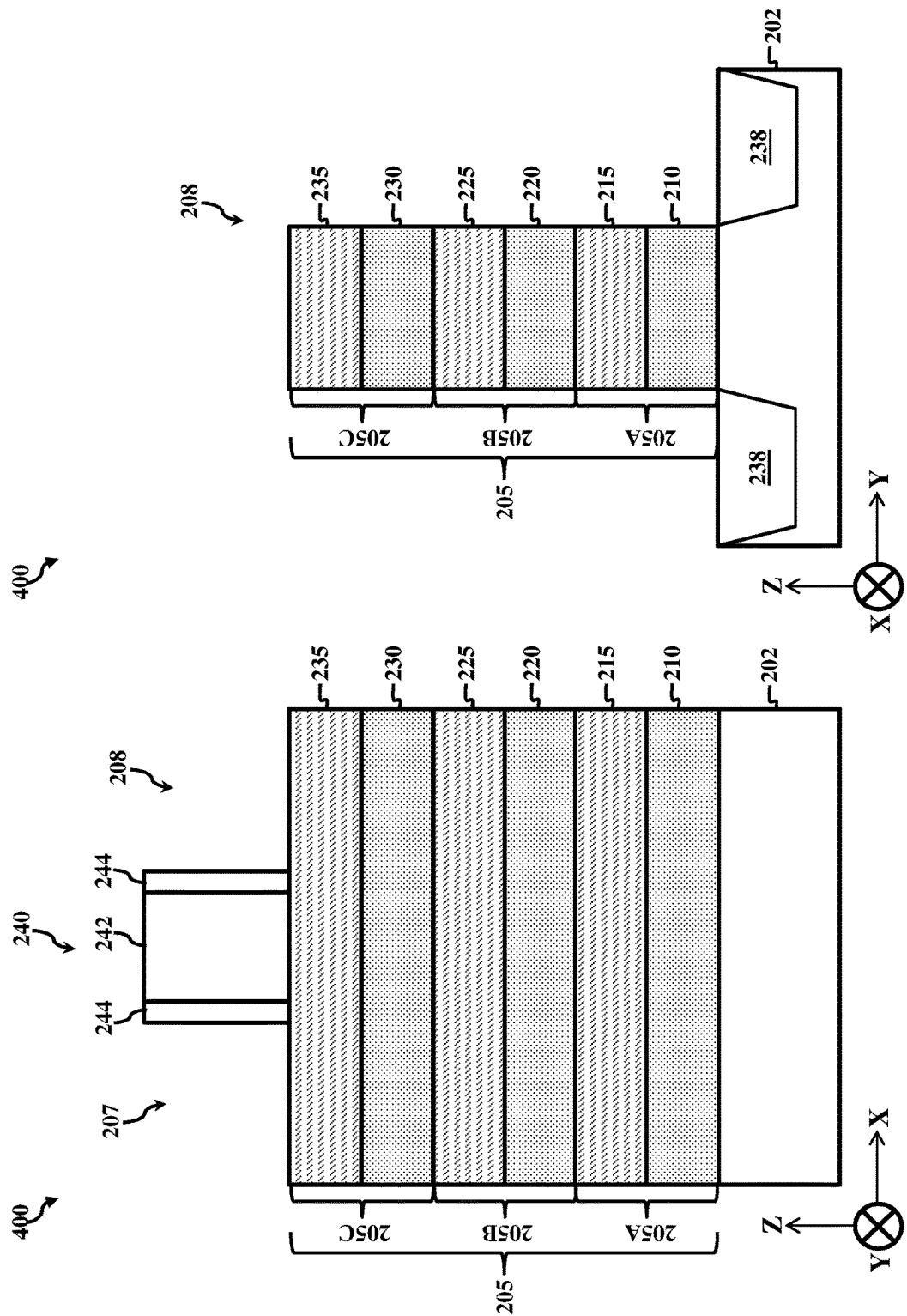
Figures 28A, 28B:
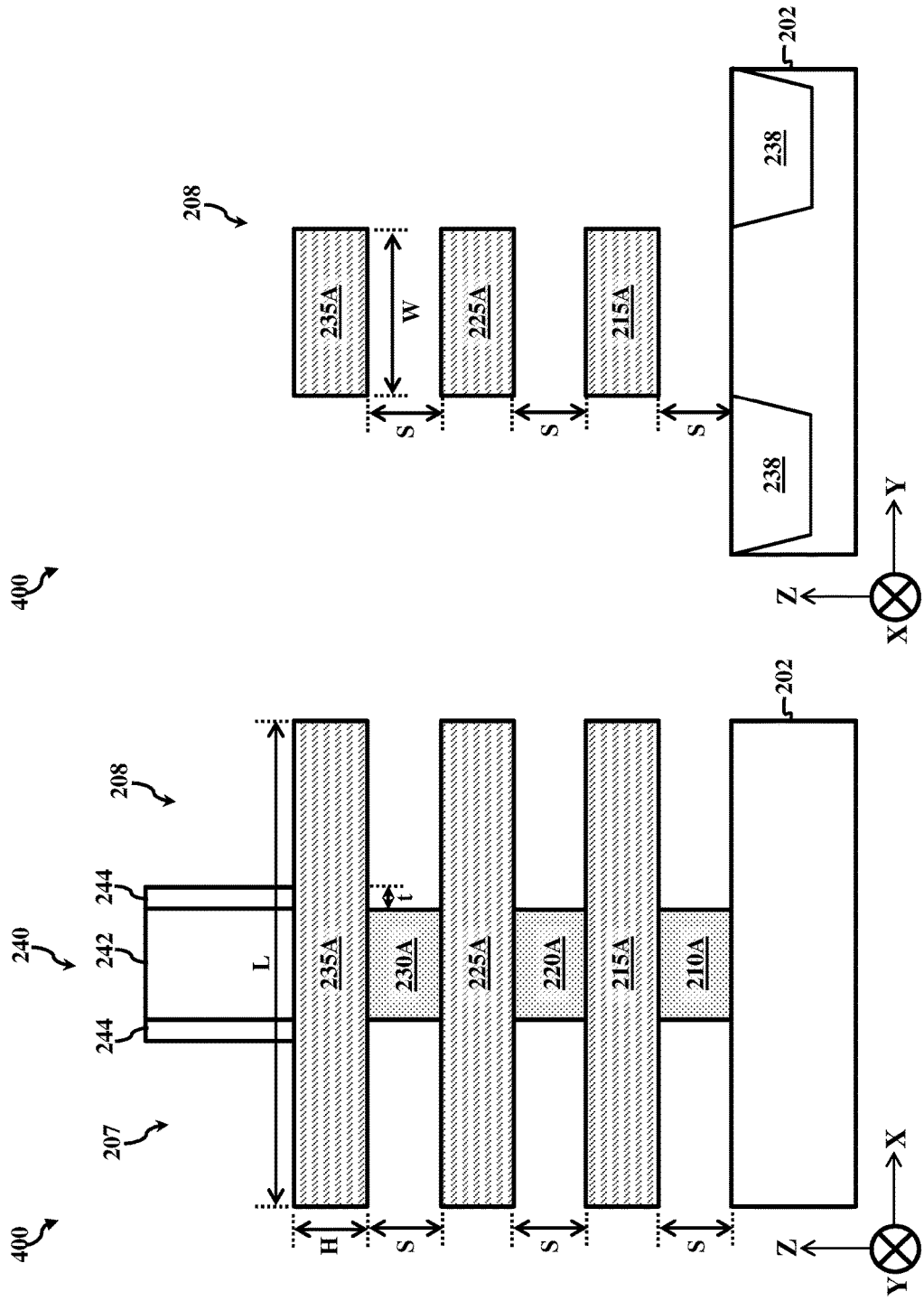

Fabrication of integrated circuit device 400 begins similar to fabrication of integrated circuit device 200. For example, turning to FIG. 26A and FIG. 26B, integrated circuit device 400 includes substrate 202 and heterostructure 205 disposed thereover, as described in detail above with reference to FIG. 3A and FIG. 3B. In FIG. 27A and FIG. 27B, gate structure 240 is formed over heterostructure 205 of integrated circuit device 400, as described in detail above with reference to FIG. 4A and FIG. 4B. In FIG. 28A and FIG. 28B, a source/drain nanowire release process is performed on integrated circuit device 400, thereby forming nanowire 215A, nanowire 225A, and nanowire 235A (where semiconductor island 210A, semiconductor island 220A, and semiconductor island 230A remain in channel region 206), as described in detail above with reference to FIG. 5A and FIG. 5B. Fabrication of integrated circuit device 400 then continues with forming nanowire spacers, except in contrast to fabrication of integrated circuit device 200, the nanowire spacers have a multi-layer structure, each layer having a different etching characteristic. The multi-layer structure facilitates greater flexibility in subsequent etching processes, such as those used during a channel nanowire release process, in particular, by enlarging etch tuning windows needed to ensure selective etching, thereby easing constraints associated with manufacturing integrated circuit device 400.

Figures 29A, 29B:
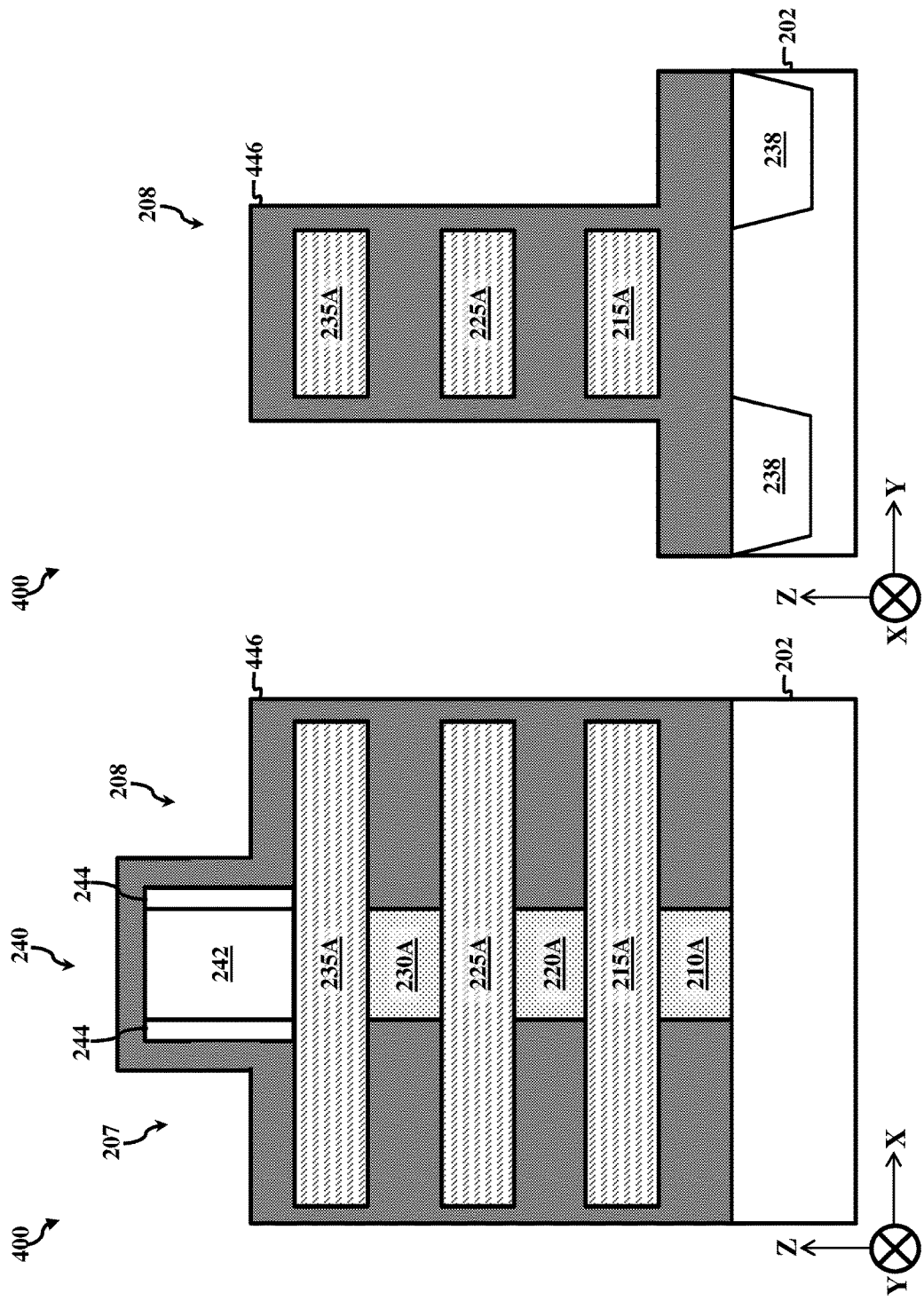

Turning to FIG. 29A and FIG. 29B, a nanowire spacer layer 446 is formed over substrate 202, particularly over heterostructure 205 and gate structure 240, by any suitable process, such as a deposition process (for example, CVD, PVD, ALD, HDPCVD, MOCVD, RPCVD, PECVD, LPCVD, ALCVD, APCVD, plating, other suitable methods, or combinations thereof). Nanowire spacer layer 446 fills spaces between the nanowires of integrated circuit device 400 (here, nanowire 215A, nanowire 225A, and nanowire 235A). Though nanowire spacer layer 446 includes a single layer in the depicted embodiment, the present disclosure contemplates embodiments where nanowire spacer layer 446 includes multiple layers, as described further below. Nanowire spacer layer 446 includes a material different than gate spacers 244, the nanowires, and the semiconductor islands. In particular, nanowire spacer layer 446 includes a material having a different etching rate than materials of gate spacers 244, the nanowires, and the semiconductor islands. For example, nanowire spacer layer 446 includes a material to achieve etch selectivity of the semiconductor islands (here, semiconductor island 210A, semiconductor island 220A, and semiconductor island 230A) to nanowire spacer layer 446, for example, during a subsequent channel nanowire release process. In some implementations, nanowire spacer layer 446 includes a dielectric material. The dielectric material can include silicon, oxygen, carbon, nitrogen, other suitable material, or combinations thereof (for example, silicon oxide, silicon nitride, silicon oxynitride, silicon carbide, or silicon oxycarbonitride). For purposes of the following description, nanowire spacer layer 446 includes silicon and oxygen (for example, $SiO_2$). In some implementations, nanowire spacer layer 446 includes a low-k dielectric material. Exemplary low-k dielectric materials include FSG, carbon doped silicon oxide, Black Diamond® (Applied Materials of Santa Clara, Calif.), Xerogel, Aerogel, amorphous fluorinated carbon, Parylene, BCB, SILK (Dow Chemical, Midland, Mich.), polyimide, other low-k dielectric material, or combinations thereof. In some implementations, dopants are introduced into the dielectric material, such that nanowire spacer layer 446 includes a doped dielectric material. Doping the dielectric material can improve a profile of a junction between source region 207 (and/or drain region 208) and channel region 206, which can improve performance of integrated circuit device 400. An ion implantation process, a diffusion process (for example, an SPD process), and/or other suitable doping process can be performed to introduce dopants into the dielectric material.

Turning to FIG. 30A and FIG. 30B, a treatment process is performed on nanowire spacer layer 446, such that nanowire spacer layer 446 includes untreated portions 446A and treated portions 446B. The treatment process changes a property (or characteristic) of portions of nanowire spacer layer 446, such that treated portions 446B exhibit a different characteristic than untreated portions 446A. For example, the treatment process changes an etching characteristic of portions of nanowire spacer layer 446, such that treated portions 446B exhibit a different etch rate (in some implementations, a higher etch rate) than untreated portions 446A. In another example, the treatment process changes an electrical characteristic of portions of nanowire spacer layer 446, such that treated portions 446B exhibit a different electrical characteristic (in some implementations, a higher conductivity) than untreated portions 446A. In some implementations, the treatment process is an ion implantation process that introduces dopants into nanowire spacer layer 446, such that treated portions 446B are doped and untreated portions are undoped. In implementations where nanowire spacer layer 446 includes silicon oxide, untreated portions 446A remain silicon oxide after the treatment process, whereas treated portions 446B include doped silicon oxide. In some implementations, the dopants are p-type dopants, n-type dopants, or combination thereof.

Turning to FIG. 31A and FIG. 31B, a patterning process is performed on nanowire spacer layer 446 to form nanowire spacers. For example, treated portions 446B of nanowire spacer layer 446 are selectively removed to expose sidewalls 252 and sidewalls 254 of nanowire 215A, nanowire 225A, and nanowire 235A, yet remain in spaces between nanowire 215A, nanowire 225A, nanowire 235A, and/or substrate 202. Treated portions 446B of nanowire spacer layer 446 are also removed from gate structure 240, such as dummy gate electrode 242 and gate spacers 244, where a thickness of treated portions 446B of nanowire spacer layer 446 remaining over nanowire 235A is reduced during the patterning process. In some implementations, an etching process selectively removes treated portions 446B of nanowire spacer layer 446 while eliminating (or minimizing) removal of gate structure 240 (including gate spacers 244) and the nanowires. Various etching parameters can be tuned to selectively etch treated portions 446B of nanowire spacer layer 446, such as etchant composition, etching temperature, etching solution concentration, etching time, etching pressure, source power, RF bias voltage, RF bias power, etchant flow rate, other suitable etching parameters, or combinations thereof. In some implementations, treated portions 446B of nanowire spacer layer 446 are etched using etch reactants having a high etch selectivity with respect to the material of treated portions 446B. For example, where treated portions 446B include doped silicon oxide and the nanowires include silicon, etch reactants and/or etch solutions of the etching process are selected to ensure high etch selectivity to doped silicon oxide with minimal (to no) etching of silicon.

Nanowire spacer layer 246 (in particular, untreated portions 446A and treated portions 446B) thus remains in source region 207 and drain region 208, forming a nanowire spacer 450A (between substrate 202 and nanowire 215A), a nanowire spacer 450B (between nanowire 215A and nanowire 225A), a nanowire spacer 450C (between nanowire 225A and nanowire 235A), and a nanowire spacer 450D (over nanowire 235A). Nanowire spacers 450A-450C span source region 207, drain region 208, and a portion of channel region 206 (in the depicted embodiment, a portion of channel region 206 underlying gate spacers 244), whereas nanowire spacer 450D spans source region 207 and drain region 208. In the depicted embodiment, nanowire spacers 450A-450D do not extend (or negligibly extend) beyond nanowire 215A, nanowire 225A, and nanowire 235A along the x-direction and the y-direction, ensuring that nanowire 215A, nanowire 225A, and nanowire 235A are sufficiently exposed for forming subsequent source/drain features. For example, nanowire spacers 450A-450D each have a width ($W_3$) extending along the y-direction that is substantially equal to width W of the nanowires (in other words, $W_3 \approx W$). In some implementations, $W_3 \approx W$ when $W_3$ and W are within ±5% of each other. In furtherance of the depicted embodiment, nanowire spacers 450A-450D have sidewalls that substantially align with sidewalls 252 and sidewalls that substantially align with sidewalls 254. In some implementations, the sidewalls are considered substantially aligned when any shift (for example, $\Delta x$ or $\Delta y$) between sidewalls of nanowire spacers 450A-450D and sidewalls 252 or sidewalls 254 is less than about 2 nm.

Figures 32A, 32B:
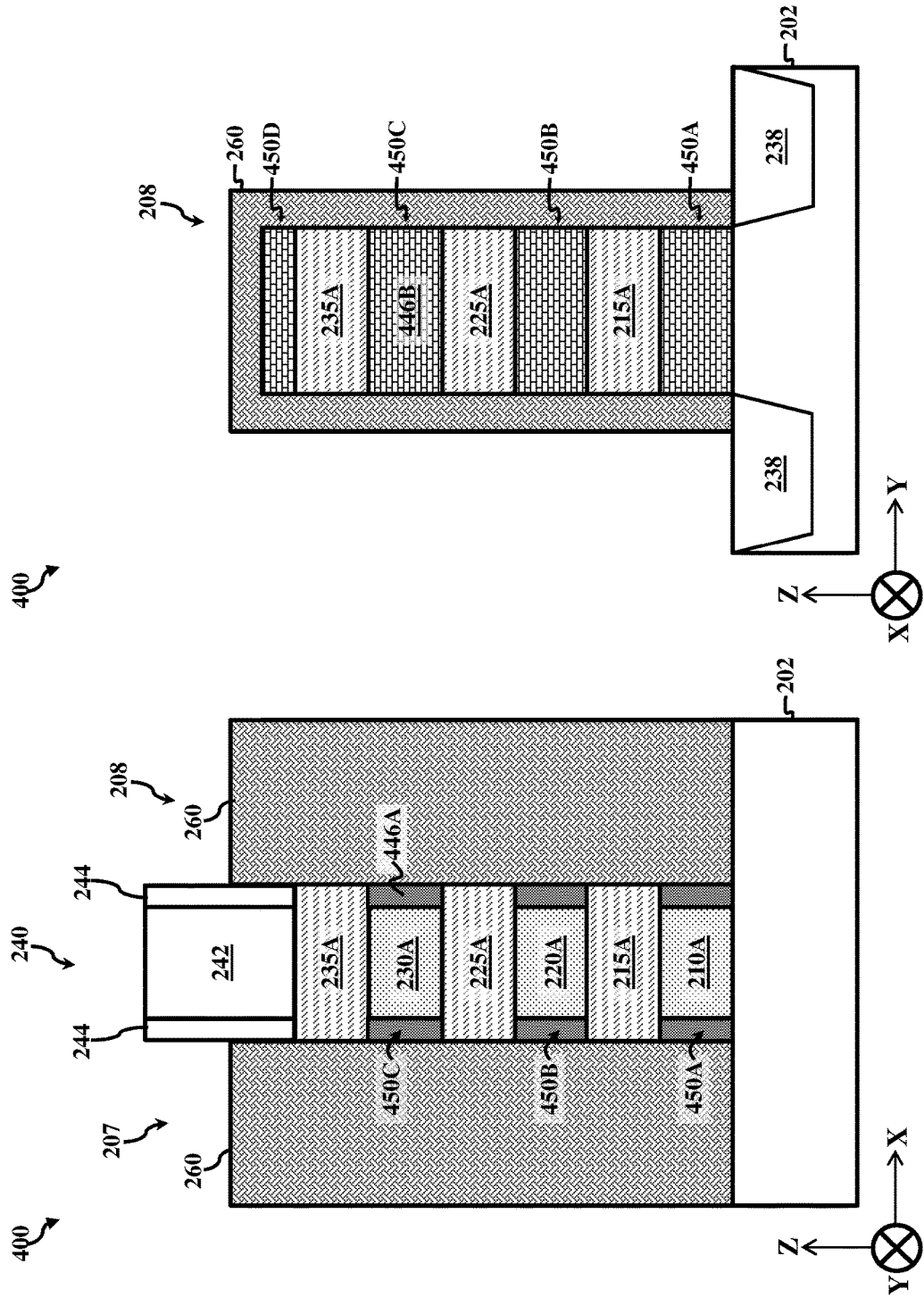
Figures 35A, 35B:
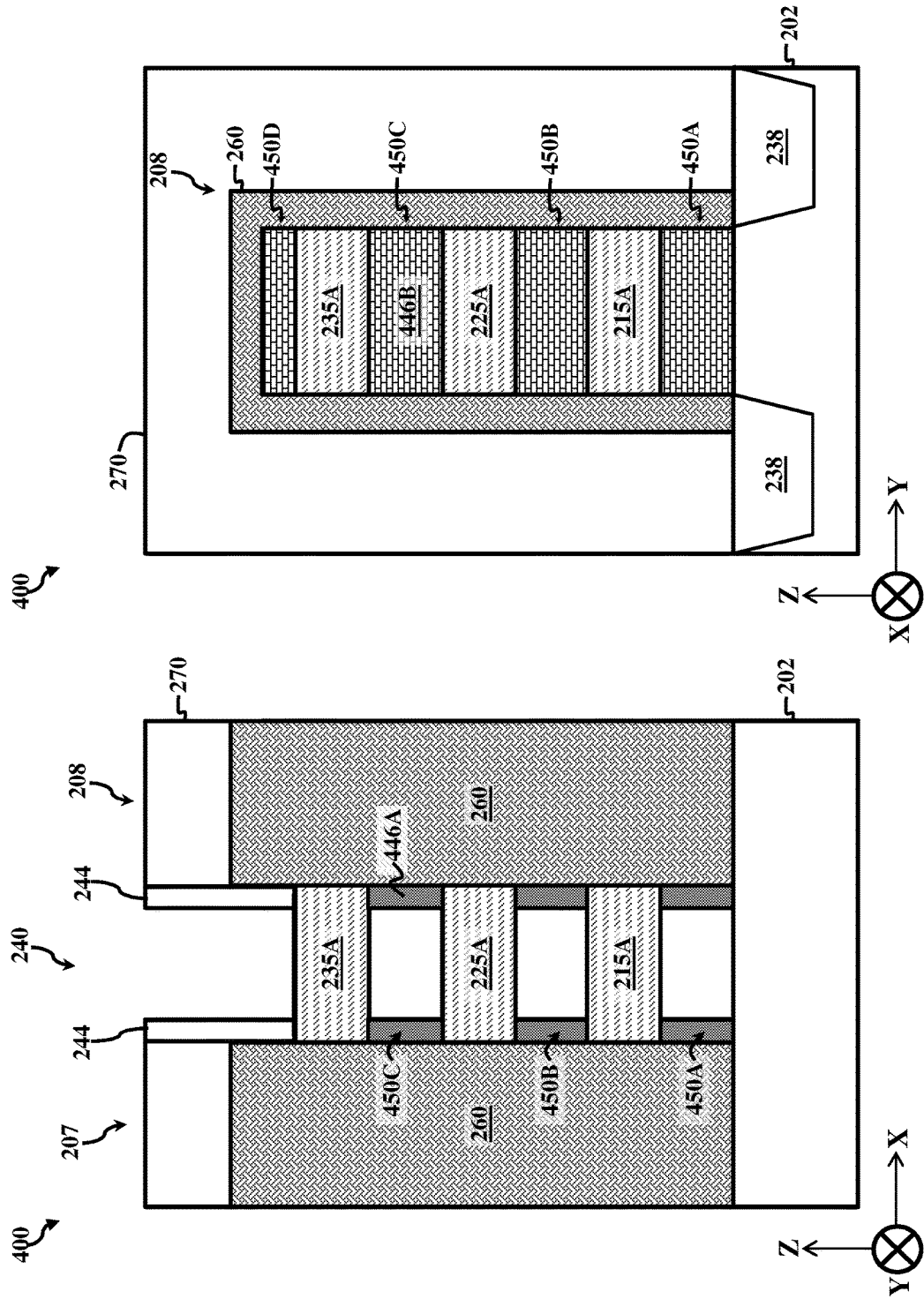
Figures 36A, 36B:
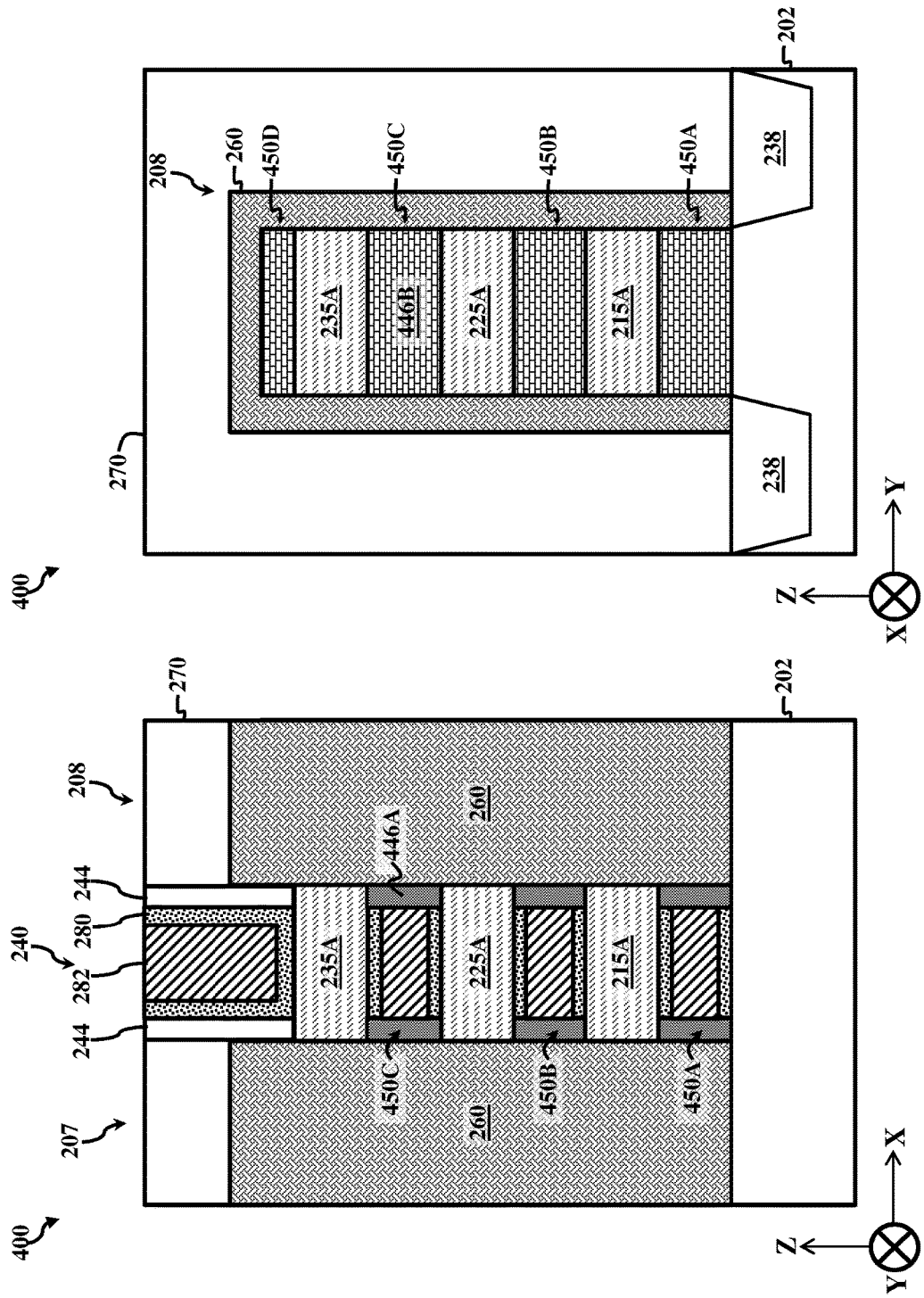
Figures 38A, 38B:
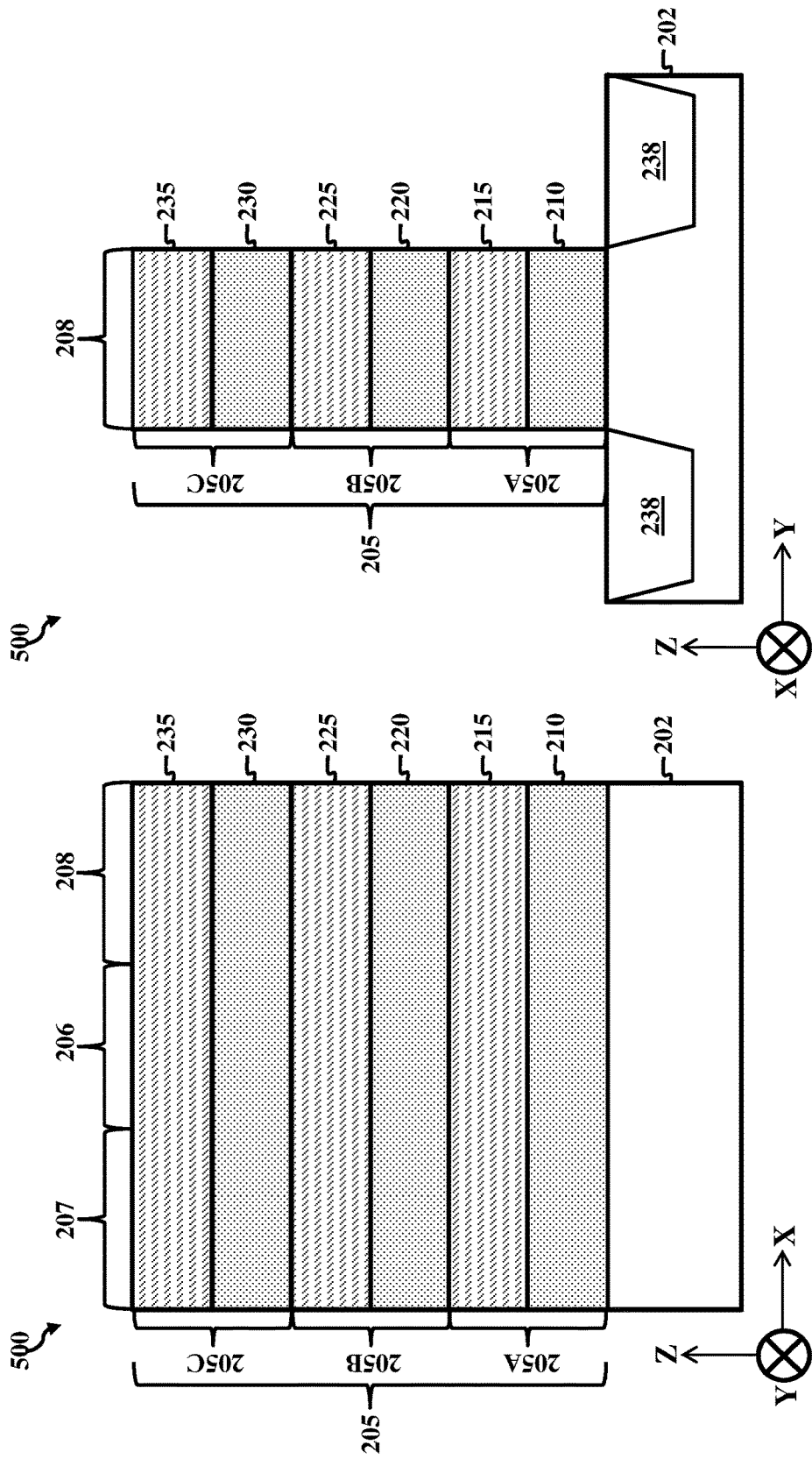

Fabrication of integrated circuit device 400 then proceeds similar to fabrication of integrated circuit device 200. For example, in FIG. 32A and FIG. 32B, epitaxial source/drain features 260 are formed in source region 207 and drain region 208 of heterostructure 205 of integrated circuit device 400, as described in detail above with reference to FIG. 8A and FIG. 8B. As depicted in FIG. 32A, a portion of nanowire spacers 450A-450C (in particular, untreated portions 446A) in channel region 206 is not covered by epitaxial source/drain features 260. In FIG. 33A and FIG. 33B, ILD layer 270 is formed over substrate 202, as described in detail above with reference to FIG. 9A and FIG. 9B. In FIG. 34A and FIG. 34B, a portion of gate structure 240 is removed to expose channel region 206 of integrated circuit device 400, thereby forming opening 275, as described in detail above with reference to FIG. 10A and FIG. 10B. In FIG. 35A and FIG. 35B, integrated circuit device 400 undergoes a channel nanowire release process, thereby releasing nanowire 215A, nanowire 225A, and nanowire 235A in channel region 206, as described in detail above with reference to FIG. 11A and FIG. 11B. Similar to nanowire spacers 250A-250C, nanowire spacers 450A-450C function as etch stop layers during the channel nanowire release process, providing lateral etch control and preventing unintentional removal of source/drain material, such as epitaxial source/drain features 260. Nanowire spacers 450A-450C also provide an insulation region between a subsequently formed metal gate stack and source region 207 (and drain region 208), improving performance of integrated circuit device 400. In FIG. 36A and FIG. 36B, a metal gate stack of gate structure 240 (including, for example, gate dielectric 280 and gate electrode 282) is formed in opening 275, as described in detail above with reference to FIG. 12A and FIG. 12B. In FIG. 37A and FIG. 37B, various contacts are formed to facilitate operation of integrated circuit device 400 (for example, contact 292, contact 294, and contact 296 extending through ILD layer 270 and/or ILD layer 290), as described in detail above with reference to FIG. 13A and FIG. 13B.

FIGS. 38A-48A and FIGS. 38B-48B are fragmentary diagrammatic views of an integrated circuit device 500, in portion or entirety, at various fabrication stages (such as those associated with method 100) according to various aspects of the present disclosure. FIGS. 38A-48A are diagrammatic cross-sectional views of integrated circuit device 500 in an X-Z plane, and FIGS. 38B-48B are diagrammatic cross-sectional views of integrated circuit device 500 in a Y-Z plane. Integrated circuit device 500 may be included in a microprocessor, a memory, and/or other integrated circuit device. In some implementations, integrated circuit device 500 is a portion of an IC chip, an SoC, or portion thereof, that includes various passive and active microelectronic devices such as resistors, capacitors, inductors, diodes, PFETs, NFETs, MOSFETs, CMOS transistors, BJTs, LDMOS transistors, high voltage transistors, high frequency transistors, other suitable components, or combinations thereof. In some implementations, integrated circuit device 500 is included in a non-volatile memory, such as a NVRAM, a flash memory, an EEPROM, an EPROM, other suitable memory type, or combinations thereof. Integrated circuit device 500 is similar in many respects to integrated circuit device 200. Accordingly, similar features in FIGS. 38A-48A, FIGS. 38B-48B and FIGS. 3A-13A, FIGS. 3B-13B are identified by the same reference numerals for clarity and simplicity. FIGS. 38A-48A and FIGS. 38B-48B have been simplified for the sake of clarity to better understand the inventive concepts of the present disclosure. Additional features can be added in integrated circuit device 500, and some of the features described below can be replaced, modified, or eliminated in other embodiments of integrated circuit device 500.

Figures 40A, 40B:
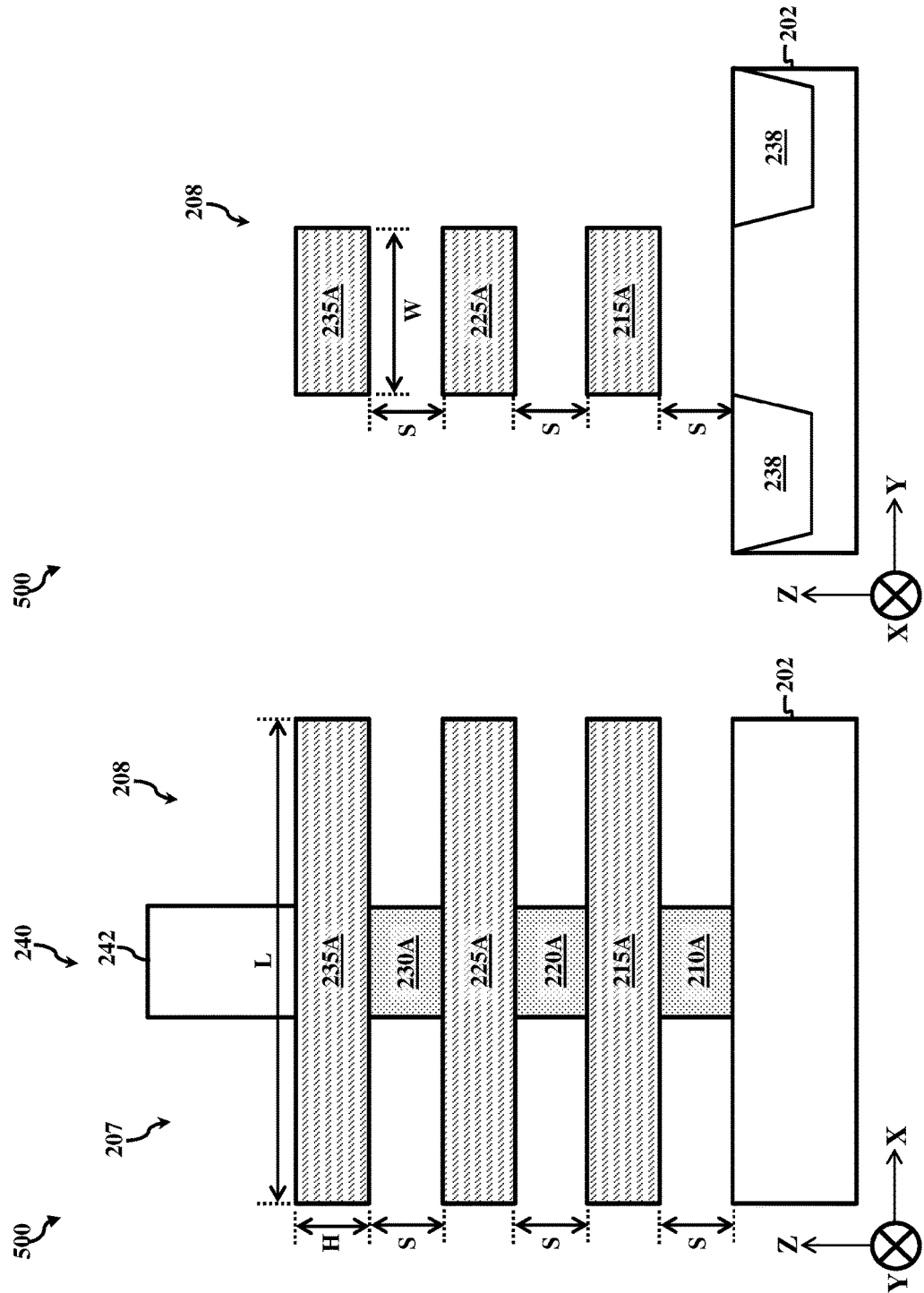

Fabrication of integrated circuit device 500 begins similar to fabrication of integrated circuit device 200. For example, in FIG. 38A and FIG. 38B, integrated circuit device 500 includes substrate 202 and heterostructure 205 disposed thereover, as described in detail above with reference to FIG. 3A and FIG. 3B. In FIG. 39A and FIG. 39B, gate structure 240 is formed over heterostructure 205 of integrated circuit device 500, as described in detail above with reference to FIG. 4A and FIG. 4B. In contrast to fabrication of integrated circuit device 200, fabrication of integrated circuit device 500 does not form gate spacers 244 adjacent to the dummy gate stack of gate structure 240 (in particular, adjacent to dummy gate electrode 242). Instead, as described further below, gate spacers and nanowire spacers are formed simultaneously, reducing time and complexity associated with fabricating integrated circuit device 500. In FIG. 40A and FIG. 40B, integrated circuit device 500 undergoes a source/drain nanowire release process, thereby forming nanowire 215A, nanowire 225A, and nanowire 235A (where semiconductor island 210A, semiconductor island 220A, and semiconductor island 230A remain in channel region 206), as described in detail above with reference to FIG. 5A and FIG. 5B. Fabrication of integrated circuit device 500 then continues with forming nanowire spacers, except in contrast to fabrication of integrated circuit device 200, gate spacers are formed while forming the nanowire spacers for integrated circuit device 500.

Figures 41A, 41B:
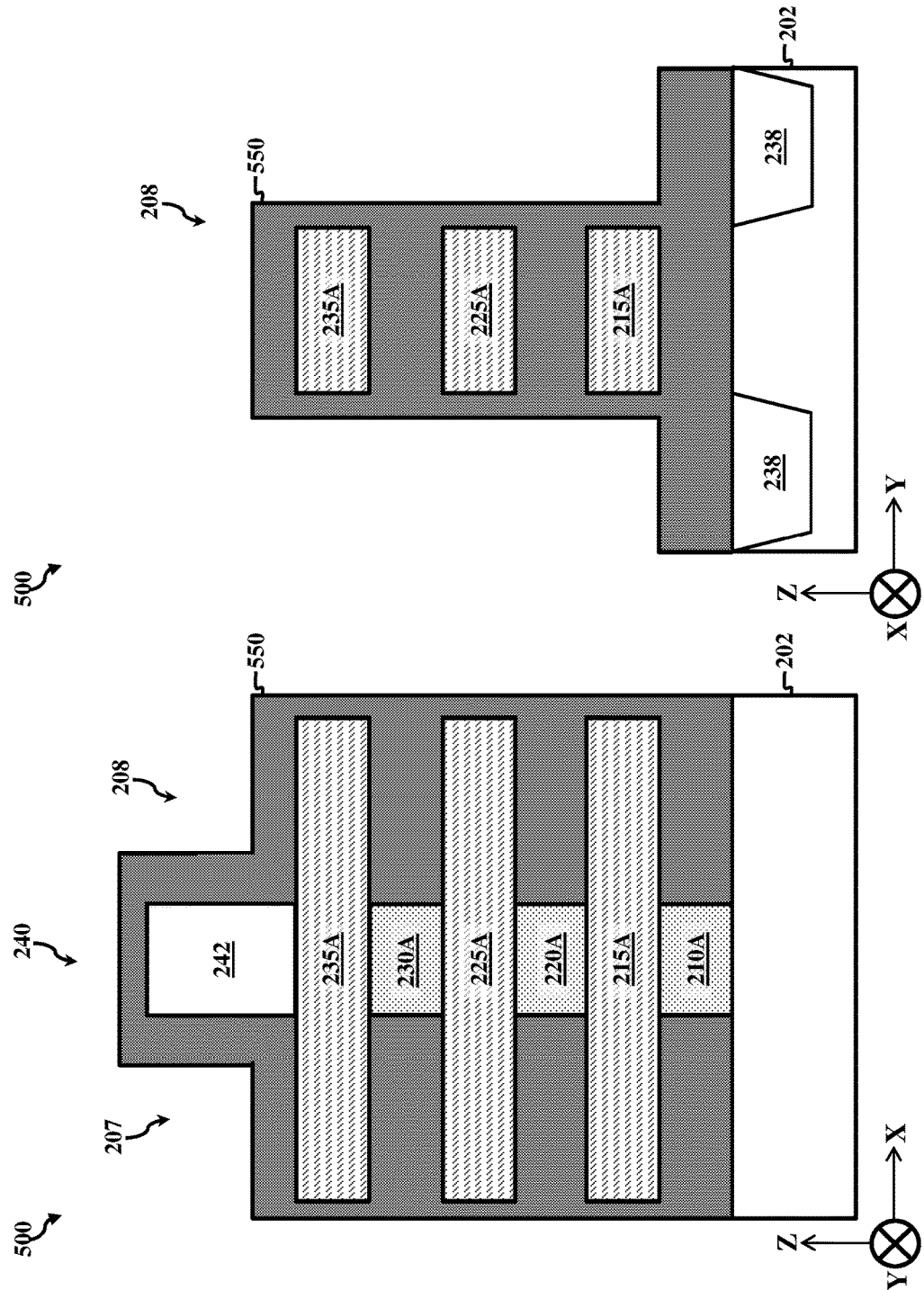

Turning to FIG. 41A and FIG. 41B, a nanowire spacer layer 550 is formed over substrate 202, particularly over heterostructure 205 and gate structure 240, by any suitable process, such as a deposition process (for example, CVD, PVD, ALD, HDPCVD, MOCVD, RPCVD, PECVD, LPCVD, ALCVD, APCVD, plating, other suitable methods, or combinations thereof). Nanowire spacer layer 550 fills spaces between the nanowires of integrated circuit device 500 (here, nanowire 215A, nanowire 225A, and nanowire 235A). Though nanowire spacer layer 550 includes a single layer in the depicted embodiment, the present disclosure contemplates embodiments where nanowire spacer layer 550 includes multiple layers, as described herein. Nanowire spacer layer 550 includes a material different than the nanowires and the semiconductor islands. In particular, nanowire spacer layer 550 includes a material having a different etching rate than materials of the nanowires and the semiconductor islands. For example, nanowire spacer layer 550 includes a material to achieve etch selectivity of the semiconductor islands (here, semiconductor island 210A, semiconductor island 220A, and semiconductor island 230A) to nanowire spacer layer 550, for example, during a subsequent channel nanowire release process. In some implementations, nanowire spacer layer 550 includes a dielectric material. The dielectric material can include silicon, oxygen, carbon, nitrogen, other suitable material, or combinations thereof (for example, silicon oxide, silicon nitride, silicon oxynitride, silicon carbide, or silicon oxycarbonitride). For purposes of the following description, nanowire spacer layer 550 includes silicon and nitrogen (for example, silicon nitride). In some implementations, nanowire spacer layer 550 includes a low-k dielectric material. Exemplary low-k dielectric materials include FSG, carbon doped silicon oxide, Black Diamond® (Applied Materials of Santa Clara, Calif.), Xerogel, Aerogel, amorphous fluorinated carbon, Parylene, BCB, SILK (Dow Chemical, Midland, Mich.), polyimide, other low-k dielectric material, or combinations thereof. In some implementations, dopants are introduced into the dielectric material, such that nanowire spacer layer 550 includes a doped dielectric material. Doping the dielectric material can improve a profile of a junction between source region 207 (and/or drain region 208) and channel region 206, which can improve performance of integrated circuit device 500. An ion implantation process, a diffusion process (for example, an SPD process), and/or other suitable doping process can be performed to introduce dopants into the dielectric material.

Figures 42A, 42B:
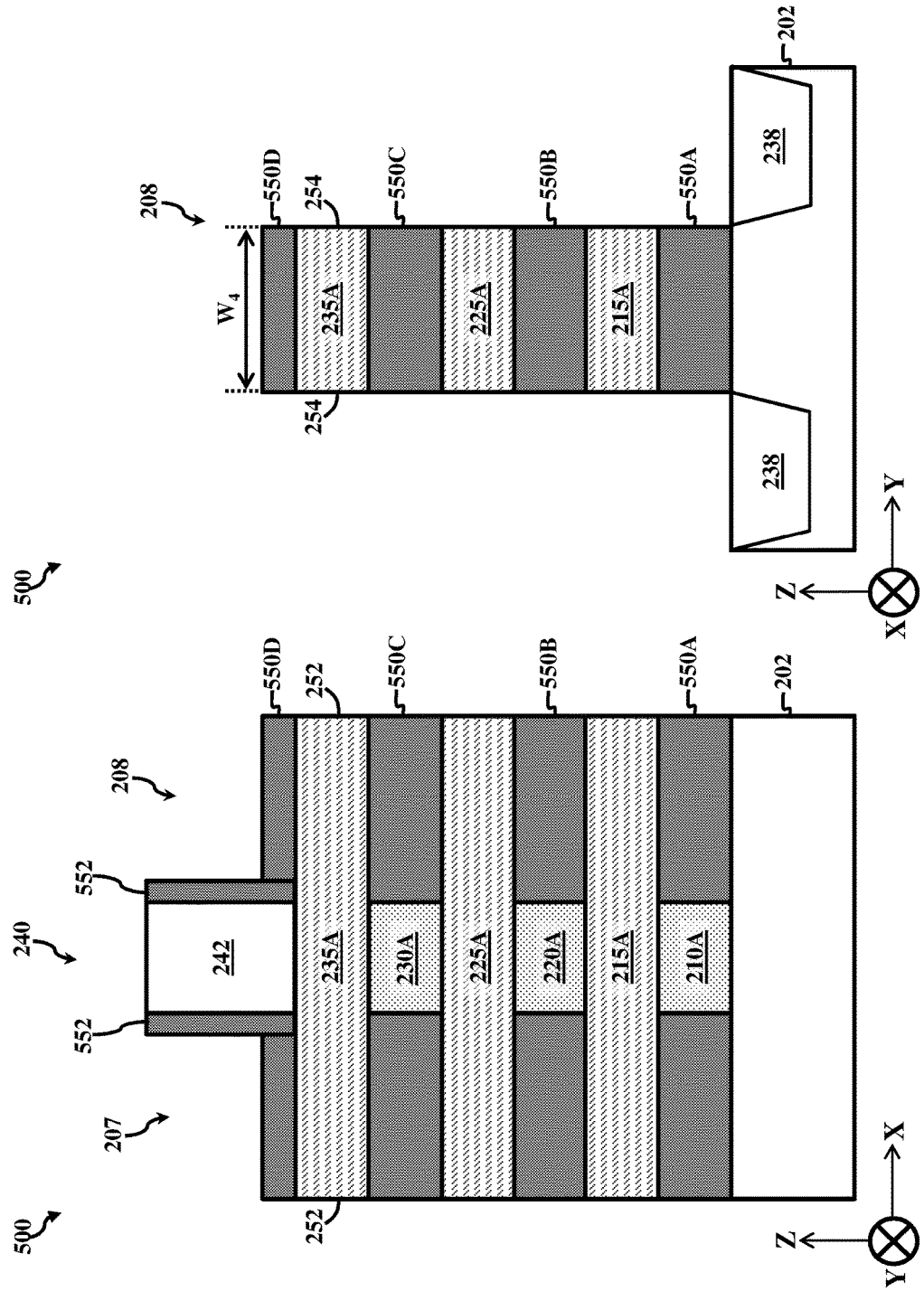

Turning to FIG. 42A and FIG. 42B, a patterning process is performed on nanowire spacer layer 550 to form nanowire spacers and gate spacers. For example, nanowire spacer layer 550 is selectively removed to expose sidewalls 252 and sidewalls 254 of nanowire 215A, nanowire 225A, and nanowire 235A, yet remain in spaces between nanowire 215A, nanowire 225A, nanowire 235A, and/or substrate 202. In contrast to fabrication of integrated circuit device 200, nanowire spacer layer 550 is removed from only a top portion (or top surface) of gate structure 240, such as a top surface of dummy gate electrode 242, where a thickness of nanowire spacer layer 550 remaining over nanowire 235A is reduced during the patterning process. In some implementations, an etching process selectively removes portions of nanowire spacer layer 550 while eliminating (or minimizing) removal of gate structure 240 and the nanowires. Various etching parameters can be tuned to selectively etch nanowire spacer layer 550, such as etchant composition, etching temperature, etching solution concentration, etching time, etching pressure, source power, RF bias voltage, RF bias power, etchant flow rate, other suitable etching parameters, or combinations thereof. In some implementations, nanowire spacer layer 550 is etched using etch reactants having a high etch selectivity with respect to the material of nanowire spacer layer 550. For example, where nanowire spacer layer 550 includes silicon nitride and the nanowires include silicon, etch reactants and/or etch solutions of the etching process are selected to ensure high etch selectivity to silicon nitride with minimal (to no) etching of silicon. In such implementations, a wet etching process using a phosphoric acid solution can selectively etch nanowire spacer layer 550 with minimal (to no) etching of the nanowires.

Nanowire spacer layer 550 thus remains in source region 207 and drain region 208, forming a nanowire spacer 550A (between substrate 202 and nanowire 215A), a nanowire spacer 550B (between nanowire 215A and nanowire 225A), a nanowire spacer 550C (between nanowire 225A and nanowire 235A), and a nanowire spacer 550D (over nanowire 235A). A remaining portion of nanowire spacer layer 550 also forms gate spacers 552 adjacent to the dummy gate stack of gate structure 240 (here, dummy gate electrode 242). Nanowire spacers 550A-550C span source region 207, drain region 208, and a portion of channel region 206 (in the depicted embodiment, a portion of channel region 206 underlying gate spacers 552), whereas nanowire spacer 550D spans source region 207 and drain region 208. In the depicted embodiment, nanowire spacers 550A-550D do not extend (or negligibly extend) beyond nanowire 215A, nanowire 225A, and nanowire 235A along the x-direction and the y-direction, ensuring that nanowire 215A, nanowire 225A, and nanowire 235A are sufficiently exposed for forming subsequent source/drain features. For example, nanowire spacers 550A-550D each have a width ($W_4$) extending along the y-direction that is substantially equal to width W of the nanowires (in other words, $W_4 \approx W$). In some implementations, $W_4 \approx W$ when $W_4$ and W are within ±5% of each other. In furtherance of the depicted embodiment, nanowire spacers 550A-550D have sidewalls that substantially align with sidewalls 252 and sidewalls that substantially align with sidewalls 254. In some implementations, the sidewalls are considered substantially aligned when any shift (for example, $\Delta x$ or $\Delta y$) between sidewalls of nanowire spacers 550A-550D and sidewalls 252 or sidewalls 254 is less than about 2 nm.

Figures 43A, 43B:
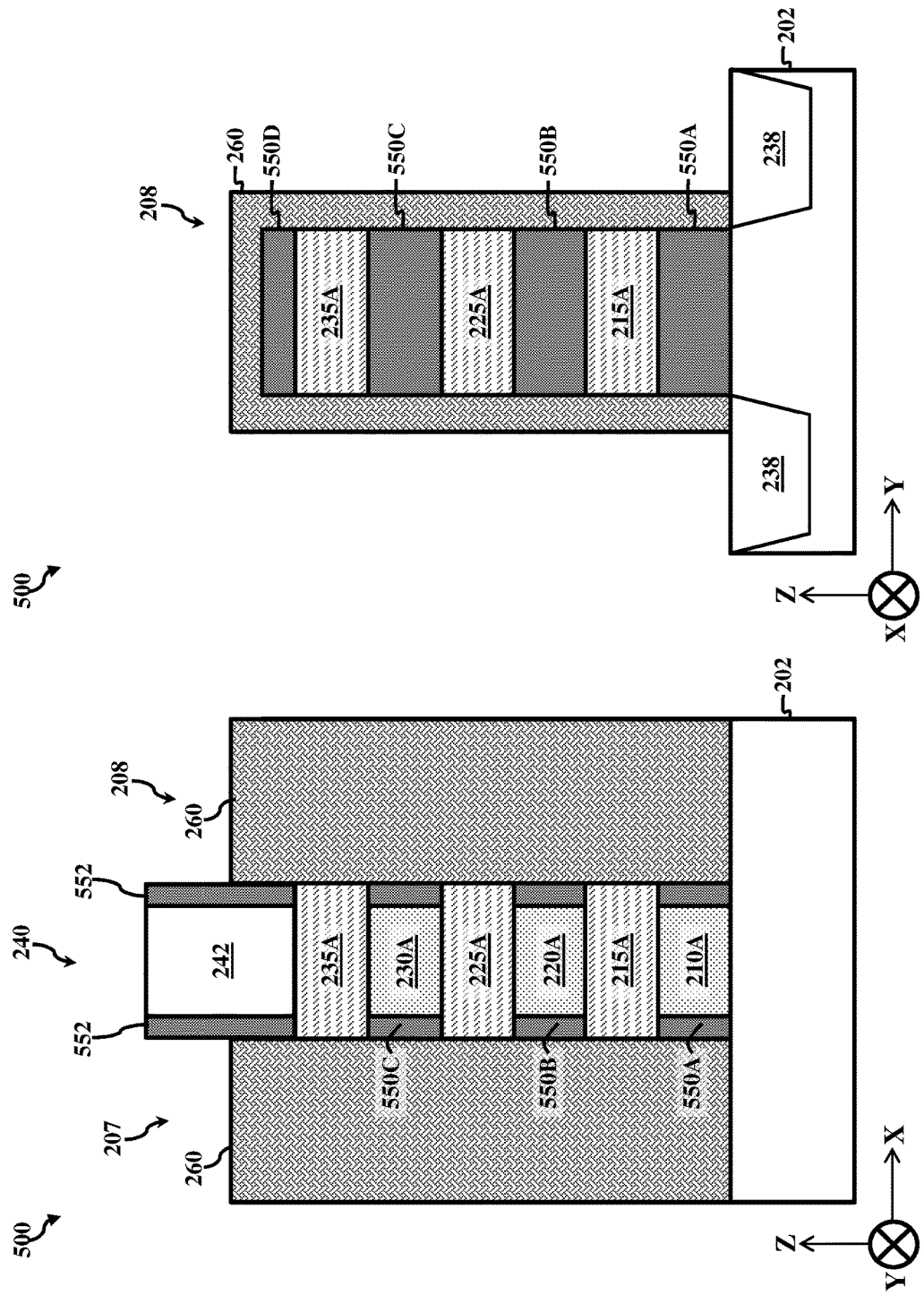
Figures 44A, 44B:
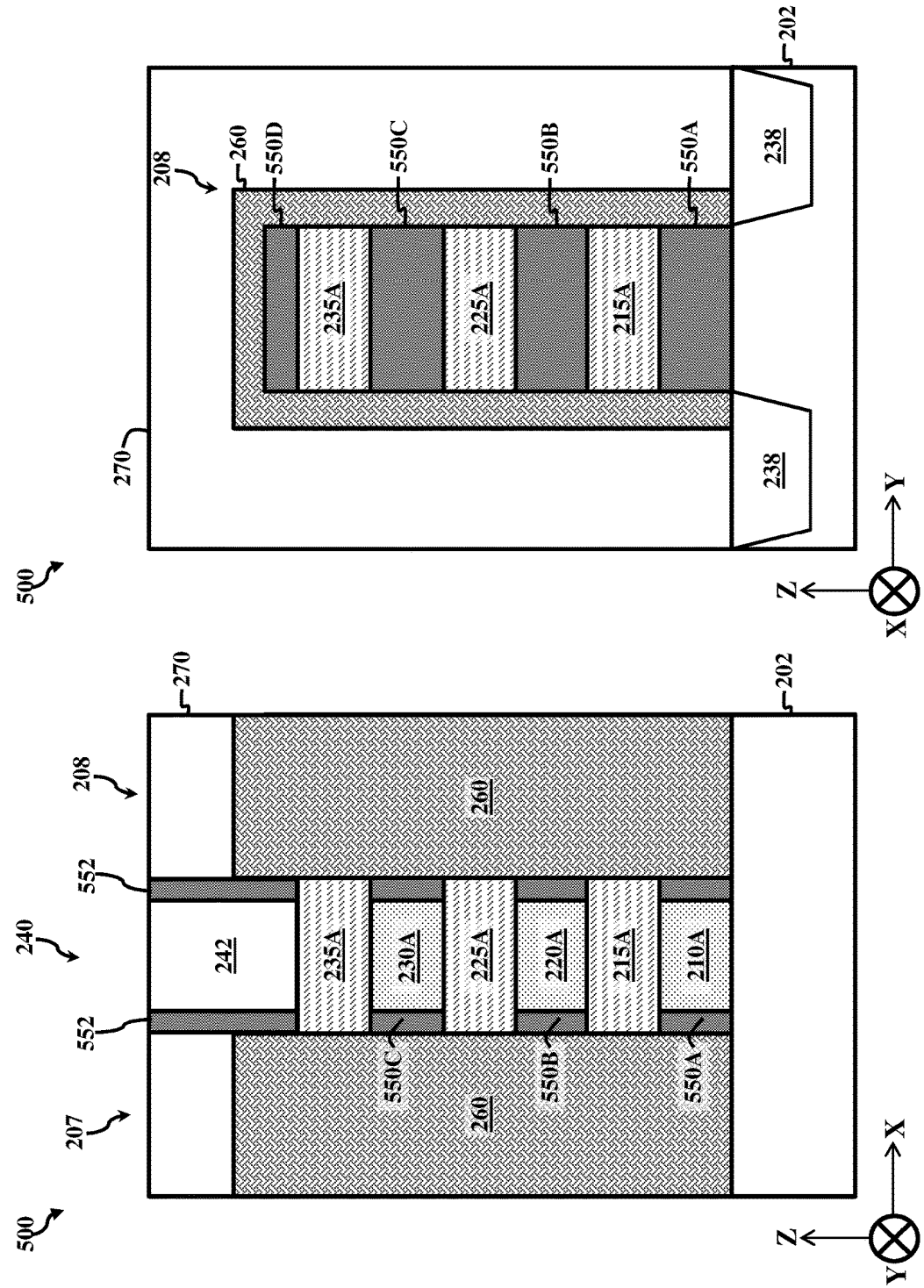
Figures 45A, 45B:
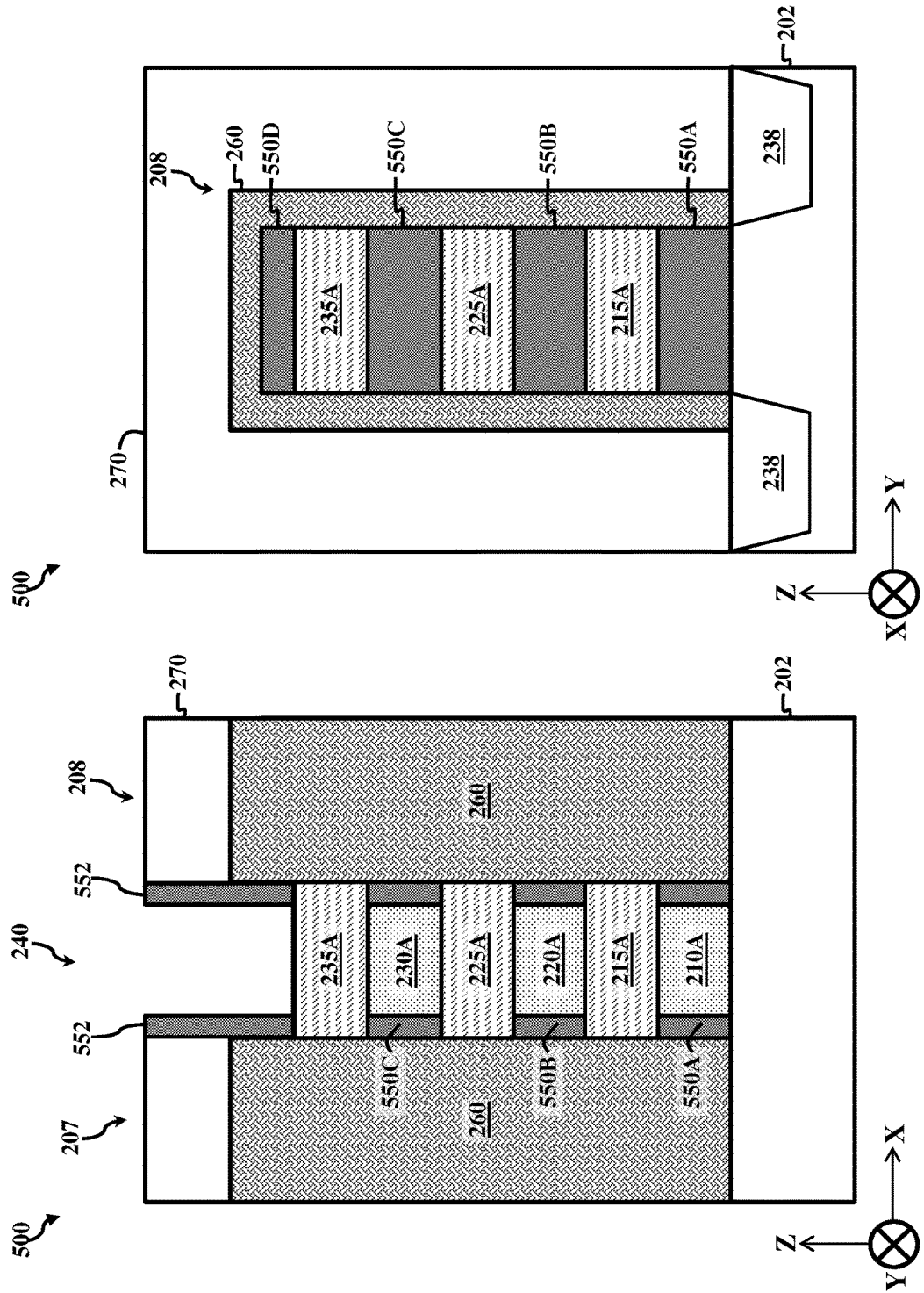
Figures 46A, 46B:
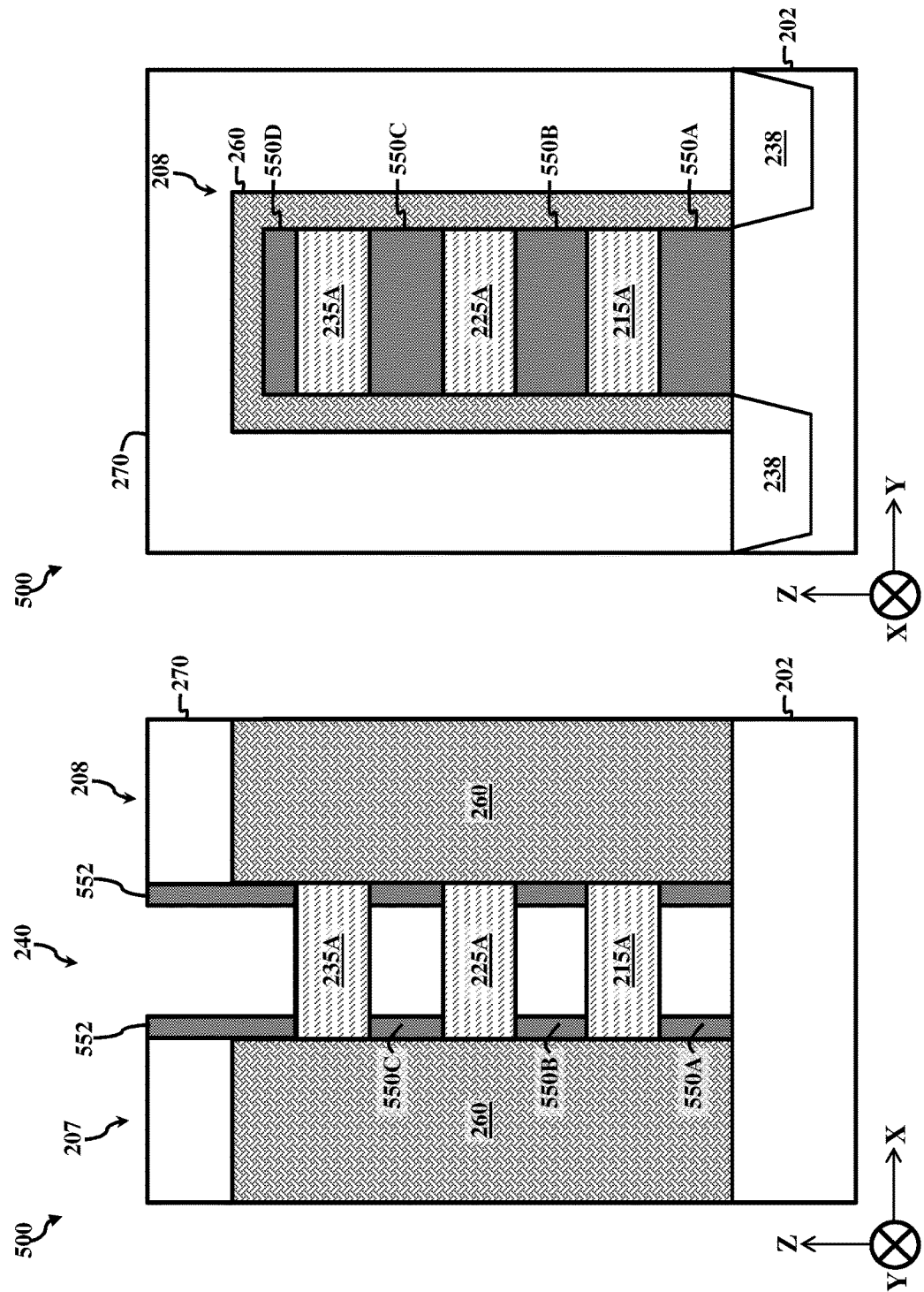

Fabrication of integrated circuit device 500 then proceeds similar to fabrication of integrated circuit device 200. For example, in FIG. 43A and FIG. 43B, epitaxial source/drain features 260 are formed in source region 207 and drain region 208 of heterostructure 205 of integrated circuit device 500, as described in detail above with reference to FIG. 8A and FIG. 8B. As depicted in FIG. 43A, a portion of nanowire spacers 550A-550C in channel region 206 is not covered by epitaxial source/drain features 260. In FIG. 44A and FIG. 44B, ILD layer 270 is formed over substrate 202, as described in detail above with reference to FIG. 9A and FIG. 9B. In FIG. 45A and FIG. 45B, a portion of gate structure 240 is removed to expose channel region 206 of integrated circuit device 500, thereby forming opening 275, as described in detail above with reference to FIG. 10A and FIG. 10B. In FIG. 46A and FIG. 46B, integrated circuit device 500 undergoes a channel nanowire release process, thereby releasing nanowire 215A, nanowire 225A, and nanowire 235A in channel region 206, as described in detail above with reference to FIG. 11A and FIG. 11B. Similar to nanowire spacers 250A-250C, nanowire spacers 550A-550C function as etch stop layers during the channel nanowire release process, providing lateral etch control and preventing unintentional removal of source/drain material, such as epitaxial source/drain features 260. Nanowire spacers 550A-550C also provide an insulation region between a subsequently formed metal gate stack and source region 207

Figures 47A, 47B:
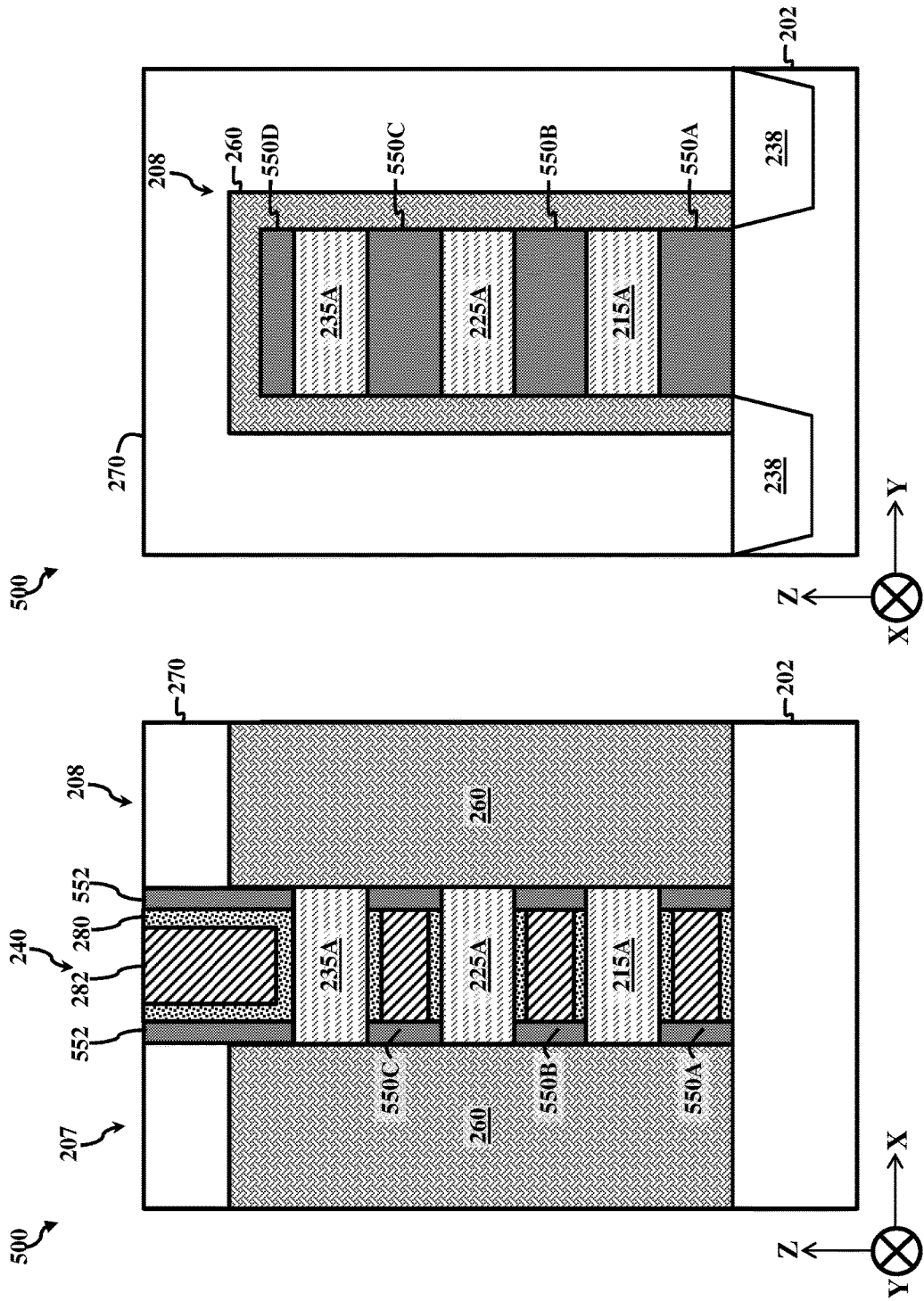
Figures 48A, 48B:
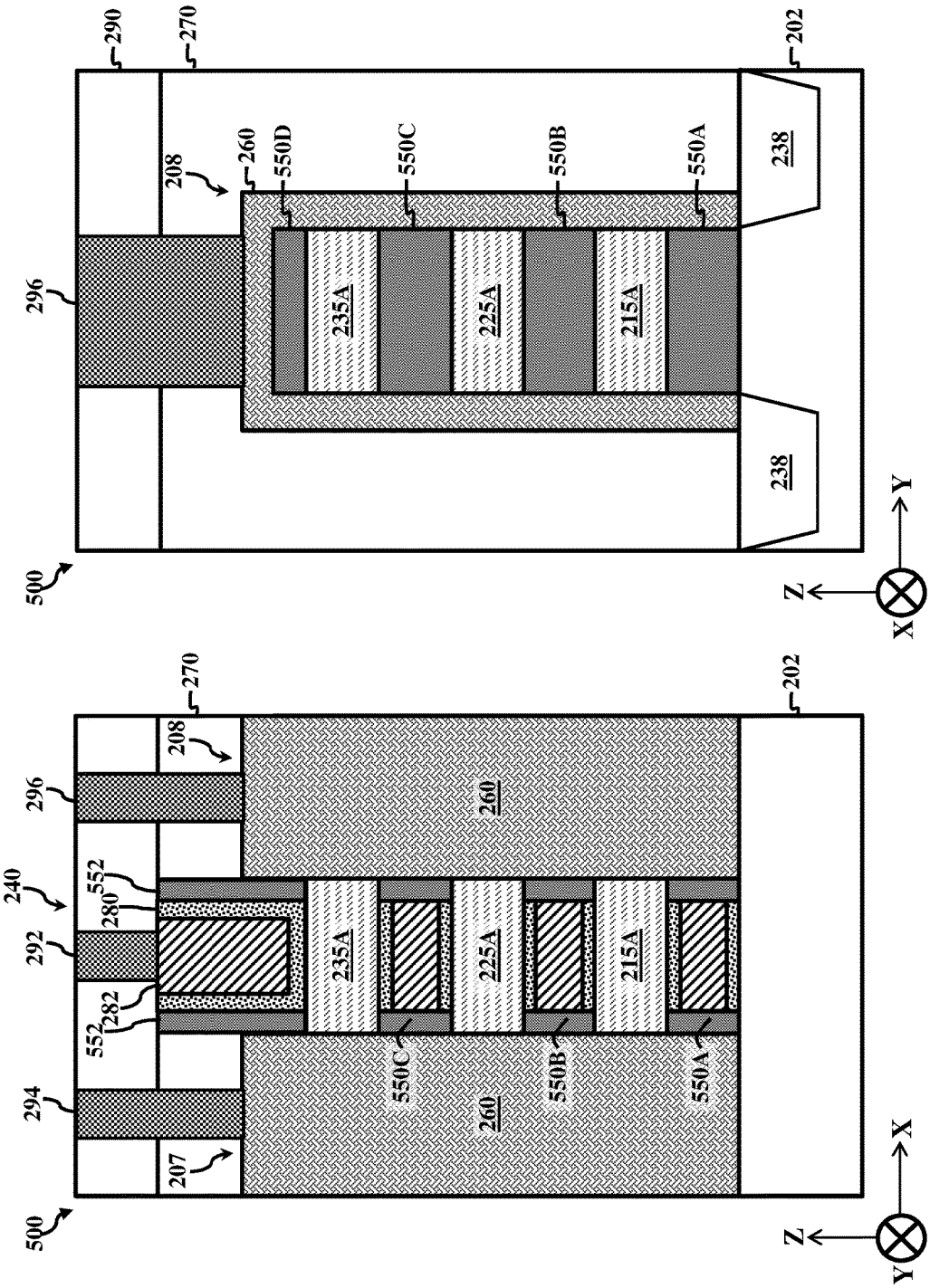

(and/or drain region 208), improving performance of integrated circuit device 500. In FIG. 47A and FIG. 47B, a metal gate stack of gate structure 240 (including, for example, gate dielectric 280 and gate electrode 282) is formed in opening 275, as described in detail above with reference to FIG. 12A and FIG. 12B. In FIG. 48A and FIG. 48B, various contacts are formed to facilitate operation of integrated circuit device 500 (for example, contact 292, contact 294, and contact 296 extending through ILD layer 270 and/or ILD layer 290), as described in detail above with reference to FIG. 13A and FIG. 13B.

The present disclosure provides for many different embodiments. An exemplary method for fabricating a nanowire-based integrated circuit device includes forming a heterostructure over a substrate. A gate structure is formed traversing a portion of the heterostructure, such that the gate structure separates a source region and a drain region of the heterostructure, and a channel region is defined between the source region and the drain region. A source/drain nanowire release process is performed on the heterostructure, such that a nanowire is released in the source region and the drain region. Nanowire spacers are then formed in the source region and the drain region, such that the nanowire is disposed between the nanowire spacers. During a gate replacement process, a channel nanowire release process is performed on the heterostructure, such that the nanowire is released in the channel region. In some implementations, the method further includes, before the gate replacement process, forming epitaxial source/drain features over the nanowire and the nanowire spacers in the source region and the drain region. In some implementations, the heterostructure includes at least one semiconductor layer pair having a first semiconductor layer and a second semiconductor layer disposed over the first semiconductor layer, the second semiconductor layer being different than the first semiconductor layer. In such implementations, performing the source/drain nanowire release process includes selectively removing the first semiconductor layer from the source region and the drain region. In such implementations, performing the channel nanowire release process includes selectively removing the first semiconductor layer from the channel region, such that the nanowire is formed from the second semiconductor layer.

In some implementations, the nanowire spacers function as an etch stop layer during the channel nanowire release process. In some implementations, forming the nanowire spacers includes depositing a nanowire spacer layer over the nanowire, and patterning the nanowire spacer layer, such that the nanowire spacer layer is removed from sidewalls of the nanowire. In some implementations, the nanowire spacer layer is treated (for example, by an ion implantation process) before the patterning, such that the nanowire spacer layer includes a treated portion and an untreated portion, wherein the treated portion has a different functional characteristic (for example, an etching characteristic and/or an electrical characteristic) than the untreated portion. In some implementations, patterning the nanowire spacer layer includes forming gate spacers adjacent to a dummy gate stack of the gate structure. In some implementations, forming the nanowire spacer layer includes forming a first nanowire spacer layer over the nanowire, and forming a second nanowire spacer layer over the first nanowire spacer layer.

Another exemplary method fabricating a nanowire-based integrated circuit device includes forming a semiconductor layer stack over a substrate. The semiconductor layer stack includes at least one first semiconductor layer of a first semiconductor material and at least one second semiconductor layer of a second semiconductor material, the second semiconductor material being different than the first semiconductor material. A gate structure is formed over a channel region of the semiconductor layer stack, where the gate structure includes a dummy gate stack. The method further includes selectively removing the at least one first semiconductor layer from a source region and a drain region of the semiconductor layer stack. Nanowire spacers are then formed in the source region and the drain region, such that the at least one second semiconductor layer is disposed between the nanowire spacers. The method further includes forming epitaxial source/drain features over the at least one second semiconductor layer and the nanowire spacers in the source region and the drain region. The method can further include performing a gate replacement process. For example, the dummy gate stack can be removed to form an opening in the gate structure that exposes the semiconductor layer stack in the channel region, and a metal gate stack can be formed in the opening of the gate structure. During the gate replacement process, the method further includes selectively removing the at least one first semiconductor layer from the channel region of the semiconductor layer stack. The nanowire spacers can function as an etch stop layer when the at least one first semiconductor layer is being selectively removed from the channel region.

In some implementations, the method further includes forming gate spacers adjacent to the gate stack when forming the nanowire spacers. In some implementations, forming the nanowire spacers includes depositing a nanowire spacer layer over the at least one second semiconductor layer, and selectively etching the nanowire spacer layer to expose sidewalls of the at least one second semiconductor layer. In some implementations, depositing the nanowire spacer layer over the at least one second semiconductor layer includes depositing a first nanowire spacer layer over the at least one second semiconductor layer in the source region and the drain region, and depositing a second nanowire spacer layer over the first nanowire spacer layer. The first nanowire spacer layer and the second nanowire spacer layer completely fill a space adjacent to the at least one semiconductor layer in the source region and the drain region. In some implementations, selectively etching the nanowire spacer layer includes partially removing the second nanowire spacer layer to form a space in the nanowire spacers. In some implementations, forming the nanowire spacers further includes performing an ion implantation process on the nanowire spacer layer before selectively etching the nanowire spacer layer.

In some implementations, selectively removing the at least one first semiconductor layer from the source region and the drain region of the semiconductor layer stack includes removing a portion of the at least one first semiconductor layer from the channel region. In such implementations, forming the nanowire spacers can include forming the nanowire spacers in the channel region where the portion of the at least one semiconductor layer has been removed. In furtherance of such implementations, the selectively removing the at least one first semiconductor layer from the channel region of the semiconductor layer stack includes removing a remaining portion of the at least one first semiconductor layer.

An exemplary nanowire-based integrated circuit device includes a nanowire disposed over a substrate. A gate structure traverses a portion of the nanowire, such that the gate structure separates a source region and a drain region of the nanowire. A channel region of the nanowire is defined between the source region and the drain region. The integrated circuit device further includes a nanowire spacer disposed adjacent to the nanowire in the source region and the drain region, such that a portion of the gate structure is disposed between the nanowire spacer. The integrated circuit device further includes an epitaxial source/drain feature disposed over the nanowire and the nanowire spacer in the source region and the drain region. In some implementations, the gate structure includes gate spacers, and the nanowire spacer extends into the channel region under the gate spacers. In some implementations, the epitaxial source/drain feature is disposed directly on only sidewalls of the nanowire.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
forming a heterostructure over a substrate;
forming a gate structure traversing a portion of the heterostructure, such that the gate structure separates a source region and a drain region of the heterostructure, a channel region being defined between the source region and the drain region;
performing a source/drain nanowire release process on the heterostructure to release a nanowire in the source region and the drain region;
forming nanowire spacers spanning an entirety of the source region and the drain region, such that the nanowire in the source region and the drain region is disposed between and surrounded by the nanowire spacers; and
during a gate replacement process, performing a channel nanowire release process on the heterostructure to release the nanowire is released in the channel region, wherein the nanowire spacers spanning the entirety of the source region and the drain region function as an etch stop layer during the channel nanowire release process.

2. The method of claim 1, further comprising, before the gate replacement process, forming epitaxial source/drain features over the nanowire and the nanowire spacers in the source region and the drain region.

3. The method of claim 1, further comprising performing the source/drain nanowire release process before the gate replacement process.

4. The method of 1, wherein the forming the nanowire spacers includes:
depositing a nanowire spacer layer over the nanowire, such that the nanowire is surrounded by the nanowire spacer layer; and
patterning the nanowire spacer layer, such that the nanowire spacer layer is removed from sidewalls of the nanowire.

5. The method of claim 4, wherein the forming the nanowire spacers further includes treating the nanowire spacer layer before the patterning, such that the nanowire spacer layer includes a treated portion and an untreated portion, wherein the treated portion has a different functional characteristic than the untreated portion.

6. The method of claim 5, wherein the treating include performing an ion implantation process on the nanowire spacer layer.

7. The method of claim 4, wherein the patterning the nanowire spacer layer includes forming gate spacers adjacent to a dummy gate stack of the gate structure.

8. The method of claim 4, wherein the forming the nanowire spacer layer includes:
forming a first nanowire spacer layer over the nanowire; and
forming a second nanowire spacer layer over the first nanowire spacer layer.

9. The method of claim 1, wherein:
the heterostructure includes at least one semiconductor layer pair having a first semiconductor layer and a second semiconductor layer disposed over the first semiconductor layer, the second semiconductor layer being different than the first semiconductor layer;
the performing the source/drain nanowire release process includes selectively removing the first semiconductor layer from the source region and the drain region, such that the nanowire is formed from the second semiconductor layer in the source region and the drain region; and
the performing the channel nanowire release process includes selectively removing the first semiconductor layer from the channel region, such that the nanowire is formed from the second semiconductor layer in the channel region.

10. The method of claim 9, wherein the forming nanowire spacers includes forming the nanowire spacers in the channel region where a portion of the first semiconductor layer has been removed during the performing of the source/drain nanowire release process.

11. A method comprising:
forming a semiconductor layer stack over a substrate, wherein the semiconductor layer stack includes at least one first semiconductor layer of a first semiconductor material and at least one second semiconductor layer of a second semiconductor material, the second semiconductor material being different than the first semiconductor material;
forming a gate structure over a channel region of the semiconductor layer stack, wherein the gate structure includes a dummy gate stack;
selectively removing the at least one first semiconductor layer from a source region and a drain region of the semiconductor layer stack;
forming nanowire spacers in the source region and the drain region not underlying the gate structure, such that the at least one second semiconductor layer is disposed between the nanowire spacers in the source region and the drain region not underlying the gate structure;
forming epitaxial source/drain features over the at least one second semiconductor layer and the nanowire spacers in the source region and the drain region not underlying the gate structure;
removing the dummy gate stack to form an opening in the gate structure that exposes the semiconductor layer stack in the channel region;
selectively removing the at least one first semiconductor layer from the channel region of the semiconductor layer stack; and
forming a metal gate stack in the opening of the gate structure.

12. The method of claim 11, wherein:
the selectively removing the at least one first semiconductor layer from the source region and the drain region of the semiconductor layer stack includes removing a portion of the at least one first semiconductor layer from the channel region;
the forming nanowire spacers includes forming the nanowire spacers in the channel region where the portion of the at least one first semiconductor layer has been removed, such that the nanowire spacers have a portion underlying the gate structure; and
the selectively removing the at least one first semiconductor layer from the channel region of the semiconductor layer stack includes removing a remaining portion of the at least one first semiconductor layer.

13. The method of claim 11, wherein the forming the nanowire spacers includes:
depositing a nanowire spacer layer over the at least one second semiconductor layer; and
selectively etching the nanowire spacer layer to expose sidewalls of the at least one second semiconductor layer.

14. The method of claim 13, wherein the depositing the nanowire spacer layer over the at least one second semiconductor layer includes:
depositing a first nanowire spacer layer over the at least one second semiconductor layer in the source region and the drain region; and
depositing a second nanowire spacer layer over the first nanowire spacer layer, wherein the first nanowire spacer layer and the second nanowire spacer layer completely fill a space adjacent to the at least one second semiconductor layer in the source region and the drain region.

15. The method of claim 14, wherein the selectively etching the nanowire spacer layer includes removing the second nanowire spacer layer from over the gate structure.

16. The method of claim 13, wherein the forming the nanowire spacers further includes performing an ion implantation process on the nanowire spacer layer before selectively etching the nanowire spacer layer.

17. The method of claim 11, further comprising forming gate spacers adjacent to the dummy gate stack when forming the nanowire spacers.

18. An integrated circuit device comprising:
a nanowire disposed over a substrate;
a gate structure traversing a portion of the nanowire, such that the gate structure separates a source region and a drain region of the nanowire, wherein a channel region of the nanowire is defined between the source region and the drain region;
a nanowire spacer disposed adjacent to the nanowire, wherein the nanowire spacer spans an entirety of the source region and an entirety of the drain region, and further wherein a portion of the gate structure is disposed between the nanowire spacer; and
an epitaxial source/drain feature disposed over the nanowire and the nanowire spacer in the source region and the drain region.

19. The integrated circuit device of claim 18, wherein:
the gate structure includes gate spacers; and
the nanowire spacer extends from the source region and the drain region into the channel region under the gate spacers.

20. The integrated circuit device of claim 18, wherein the epitaxial source/drain feature is disposed directly on only sidewalls of the nanowire.

* * * * *